United States Patent [19]
Kuroda et al.

[11] Patent Number: 6,121,086
[45] Date of Patent: Sep. 19, 2000

[54] METHOD OF MANUFACTURING A SEMICONDUCTOR INTEGRATED CIRCUIT DEVICE AND A SEMICONDUCTOR INTEGRATED CIRCUIT DEVICE

[75] Inventors: Kenichi Kuroda, Tachikawa; Takashi Hashimoto, Iruma; Shoji Shukuri, Koganei, all of Japan

[73] Assignee: Hitachi, Ltd., Tokyo, Japan

[21] Appl. No.: 09/330,991

[22] Filed: Jun. 14, 1999

[30] Foreign Application Priority Data

Jun. 17, 1998 [JP] Japan .................................. 10-169769

[51] Int. Cl.$^7$ ............................................... H01L 21/8242
[52] U.S. Cl. .......................... 438/256; 438/253; 438/399; 438/393; 438/238
[58] Field of Search ..................... 438/238, 241, 438/250, 253, 393, 396, 256, 399

[56] References Cited

U.S. PATENT DOCUMENTS

| | | | |
|---|---|---|---|
| Re. 36,644 | 4/2000 | Dennison | 438/396 |
| 4,985,718 | 1/1991 | Ishijima | 357/23.6 |
| 5,828,096 | 10/1998 | Ohno et al. | 257/306 |
| 5,858,831 | 10/1998 | Sung | 438/241 |
| 5,940,703 | 8/1999 | Hong | 438/254 |
| 5,956,594 | 9/1999 | Yang et al. | 438/396 |

*Primary Examiner*—Matthew Smith
*Assistant Examiner*—Victor Yevsikov
*Attorney, Agent, or Firm*—Antonelli, Terry, Stout & Kraus, LLP

[57] ABSTRACT

In a DRAM, a plurality of memory cells each consisting of a memory cell selection transistor Qs and an information storage capacity element connected thereto in series are provided on a semiconductor substrate 1. An active region of the memory cell selection MISFET Qs is formed to have an isolated rectangular plan view. A part of the bit line BL extends in a direction crossing the extending direction thereof, and the extending part two-dimensionally overlaps a semiconductor region formed in the active region and is electrically connected thereto. In the DRAM having this structure, the bit line BL is formed of conductive films 16b1 and 16b2 embedded in the contact hole 14b for the bit line and in the wiring groove 15a for the bit line.

31 Claims, 63 Drawing Sheets

METHOD OF MANUFACTURING A SEMICONDUCTOR INTEGRATED CIRCUIT DEVICE AND A SEMICONDUCTOR INTEGRATED CIRCUIT DEVICE

BACKGROUND OF THE INVENTION

The present invention relates to a method of manufacturing a semiconductor integrated circuit device and a technique for a semiconductor integrated circuit device, and particularly to a technique for a semiconductor integrated circuit device having a memory in which an information storage capacity element is provided above a bit line.

A DRAM (Dynamic Random Access Memory) is known as a typical semiconductor memory among large capacity memories. The memory capacity of a DRAM tends to become larger and larger, and the occupied area of memory cells must be reduced accordingly from the viewpoint of improving the integration of memory cells of the DRAM. However, the storage capacity value of the capacitors must attain a certain amount regardless of generations, in consideration of operation margins of the DRAM and software errors. Therefore, the storage capacity value cannot be proportionally reduced in general.

Hence, to ensure a necessary storage capacity in a small allowed to be occupied area, a three-dimensional capacitor structure has been adopted, such as a so-called stack capacitor which is constructed by layering electrodes of two layers made of polysilicon or the like with a capacity insulating film inserted therebetween. An example thereof will be a so-called capacitor-over-bit line structure in which capacitors are arranged above bit lines.

A DRAM having this kind of structure is described in Japanese Patent Laid-open No. 6-268175. This reference discloses steps of manufacturing a DRAM as follows. At first, a gate electrode, is provided on the surface of a semiconductor substrate through a gate insulating film and a source and a drain are also formed on the surface of the semiconductor substrate. Thereafter, a first insulating film is accumulated on the semiconductor substrate. Contact holes for storage nodes and bit lines are simultaneously formed in the first insulating film. Subsequently, a polycrystalline silicon film is formed on the semiconductor substrate, and thereafter, this film is etched back to embed the polycrystalline silicon film in the two kinds of contact holes described above. Thereafter, another new polycrystalline silicon film for forming bit lines and an insulating film above the polycrystal silicon film are deposited, and further, the polycrystalline silicon film is etched and removed within regions other than the bit lines, with a photoresist used as a mask. Through these steps, the surface of the polycrystalline silicon film within the contact holes for storage nodes is lower than the surface of the first insulating film. Thereafter, a side wall film made of an insulating film is formed on the side surface on which there is no polycrystalline silicon film of the contact holes for storage nodes and on the side surface of the polycrystal silicon film which form bit lines. Thereafter, storage nodes are formed.

Further, Japanese Patent Laid-open No. 6-338597 discloses a technique of forming bit lines of a DRAM by means of embedded wires. That is, a bit line is formed by forming a groove in an insulating film and by embedding a conductive film in the groove. This bit line is arranged in a flat and linear form. In addition, the active region (source-drain region) of the memory cell selection MOSFET is formed in a flat T-shaped form. The bit line is arranged to be layered flat on a convex portion in the center of the active region, and is connected to the active region at the layering region through a contact hole formed in the insulating film.

However, the present inventors have found that the DRAM having the above-mentioned capacitor-over-bit line structure encounters the following problems.

In the technique described in the Japanese Patent Laid-open 6-268175, bit lines and conductive members in the contact holes for bit lines are formed in different steps, so that contact resistance is caused between the bit lines and the members. Therefore, due to voltage drops of bit lines caused by contact resistance, the DRAM is not suitable for operation with a low voltage or operation at a high speed. In the case described above, the bit lines and the conductive members in the contact holes for the bit lines are made of same material of polycrystalline silicon films. Also in this case, since the steps for forming these components are not continuous, there is a problem that a silicon oxide film tends to be formed at the boundary therebetween and causes contact resistance. (Normally, a silicon oxide film is very thin and allows a tunneling current to flow. In addition, a silicon oxide film is partially formed due to unevenness of concentration in the polycrystalline silicon film or due to influences from grains, thereby allowing a current to flow.)

Also, in this technique, a pattern of bit lines is formed on an insulating film. Since a side wall insulating film is formed on the side surfaces of the bit line, it is relating easy to ensure flatness. However, convex and concave portions reflecting the st eps of the pattern of the bit lines are formed on the upper surface of the insulating film covering the bit lines. As a result, when the storage node electrodes are formed by patterning on the insulating film, non-etched portions can be left on the side wall at the st eps on the upper surface of the insulating film, and short-circuiting error tends to occur due to the non-etched portions.

In addition, the technique described in the Japanese Patent Laid-open No. 6-338597 discloses a structure in which bit lines are formed of embedded wires. This is a technique relating to a DRAM which is different from the structure of the present invention.

SUMMARY OF THE INVENTION

An object of the present invention is to propose a technique by which contact resistance between conductive members of wiring portions of bit lines and conductive members in contact holes for bit lines can be eliminated.

Also, another object of the present invention is to propose a technique by which flatness of the upper surface of the insulating film covering bit lines can be improved.

The above-described and other objects and novel features of the present invention will be clearly understood from the description of the present specification and the drawings appended hitherto.

Representative ones of the inventions disclosed in the present application will be briefly summarized as follows.

According to the present invention, there is proposed a method of manufacturing a semiconductor integrated circuit device in which a plurality of memory cells each comprising a memory cell selection transistor and an information storage capacity element connected thereto in series are provided on a semiconductor substrate, comprising the steps of: (a) forming a first region having an isolated rectangular plan shape on the semiconductor substrate; (b) forming a word line extending in a direction crossing the first region, on the semiconductor substrate; (c) forming a pair of semiconductor regions for a source and drain of the memory cell selection transistor, in the first region, with a channel region directly under the word line inserted; (d) forming a first interlayer insulating film for covering the memory cell selection transistor formed through the steps (a) to (c); (e) forming a wiring groove for a bit line and a contact hole for a bit line being a part of the wiring groove for the bit line, extending in a direction two-dimensionally crossing an extending direction of the wiring groove for the bit line, integrally connected with the wiring groove for the bit line in a region two-dimensionally overlapping one of the semiconductor regions of the memory cell selection transistors, and exposing one of the semiconductor regions of the memory cell selection transistor; (f) embedding a conductive member into the wiring groove for the bit line and the contact hole for the bit line, thereby to form the bit line constructed by integrally forming a wiring portion in the wiring groove for the bit line and a contact portion in the contact hole for the bit line; and (g) forming the information storage capacity element electrically connected with the other semiconductor region of the memory cell selection transistor, above the bit line.

Also, according to the present invention, the method may further comprise steps of: forming a wiring groove and a contact hole for a wire which is connected to the wiring groove and is electrically connected to an element for a peripheral circuit thereof, in a peripheral circuit region of a memory in the first interlayer insulating film, in the step (e); and embedding a conductive member in the wiring groove and the contact hole for the wire, thereby to form a wire such that a wiring portion in the wiring groove and a contact portion in the contact hole for the wire are integrally formed, in the step (f).

Also, according to the present invention, there is provided a method of manufacturing a semiconductor integrated circuit device in which a plurality of memory cells each comprising a memory cell selection transistor and an information storage capacity element connected thereto in series are provided on a semiconductor substrate, comprising a step of transferring a pattern of a gate electrode of the memory cell selection transistor and a pattern of a gate electrode of any other transistor through separate exposure processes, respectively.

Also, according to the present invention, the method may comprise steps of: forming a contact hole from which a plurality of first conductive members are exposed, in an interlayer insulating film formed on a semiconductor substrate, the plurality of conductive members being provided in an identical same layer or different layers and being distant from each other, in an underlaying layer of the interlayer insulating film; and embedding a second conductive member in the contact hole, thereby to electrically connect, to each other, the plurality of first conductive members which are distant from each other.

DETAILED DESCRIPTION OF THE INVENTION

Figure 1:
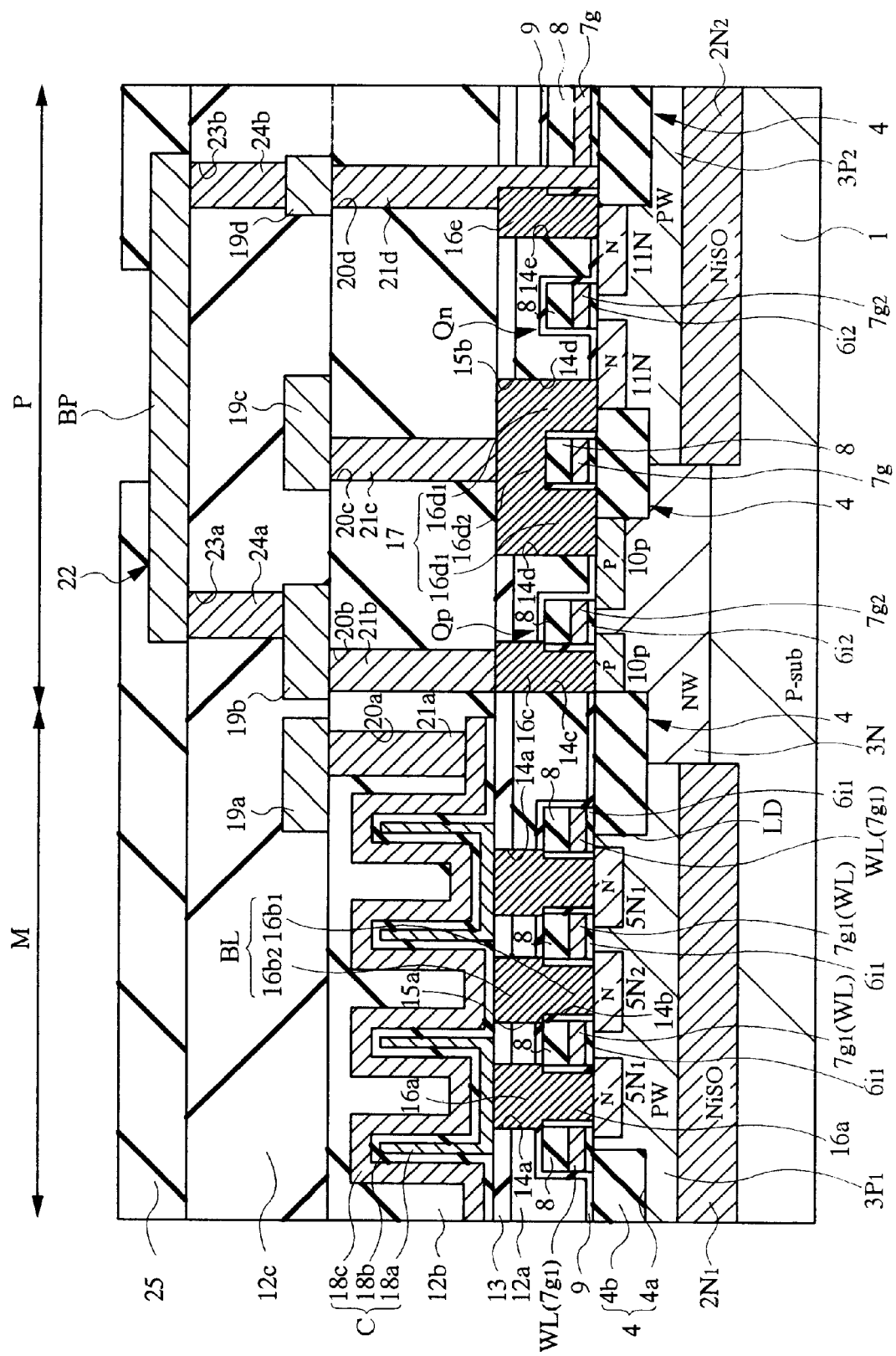
FIG. 1 is a cross-sectional view showing a main portion of a semiconductor integrated circuit device as an embodiment of the present invention.

Embodiments of the present invention will hereinafter now be explained in details based on the drawings. (In all the drawings, those components that have an equal function will be attached with a common reference numeral and reiteration of those components will be omitted herefrom.)
(Embodiment 1)

Figure 2:
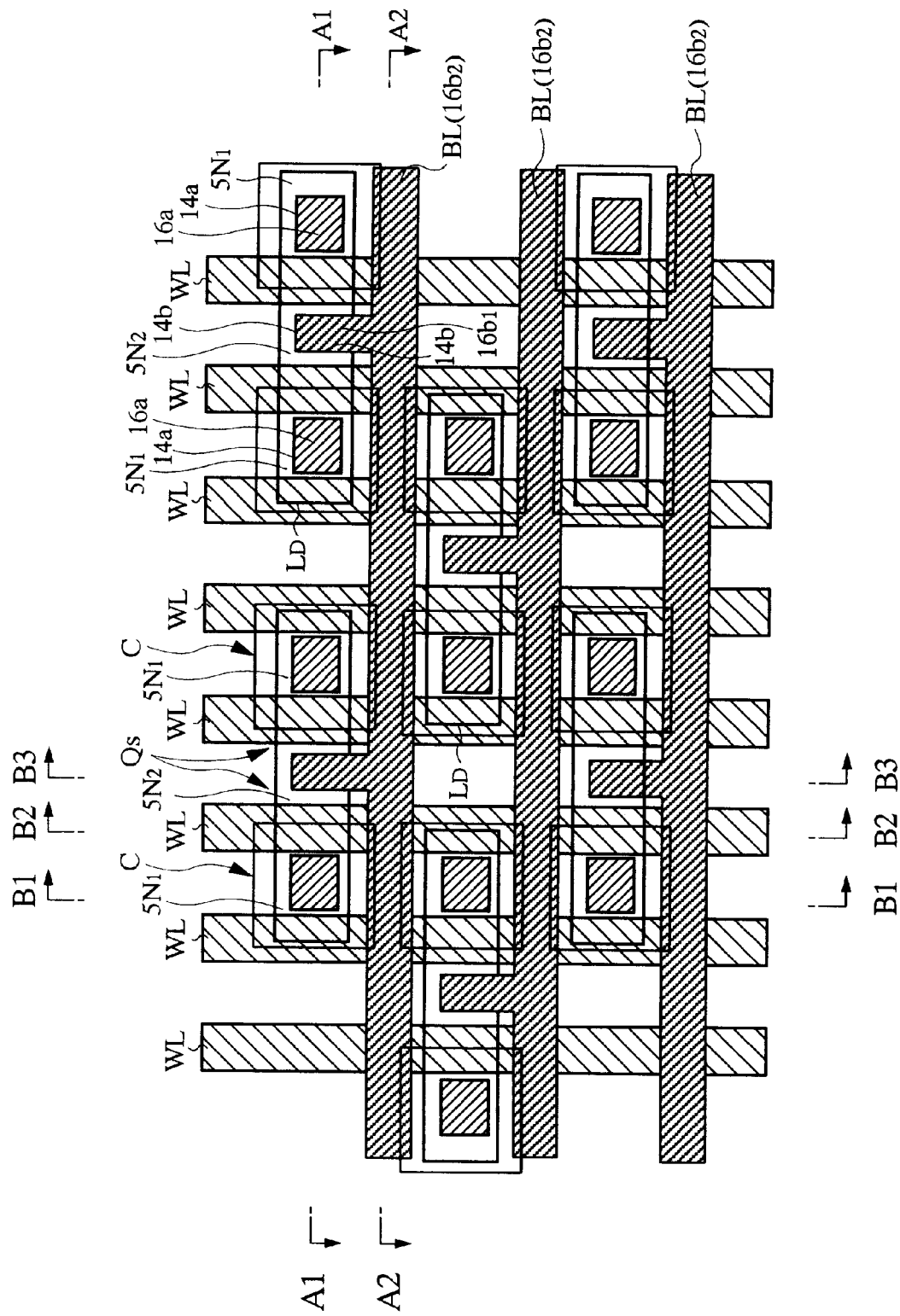
FIG. 2 is a plan view of a main portion of the semiconductor integrated circuit device shown in FIG. 1.
Figure 3:
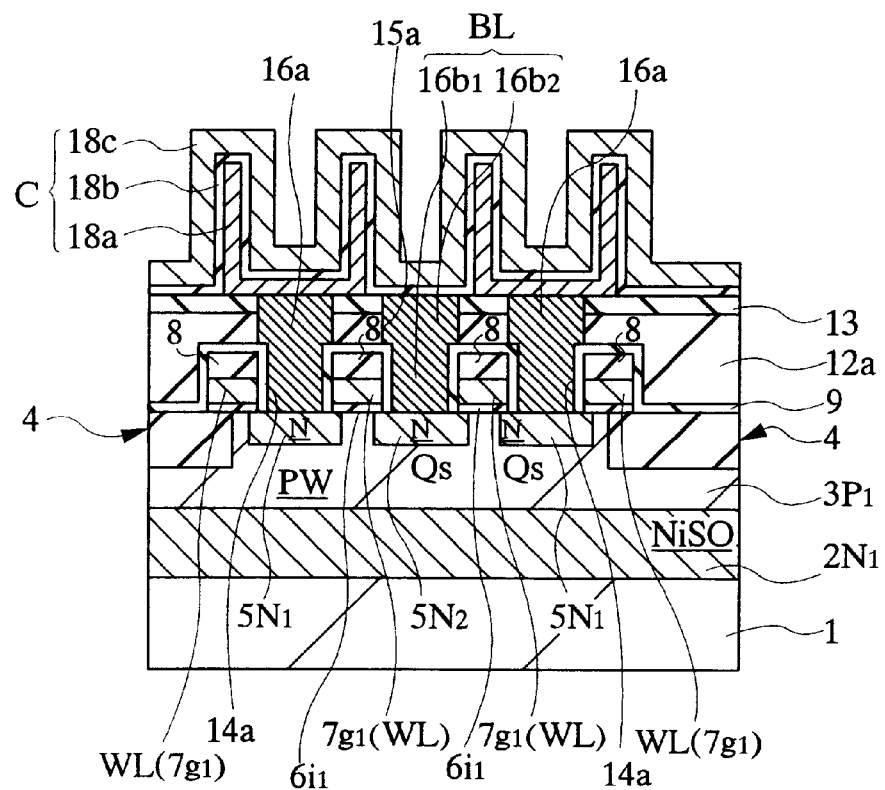
FIG. 3 is a cross-sectional view taken along the line A1—A1 in FIG. 2.
Figure 4:
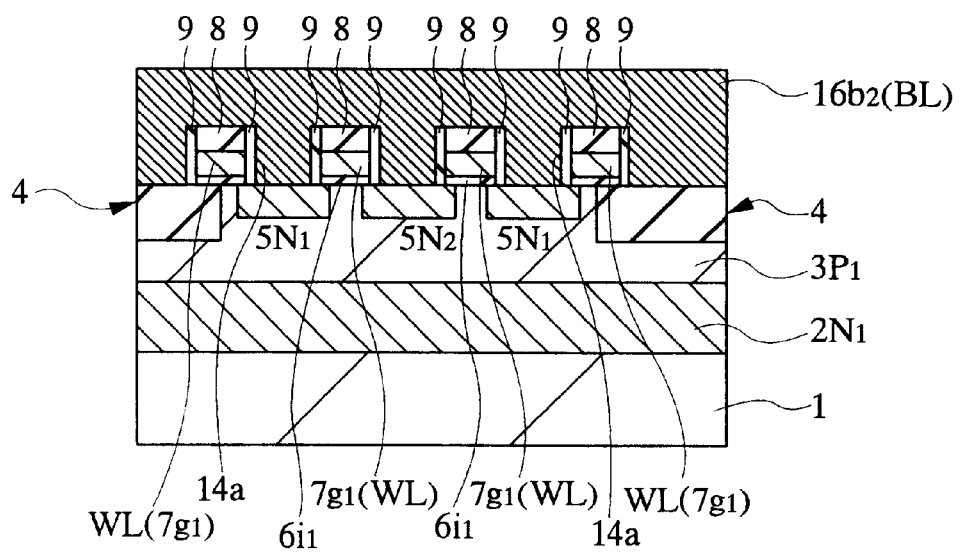
FIG. 4 is a cross-sectional view taken along the line A2—A2 in FIG. 2.
Figure 5:
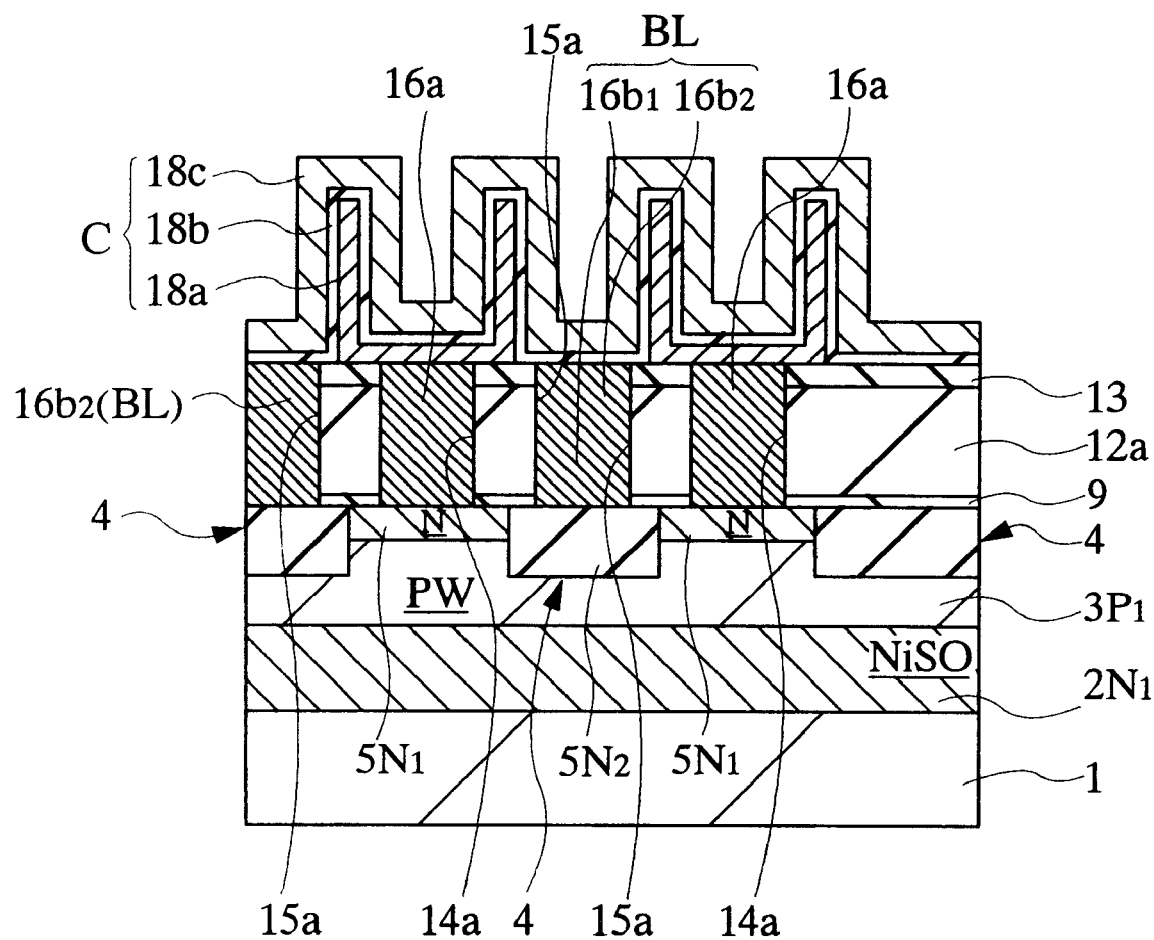
FIG. 5 is a cross-sectional view taken along the line B1—B1 in FIG. 2.
Figure 6:
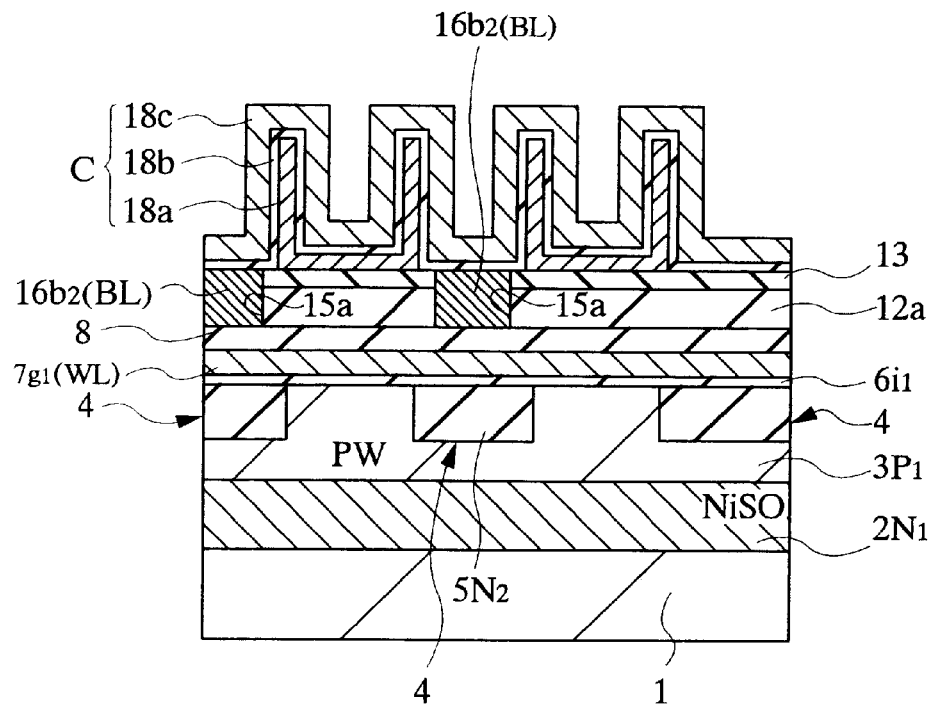
FIG. 6 is a cross-sectional view taken along the line B2—B2 in FIG. 2.
Figure 7:
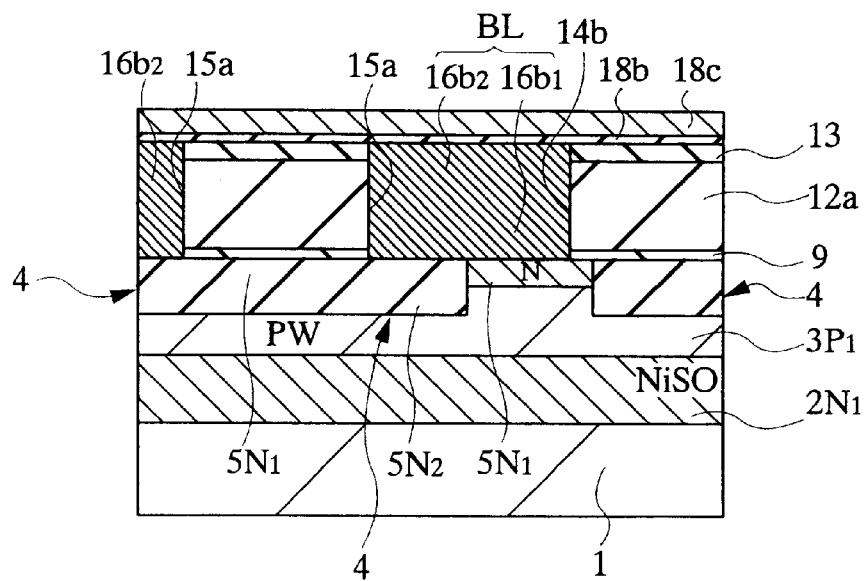
FIG. 7 is a cross-sectional view taken along the line B3—B3 in FIG. 2.

FIG. 1 is a cross-sectional view showing a main portion of a semiconductor integrated circuit device as an embodiment of the present invention. FIG. 2 is a plan view showing a main portion of the semiconductor integrated circuit device shown in FIG. 1. FIGS. 3 to 7 are cross-sectional views taken along lines A1—A1, A2—A2, B1—B1, B2—B2, and B3—B3. FIGS. 8 to 32 are cross-sectional views showing a main portion in steps of manufacturing the semiconductor integrated circuit device shown in FIG. 1.

In the embodiment 1, explanation will be made on a case in which the present invention is applied to a 256 Mbit DRAM (Dynamic Random Access Memory) having a structure in which capacitors for storing information are provided above bit lines, for example. Note that some part of FIG. 2 cited in the explanation of the present embodiment 1 is hatched for convenience of easy understanding of the figure.

As shown in FIGS. 1 to 7, for example, a semiconductor substrate 1 is predominantly made of monocrystalline silicon and it is doped with boron and so as to set it in p-type. Buried wells 2N1 and 2N2 are formed in the semiconductor substrate 1. The buried well 2N1 is formed in a memory cell region M and the buried well 2N2 is formed in the formation region of an n-channel MISFET (Metal Insulator Semiconductor Field Effect Transistor which will be hereinafter referred to as nMIS). These buried n-wells 2N1 and 2N2 are set in n-type by doping phosphorus and are formed such that the peak of the impurity concentration distribution exhibits at a predetermined depth of the semiconductor substrate.

On the n-wells 2N1 and 2N2, p-wells 3P1 and 3P2 are formed respectively. The p-wells 3P1 and 3P2 are set in p-type by doping boron, for example, and are formed such that the impurities spread from the major surface of the semiconductor substrate to the buried n-wells 2N1 and 2N2. Also, in the semiconductor substrate 1, an n-well 3N is formed in the formation region of a P-channel type MISFET (which will be hereinafter abbreviated as pMIS) in the peripheral circuit region P. This n-well 3N is set in n-type by doping phosphorus, for example, and the impurity spreads from the major surface of the semiconductor substrate 1 to a predetermined depth of the semiconductor substrate 1.

In the p-well 3P1 of the memory cell region M is perfectly surrounded by the buried n-well 2N1 in the layer below the p-well 3P1 and by the n-well 3N on the side surfaces of the n-well 3N. In this manner, noise can be prevented from entering through the semiconductor substrate 1 from elements provided in the regions outside the memory cell region M. Also, it is allowable to apply a voltage different from the voltage applied to the semiconductor substrate 1 to the p-well 3P1. In the present embodiment 1, for example, a negative substrate bias voltage is applied to the p-well 3P1 (i.e., to the memory selection MISFET Qs). Voltage to be supplied to the p-well 3P1 is achieved by wires connected to the p-well 3P1. Although it is understood from FIG. 1 that the p-well 3P2 in the peripheral circuit region P is surrounded by the buried n-well 2N2 and the n-well 3N, the p-well 3P2 is not completely surrounded but is electrically connected to the semiconductor substrate 1 so that a voltage equal to that supplied to the semiconductor substrate 1 on the design standpoint can be applied thereto.

On the major surface of the semiconductor substrate 1, for example, an isolation portion 4 of an embedded shallow groove type is formed. The isolation portion 4 defines the active region (first region) LD of the element and is formed by embedding an isolation film 4b in an isolation groove 4a. This isolation film 4b is made of a silicon oxide film or the like and the upper surface thereof is subjected to flattening processing so that the upper surface is substantially made flush with the major surface of the semiconductor substrate 1.

The active region LD in the memory region M is formed into a flat rectangular shape so as to be isolated from other components in the surface as shown in FIG. 2. For example, two memories cell selection MISFET Qs are formed in each of the active region LD. Each memory cell selection MISFET Qs has a pair of semiconductor regions 5N1 and 5N2 for source-drain with a channel region inserted therebetween, and a gate electrode 7g1 provided on the channel region with a gate insulating film 6i1 inserted therebetween.

The pair of semiconductor regions 5N1 and 5N2 are set in n-type by doping phosphorus, for example. The two memory cell selection MISFET Qs have the semiconductor region 5N2 of the pair of semiconductor regions 5N1 and 5N2 in common. This structure may be arranged such that a silicide layer such as a titanium silicide layer or the like is provided on the semiconductor regions 5N1 and 5N2. With this manner, the contact resistance between wires and the semiconductor regions 5N1 and 5N2 can be reduced.

The gate insulating film 6i1 is made of a silicon oxide film, for example, and the thickness is set to about 7 to 8 nm. Also, the gate insulating film 6i1 may be formed of an oxygen nitride film (SiON film). In this manner, it is possible to suppress generation of an interface state in the gate insulating film, and to reduce electron trapping in the gate insulating film. Therefore, hot-carrier resistance of the gate insulating film 6i1 can be improved. The gate insulating film 6i1 can be, subjected to oxygen-nitriding in such a manner that when a gate insulating film 6i1 is formed by oxidation processing, for example, the gate insulating film 6i1 is subjected to high-temperature thermal processing in a $NH_3$ gas atmosphere or $N_2O$ gas atmosphere, whereby nitrogen is introduced. Alternative methods are that a method of forming the gate insulating film 6i1 made of a silicon oxide film or the like and thereafter forming a nitride film on the upper surface of gate the insulating film, a method of ion-implanting nitrogen into the major surface of the semiconductor substrate and thereafter performing oxidation processing for forming the gate insulating film 6i1, or a method of ion-implanting nitrogen into a polycrystalline silicon film for forming gate electrodes and thereafter performing thermal processing to educe nitrogen in the gate insulating film.

Gate electrodes 7g1 are formed of parts of word lines WL. These word lines WL are arranged to be perpendicular to the active regions LD as shown in FIG. 2. Those regions of the word lines WL that overlap the active regions LD are used as gate electrodes 7g1. The gate electrode 7g1 is formed of, for example, a conductive film made of n-type low resistance polysilicon or the like, a barrier film formed of titanium nitride, tungsten nitride, or the like, and a conductive film made of tungsten or the like, layered orderly from downside. This barrier film functions to prevent silicide from being formed at contact portions between layers by a thermal treatment during manufacturing process, when a tungsten film is directly layered on a low resistance polysilicon film. Also, the conductive film made of tungsten or the like functions to reduce the wiring resistance of the word line WL, so that the sheet resistance of the gate electrode 7g1 (i.e., is the word line WL) can be reduced to about 2 to 2.5 $\Omega/\square$. That is, the sheet resistance can be reduced to about $\frac{1}{10}$ of the resistivity of 15 to 10 $\mu\Omega$cm of tungsten silicide. With this manner, the access speed of the DRAM can be improved. Also, the number of memory cells which can be provided with respect to one word line WL can be increased so that the occupied area of the entire memory cell regions can be reduced and the size of the semiconductor chip can therefore be reduced. For example, in the present embodiment, 512 memory cells can be provided with respect to the word line WL. This means that the size of the semiconductor chip can be reduced by about 6% as compared with the case in which 256 memory cells can be provided for one word line. In case of a semiconductor chip in the class of much smaller size, it is possible to obtain a size reduction effect close to 10%. Therefore, it is possible to increase the number of semiconductor chips which can be manufactured by single manufacturing process, so that cost reduction of the DRAM can be expected. If the size of the semiconductor chip is not changed, integration of elements can be improved. On the upper surface of the gate electrode 7g1, a cap insulating film 8 is formed. A thin insulating film 9 which reflects steps of underlaying layers is formed on the side surfaces of the gate electrode 7g1, the surface of the cap insulating film 8, the major surface of the semiconductor substrate 1, and the upper surface of the isolation portion 4. The cap insulating film 8 and the insulating film 9 are each made of a silicon nitride film, for example.

Meanwhile, in the active region in the peripheral circuit region P, pMIS Qp and nMIS Qn are formed. The pMIS Qp has a pair of semiconductor regions 10P for source-drain with a channel region inserted therebetween, and a gate electrode 7g2 formed on the channel region with a gate insulating film 6i1 inserted therebetween. The nMIS Qn has a pair of semiconductor regions 11N for source-drain with a channel region inserted therebetween, and a gate electrode 7g2 formed on the channel region with a gate insulating film 6i2 inserted therebetween.

Each of the semiconductor regions 10P and 11N has a low concentration region and a high concentration region having a higher impurity concentration than the lower concentration region. The low-concentration region is a region which mainly functions to reduce the hot carrier effect, and is adjacent to a channel region. The high-concentration region is formed at a position which is distant from the channel region by the two-dimensional dimension of the lower concentration region. The low-concentration region and high-concentration region of the pMIS Qp are set in p-type by doping boron, for example. Meanwhile, phosphorus, for example, is doped into the low-concentration region of the nMIS Qn and arsenic is doped into the high-concentration region thereof. The low and high-concentration regions of the nMIS Qn are both sets in n-type. Also, a pocket region for restricting punch-through between the source and drain is provided near the corner of the bottom portion of the semiconductor regions 11N in the side of the channel region. The pocket region provided in the side of the pMIS Qn is set in n-type and the pocket region provided in the side of the nMIS Qn is set in p-type. Note that the structure may be arranged such that a silicide layer made of, tungsten silicide, titanium silicide, or the like is formed above the semiconductor regions 10P and 11N, for example. In this case, the contact resistance between wires and the semiconductor regions 10P and 11N can be reduced.

Like the gate insulating film 6i1, the gate insulating film 6i2 is made of a silicon oxide film or the like and has a thickness of about 4 to 4.5 nm which is smaller than the film 6i1, for example. This gate insulating film 6i2 may be an oxygen nitride film like the gate insulating film 6i1. The gate electrode 7g2 is the same as the gate electrode 7g1 and detailed explanation thereof will therefore be omitted herefrom. Note that the gate electrode 7g on the isolation portion indicates a gate electrode of another MISFET and is formed at the same time when the gate electrodes 7g1 and 7g2 are formed. The cap insulating film 8 described above is also formed on the upper surfaces of the gate electrodes 7g2 and 7g. In addition, the thin insulating film 9 which reflects the steps of underlaying layers is formed also on the side surfaces of the gate electrodes 7g2 and 7g and the surface of the cap insulating film 8 thereon, the major surface of the semiconductor substrate 1, and the upper surface of the isolation portion 4.

On the major surface of the semiconductor substrate 1 as described above, for example, an interlayer insulating film 12a is coated which is made of a silicon oxide film or the like. For example, an insulating film 13 made of a silicon nitride film or the like is coated on the interlayer insulating film 12a. Contact holes 14a to 14e through which the upper surfaces of the semiconductor regions 5N1, 5N2, 10P, and 11N are exposed and wiring grooves 15a and 15b are formed in the interlayer insulating film 12a and the insulating film 13.

A plug 16a is embedded in the contact hole 14a in the memory cell region M. This plug 16a is a member for electrically connecting the semiconductor region 5N1 of the memory cell selection MISFET Qs and the capacitor (information storage capacity element) C, and is formed in a manner in which a thin film made of titanium nitride or the like is layered on a thin conductive film made of titanium or the like and a thick conductive film made of tungsten or the like is further layered thereon. Although the plan shape of the contact hole 14a (plug 16a) at the stage of designing is a flat rectangular shape which can be included in the flat region of the plan region of the semiconductor region 5N1, as shown in FIG. 2, the corners of this shape is actually chamfered to become round.

In the memory cell region M, the wiring groove 15a communicates with the contact hole 14b. In the contact hole 14b, a contact portion 16b1 of a bit line BL is embedded and a wiring portion 16b2 of the bit line BL is embedded in the wiring groove 15a. The contact portion 16b1 and the wiring portion 16b2 of the bit line BL are formed integrally, and the bit line BL is electrically connected with the semiconductor region 5N2 through the contact portion 16b1. That is, in the present embodiment, the contact portion 16b1 and wiring portion 16b2 of the bit line BL are integrally formed, and therefore, no contact resistance is caused between both portions. In addition, the wiring portion 16b2 of the bit line BL is embedded in the wiring groove 15a and the upper surface thereof is flattened such that the upper surface thereof substantially corresponds to the upper surface of the insulating film 13. Therefore, s teps of the pattern of the bit line do not appear above the bit line BL, so that etching residues made of a conductive layer are eliminated on side surfaces of such steps. Accordingly, short-circuiting errors caused by such etching residues can be prevented.

In the structure as viewed from cross-section of the wiring portion 16b2 of the bit line BL, since the wiring groove 15a is formed so as to expose the insulating film 9, the wiring portion 16b2 is interposed between word lines WL adjacent to each other. Therefore, the sectional area of the bit line BL can be increased and the resistance thereof can be reduced. The plan shape of the wiring portion 16b2 of the bit line BL is basically shaped so as to extend straight in the direction perpendicular to the extending direction of the word lines WL, and a part of the shape is projected in the direction extending in parallel with the extending direction of the word line WL. This projecting portion two-dimensionally overlaps the active region L. Further, a contact hole 14b and a contact portion 16b1 are provided at the overlapping portion. The conductive film integrally formed of the contact portion 16b1 and the wiring portion 16b2 of the bit line BL is formed by layering a relatively thin conductive film made of titanium nitride or the like on a relatively thin conductive film made of titanium or the like, and by further layering a relatively thick conductive film made of tungsten or the like.

In addition, plugs 16c and 16e are embedded in contact holes 14c and 14e in the peripheral circuit region P. The sectional and plan structures and the material of each plug 16c and 16e is the same as those of the plug 16a described previously, and detailed explanation thereof will be omitted herefrom. In the peripheral circuit region P, the wiring groove 15b and the contact hole 14d communicate with each other. A contact portion 16d1 of a local wire 17 is embedded in the contact hole 14d. This local wire 17 electrically connects the semiconductor regions 10P and 11N with each other. Since the contact portion 16d1 and the wiring portion 16d2 are integrally formed, the local wire 17 has a structure in which no contact resistance is generated between the contact portion 16d1 and the wiring portion 16d2. Also, since the wiring portion 16d2 of the local wire 17 is embedded in the wiring groove 15b and is flattened such that the upper surface thereof is substantially made flush with the upper surface of the insulating film 13, pattern steps are not caused above the local wire 17 so that etching residues will be eliminated on the side surfaces of such steps and short-circuiting errors can be prevented from being caused by such etching residues. The material forming the local wire 17 is the same as that of the bit line BL, and explanation thereof will be omitted herefrom.

On the insulating film 13 in the memory cell region M, there is provided a capacitor C of a crown type, for example. This capacitor C and the memory cell selection MISFET Qs constitute together a memory cell of the DRAM. The capacitor C consists of a lower electrode 18a, a capacity insulating film 18b coated on the surfaces (including the inner side surfaces and outer side surfaces) thereof, and an upper electrode 18c provided on the surface of the film. The lower electrode 18a is made of, for example, low resistance polysilicon doped with phosphorus and is electrically connected with a plug 16a. The capacity insulating film 18b is formed by layering a tantalum oxide film ($Ta_2O_5$) on a silicon nitride film, for example. The upper electrode 18c is formed by layering an n-type low resistance polysilicon on titanium nitride, for example.

This kind of capacitor C is coated with an interlayer insulating film 12b deposited on the insulating film 13. The interlayer insulating film 12b is made of a silicon oxide film, for example. First layer wires 19a to 19d are formed on the interlayer insulating film 12b. The first layer wires 19a to 19d are formed by depositing, for example, titanium, titanium nitride, aluminum (or aluminum-silicon-copper alloy), titanium, and titanium nitride orderly from downside. The first layer wire 19a is electrically connected with the upper electrode 18c through a plug 21a in a contact hole 20a formed in the interlayer insulating film 12b. The first layer wire 19b is electrically connected with the plug 16a through the plug 21b in the contact hole 20b formed in the interlayer insulating film 12b. In addition, the first layer wire 19c is electrically connected with the local wire 17 through a plug 21c in a contact hole formed in the interlayer insulating film 12b. Further, the first layer wire 19d is electrically connected with the plug 16e and the gate electrode 7g through a plug 21d in a contact hole 20 formed so as to penetrate the interlayer insulating films 12a and 12b and the insulating film 13. That is, the plug 21d electrically connects the plug 16e (i.e., the semiconductor region 11N) with the gate electrode 7g.

On the interlayer insulating film 12b, an interlayer insulating film 12c made of, for example, a silicon oxide film is deposited. The material forming the second layer wire 22 is the same as that of the first layer wires 19a to 19d, and therefore, explanation thereof will not be described. The second layer wire 22 is electrically connected with the first layer wires 19b and 19d through plugs 24a and 24b in contact holes 23a and 23b, respectively. Further, a surface protection film 25 is deposited on the interlayer insulating film 12c. At a part of the surface protection film 25, an opening portion is formed and exposes a part of the second layer wire 22. The second layer wire 22 forms a bonding pad BP. The surface protection film 25 is formed by layering a polyamide resin on a silicon oxide film or on a silicon oxide film with a silicon nitride film inserted therebetween. In addition, the bonding pad BP is electrically connected with a lead of the package through a solder bump or a bonding wire and is further electrically connected with an external device.

Next, a method of manufacturing a semiconductor integrated circuit device according to the present invention will be explained with reference to FIGS. 8 to 32.

Figure 8:
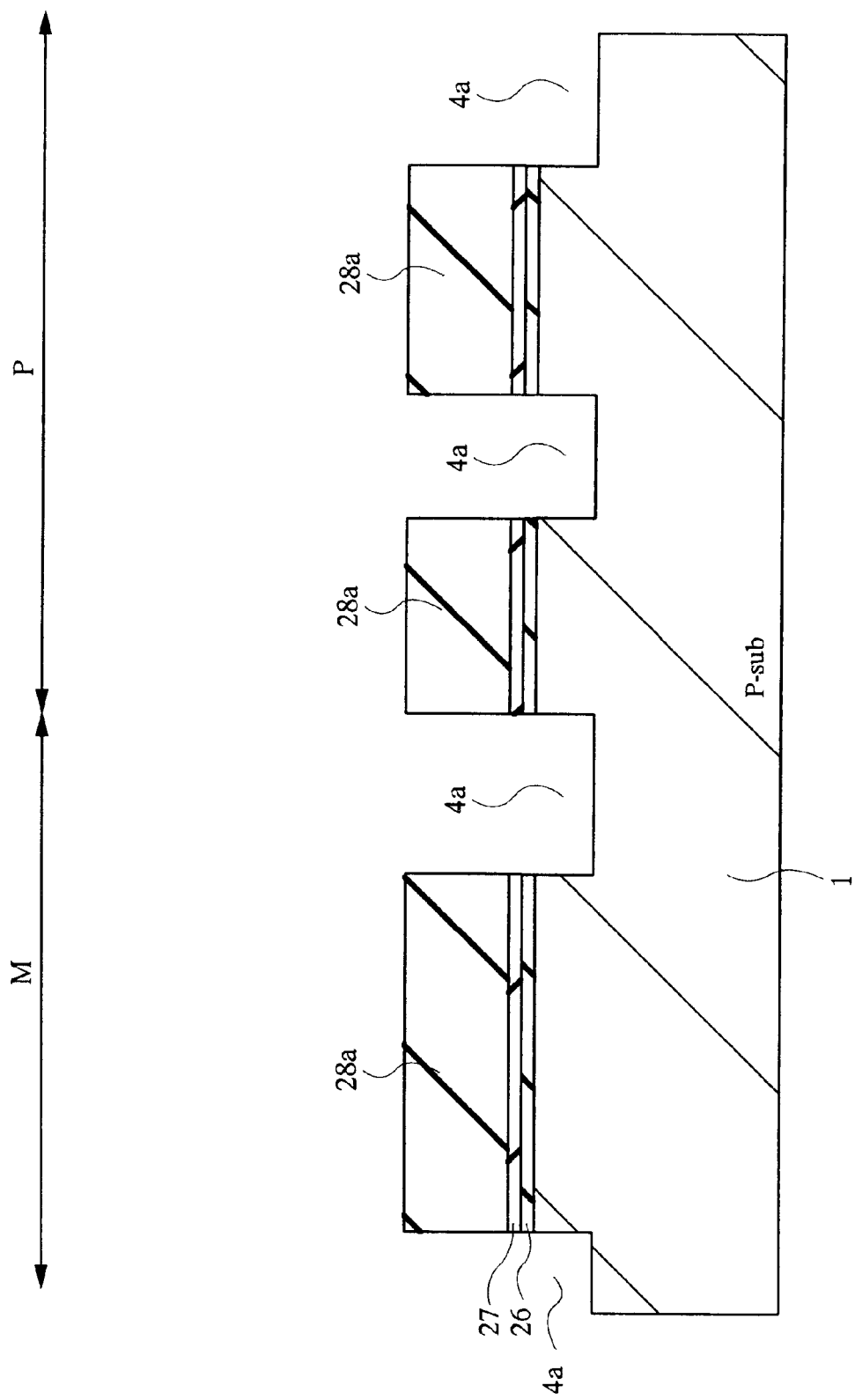
FIG. 8 is a cross-sectional view showing a main portion of the semiconductor integrated circuit device shown in FIG. 1 under the steps of manufacturing.
Figure 9:
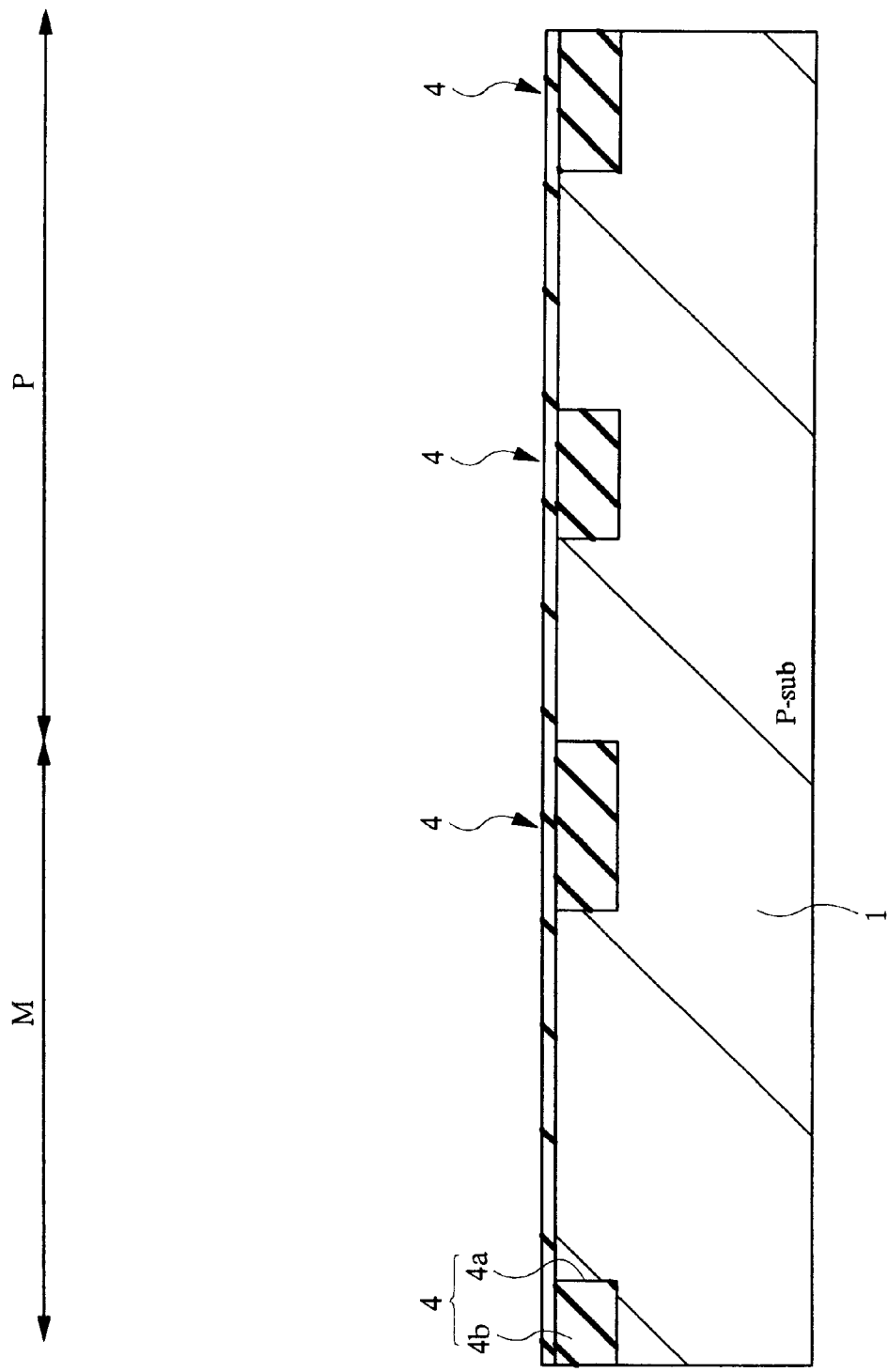
FIG. 9 is a cross-sectional view showing a main portion of the semiconductor Integrated circuit device shown in FIG. 1 in a manufacturing step subsequent to the step of FIG. 8.

At first, as shown in FIG. 8, a pad film 26 made of, for example, a silicon oxide film is formed by an oxidation method on the major surface of a semiconductor substrate 1 made of $p^-$-type monocrystalline silicon. Thereafter, an insulating film 27 made of a silicon nitride film is formed thereon by a CVD method or the like, and further, a photoresist pattern 28a through which an isolation region is exposed is formed thereon. Subsequently, the insulating film 27, the pad film 26, and a part of the semiconductor substrate exposed therefrom are etched and removed with the photoresist pattern 28a used as a mask, thereby to form an isolation groove 4a. Thereafter, the photoresist pattern 28a is removed, and thermal oxidization processing is then effected on the semiconductor substrate 1, with the insulating film 27 used as a mask, thereby to form a silicon oxide film on the side surfaces and the bottom surfaces of the isolation groove 4a.

Subsequently, for example, a silicon oxide film is coated on the major surface of the semiconductor substrate 1 by a CVD method while the insulating film 27 is left removed. This silicon oxide film is preferably be deposited by a plasma CVD method in which, for example, ozone ($O_3$) and tetraethoxysilane (TEOS) are used for a source gas. Subsequently, the silicon oxide film is removed by an etch-back method or preferably a CMP (Chemical Mechanical Polishing) method such that the silicon oxide film remains only in the isolation groove 4a, thereby to form a isolation film 4b made of a silicon oxide film or the like in the isolation groove 4a. Thereafter, a thermal treatment is performed in order that the silicon oxide film forming the isolation film 4b becomes finer, and the insulating film 27 (ref. FIG. 8) is removed. The isolation portion of an embedded shallow groove type is thus formed.

Figure 10:
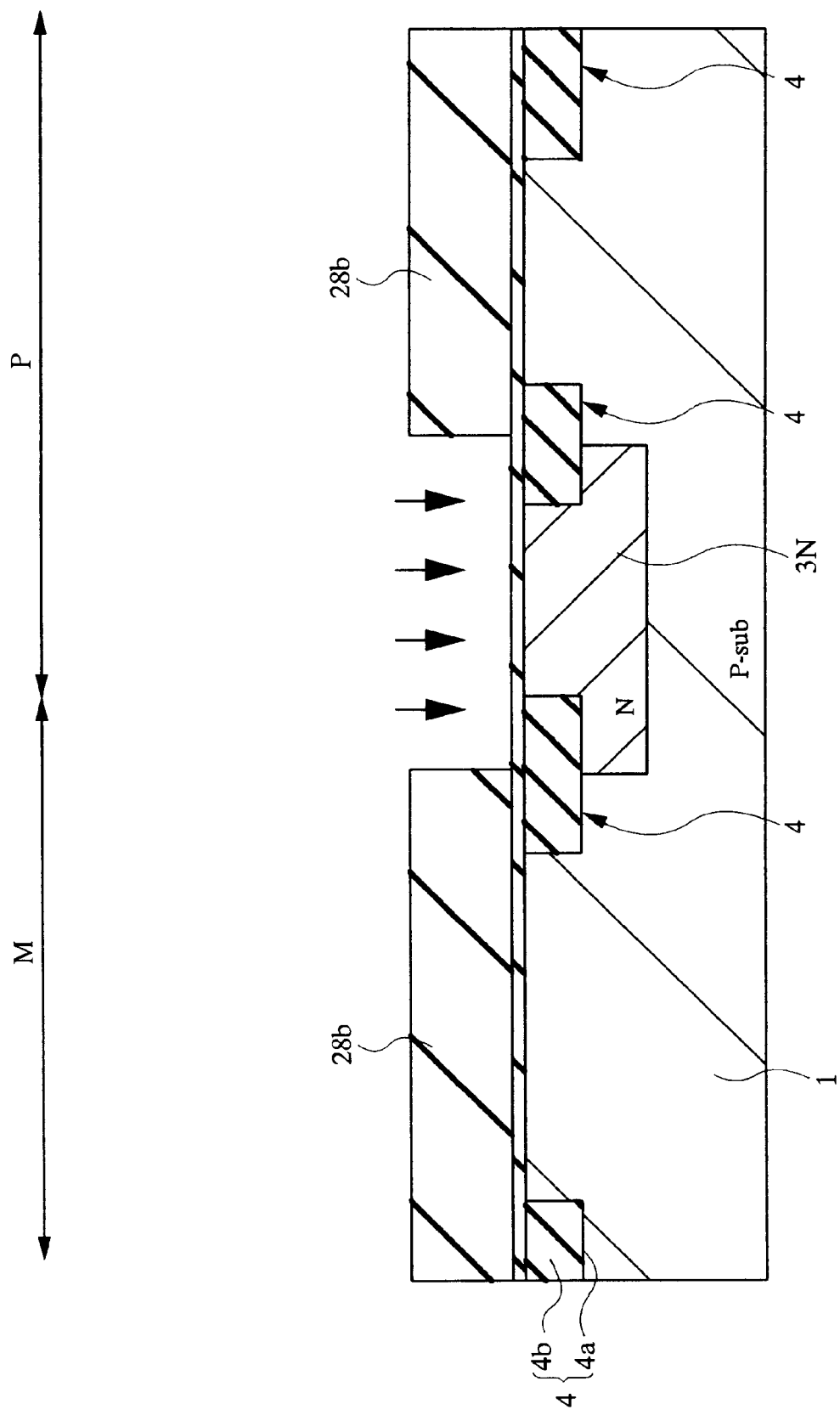
FIG. 10 is a cross-sectional view showing a main portion of the semiconductor integrated circuit device shown in FIG. 1 in a manufacturing step subsequent to the step of FIG. 9.
Figure 11:
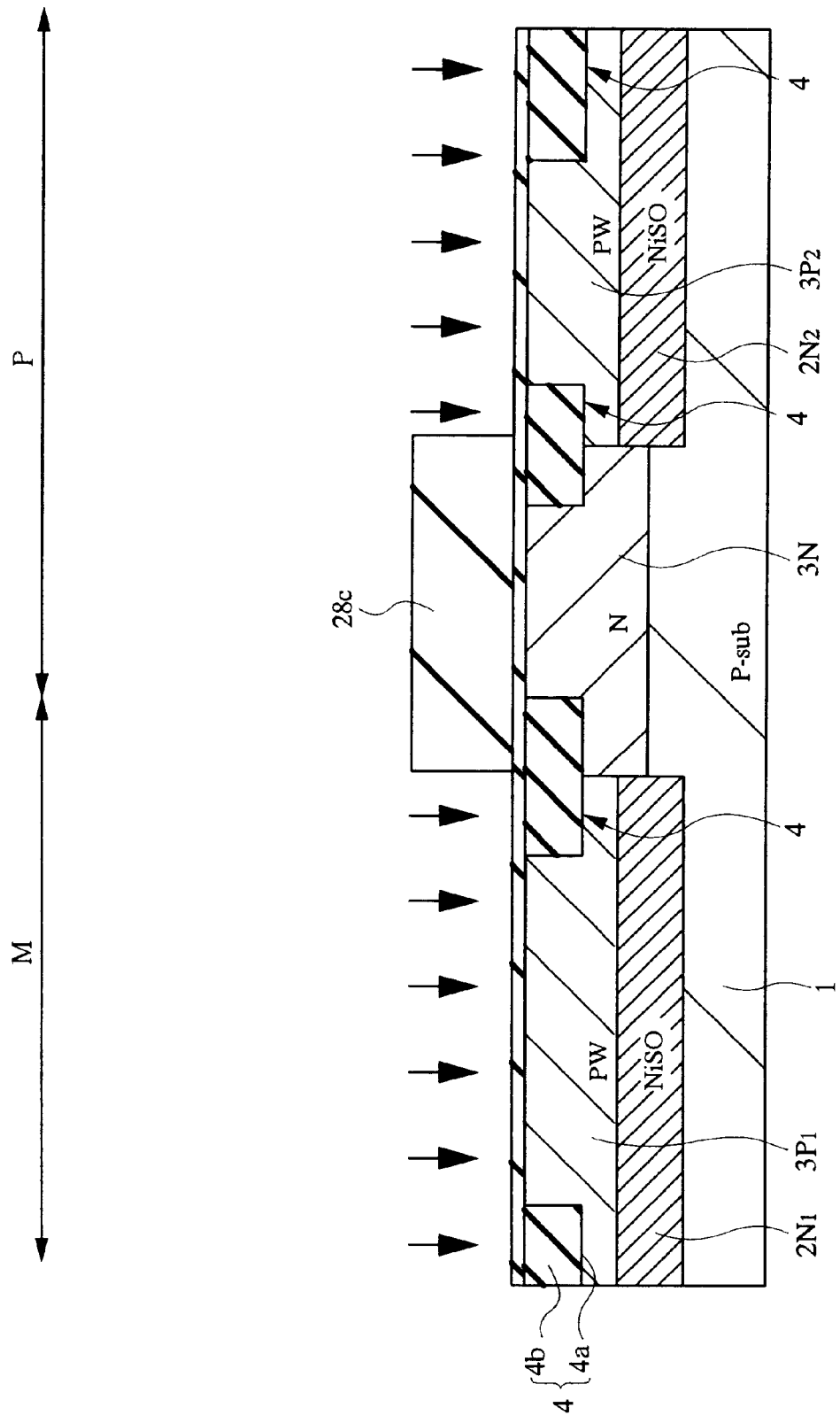
FIG. 11 is a cross-sectional view showing a main portion of the semiconductor integrated circuit device shown in FIG. 1 in a manufacturing step subsequent to the step of FIG. 10.
Figure 12:
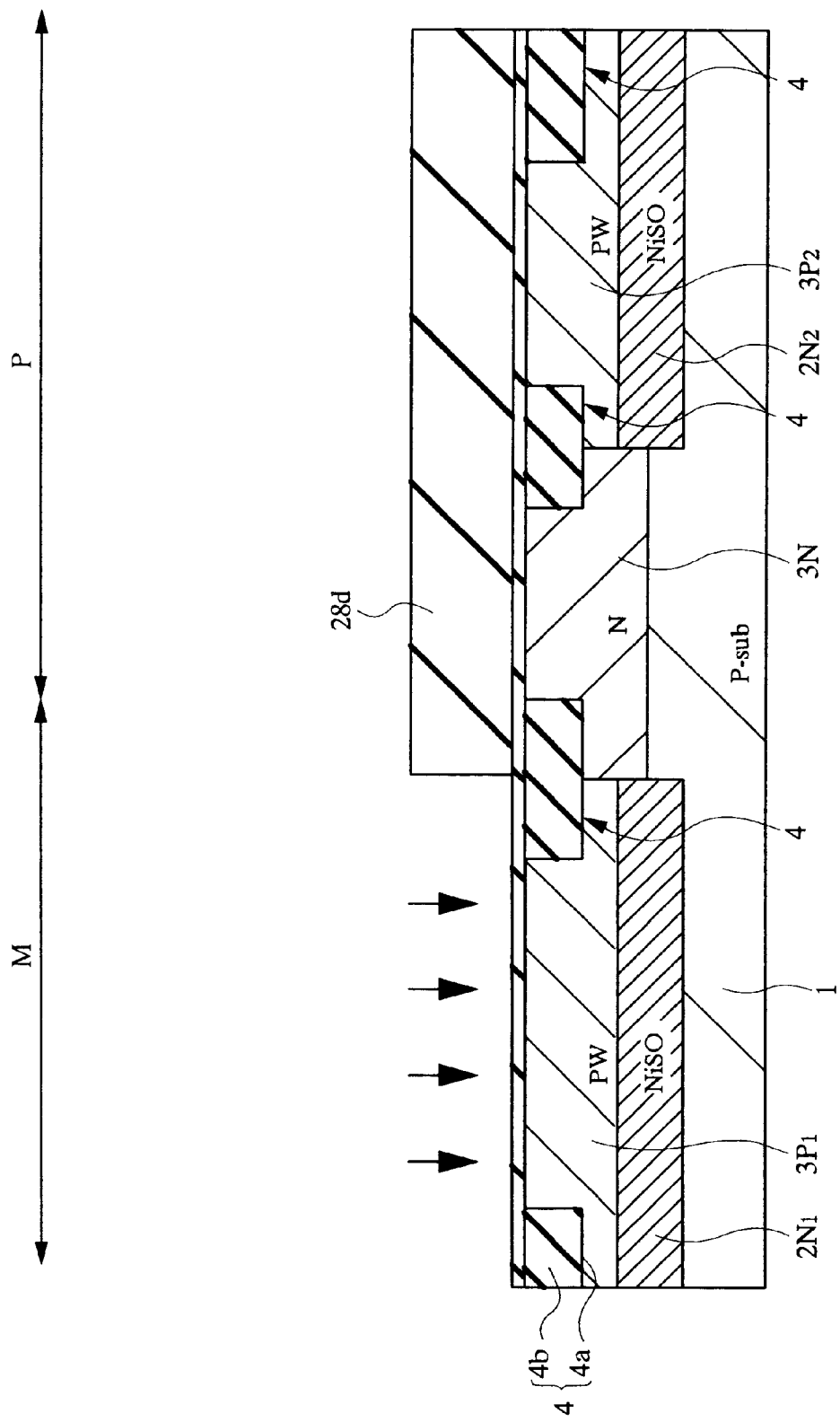
FIG. 12 is a cross-sectional view showing a main portion of the semiconductor integrated circuit device shown in FIG. 1 in a manufacturing step subsequent to the step of FIG. 11.

Next, as shown in FIG. 10, a photoresist pattern 28b through which an n-well formation region is exposed is formed on the major surface of the semiconductor substrate 1. Thereafter, for example, phosphorus is implanted by an ion implantation method with this pattern used as a mask, in order to form an n-well 3N. Also, for example, boron is implanted by an ion implantation method in order to set the threshold value of the pMIS Qp (ref. FIG. 1). Subsequently, the photoresist pattern 28b is removed, and thereafter, a photoresist pattern 28c through which a p-well formation region is exposed is formed on the major surface of the semiconductor substrate 1, as shown in FIG. 11. Thereafter, for example, boron is implanted by an ion implantation method with the photoresist pattern 28c used as a mask, in order to form p wells 3P1 and 3P2 on the semiconductor substrate 1. Also, for example, boron is implanted by an ion implantation method in order to set the threshold voltages of the memory cell selection MISFET Qs and MIS Qn (ref. FIG. 1). Further, for example, phosphorus is implanted by an ion implantation method in order to form buried n-wells 2N1 and 2N2. Thus, impurities for forming p-wells 3P1 and 3P2, impurities for setting threshold voltages, and impurities for forming buried n-wells 2N1 and 2N2 are ion-implanted with one same photoresist pattern 28c used as a mask. Therefore, the manufacturing steps can be simplified so that the manufacturing period of the product can be shortened. Reduction of manufacturing costs can be promoted.

Figure 13:
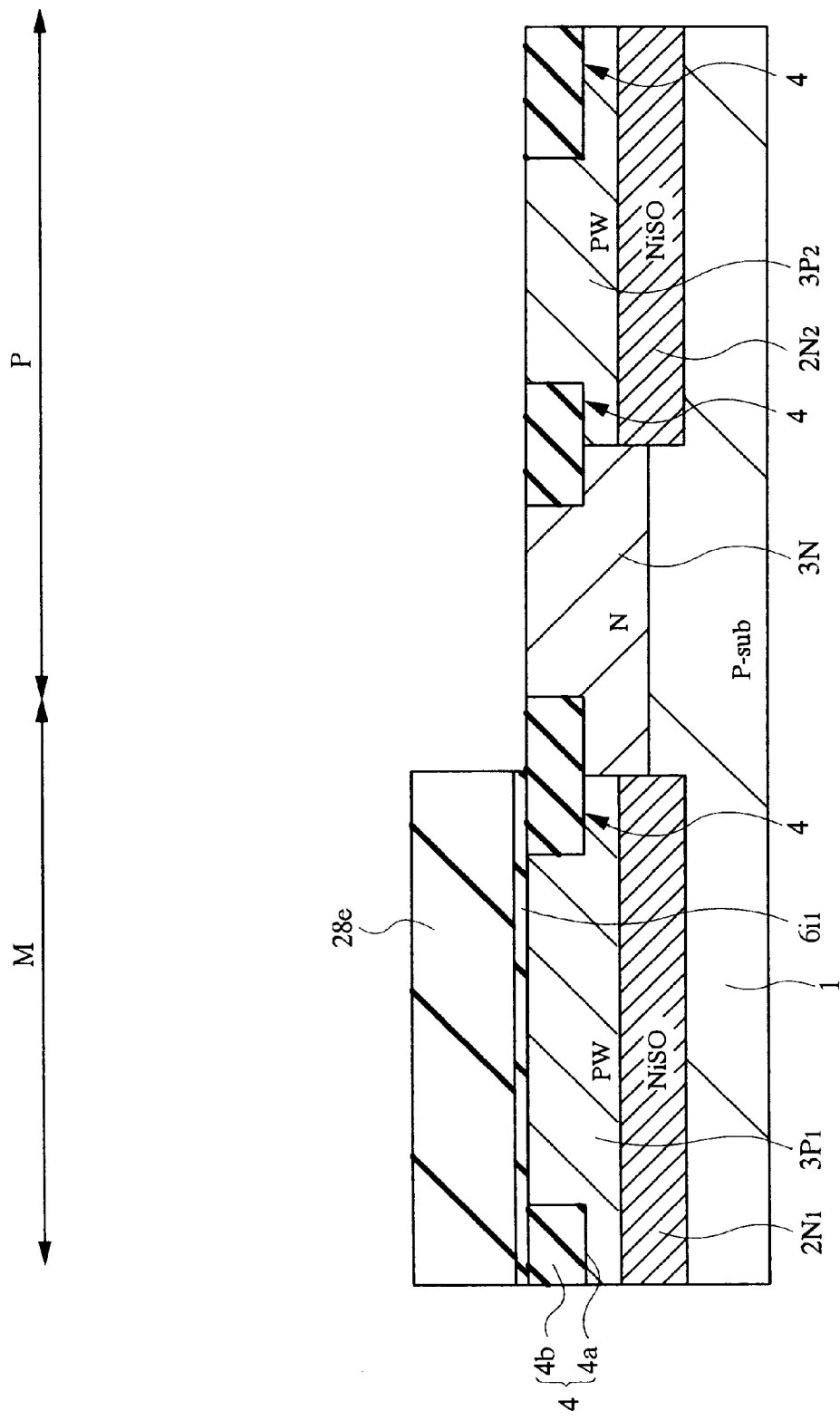
FIG. 13 is a cross-sectional view showing a main portion of the semiconductor integrated circuit device shown in FIG. 1 in a manufacturing step subsequent to the step of FIG. 12.

After the photoresist pattern 28c is removed, a photoresist pattern 28d which exposes the memory cell region M while covering the other regions is formed on the major surface of the semiconductor substrate 1 in order to set the threshold voltage on the memory cell selection MISFET Qs (ref. FIG. 1). With this pattern used as a mask, for example, boron is implanted into the semiconductor substrate 1 by an ion implantation method. Subsequently, the photoresist pattern 28d is removed, and thereafter, RTA (Rapid Thermal Anneal) processing is carried, for example, at 950 to 1050° C. for several seconds to several minutes in order to activate the impurities doped as described above. In this manner, n-well 3N, p-wells 3P1 and 3P2, and buried n-wells 2N1 and 2N2 are formed. Thereafter, as shown in FIG. 13, thermal oxidization processing is performed on the semiconductor substrate 1, for example, at about 800° C. thereby to form a silicon oxide film having a thickness of about 6 to 7 nm (which is a film for forming the gate insulating film 6i1).

Figure 14:
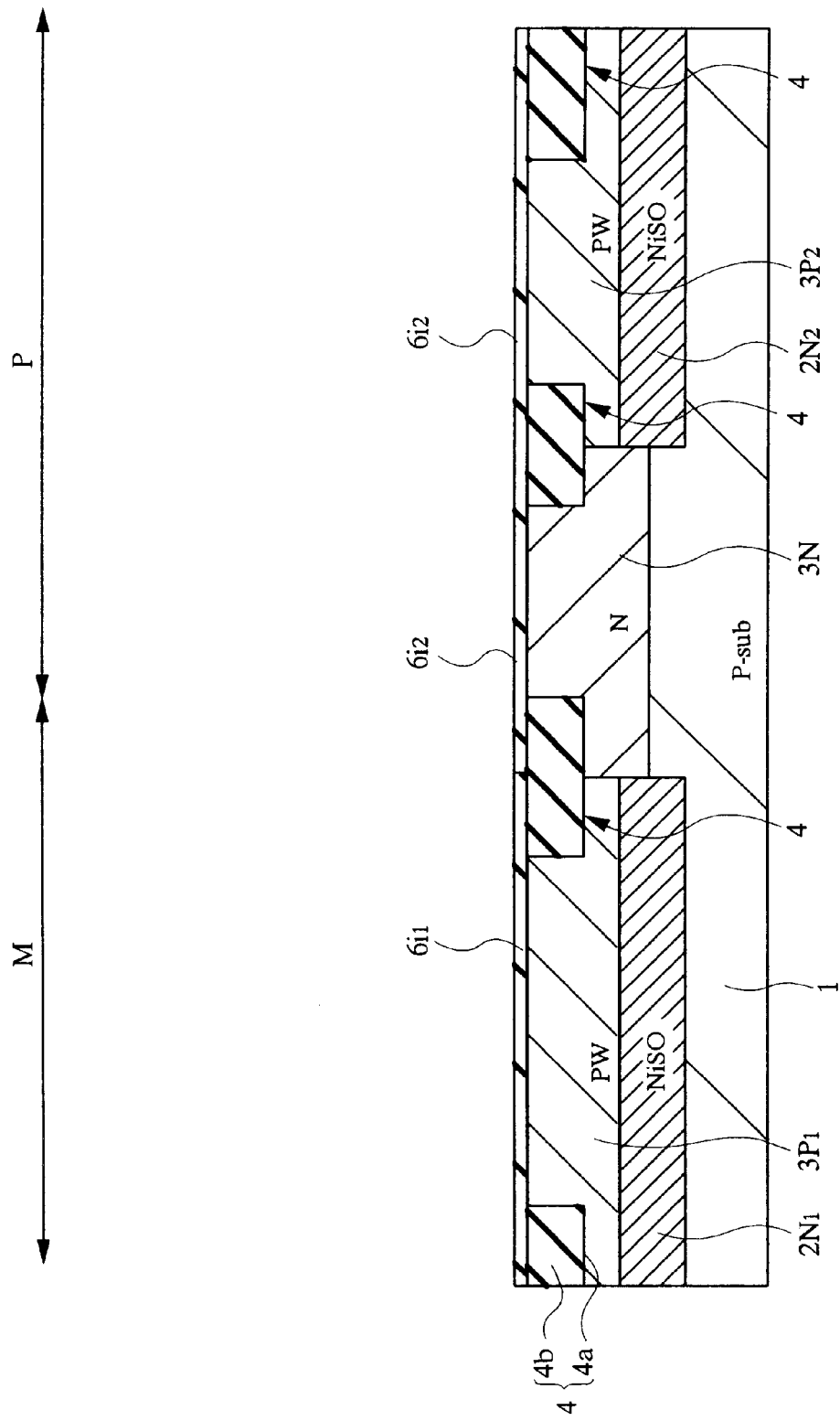
FIG. 14 is a cross-sectional view showing a main portion of the semiconductor integrated circuit device shown in FIG. 1 in a manufacturing step subsequent to the step of FIG. 13.

Subsequently, for example, a photoresist pattern 28e which covers the memory cell region M and exposes the nMIS formation region and pMIS formation region of the peripheral circuit region is formed on the gate insulating film 6i1. Thereafter, with this mask used as an etching mask, the gate insulating film 6i1 exposed from the mask is removed, for example, preferably by a wet etching method. Subsequently, the photoresist pattern 28e is removed, and thermal oxidization processing is performed on the semiconductor substrate 1 as shown in FIG. 14, for example, at about 750° C., thereby to form a silicon oxide film (which is a film for forming the gate insulating film 6i2) having a thickness of about 3 to 4 nm, for example. Thereafter, a thermal treatment is carried out, for example, in a NO atmosphere at 900° C. or in a $N_2O$ atmosphere at 1050° C. In this manner, the film thickness of the gate insulating film 6i1 (which is a thick gate insulating film) of the memory cell selection MISFET Qs of the DRAM is set to about 7 to 8 nm, for example, and the film thickness of the gate insulating film 6i2 of the nMIS Qn and pMIS Qp is set to about 4 to 4.5 nm. In addition, a silicon nitride film is formed at the boundary portion between the silicon monocrystal forming the semiconductor substrate 1 and the gate insulating films 6i1 and 6i2 made of silicon oxide films. This silicon nitride film fills dungling bonds in the silicon oxide films as the gate insulating films 6i1 and 6i2. Therefore, the gate insulating films 6i1 and 6i2 can be prevented from being deteriorated due to generation of hot carriers. Further, boron as impurities implanted in the p-type silicon having a dual gate electrode structure (in which the gate electrode of nMIS is made of n-type polysilicon and the gate electrode of pMIS is made of p-type polysilicon) are accelerated in a fluorine atmosphere or a hydrogen atmosphere and diffused into the channel region, whereby it is possible to avoid fluctuation in the threshold voltage (Vt).

Although not shown in the figures of the present embodiment, a MISFET having a relatively thick gate insulating film like the memory cell selection MISFET Qs is used for a part of MISFET for the word decoder or substrate bias generation circuit of the DRAM and a part of a MISFET for input/output. In the present embodiment, the gate insulating film 6i1 of the memory selection MISFET Qs of the DRAM is relatively thick and the gate insulating film 6i2 of the nMIS Qn and pMIS Qp forming the peripheral circuit of the DRAM is formed to be relatively thin. However, the present embodiment is not limited hitherto. Specifically, in case where the memory cell selection MISFET Qs is of negative bias operation, the gate insulating film 6i1 of the memory cell selection MISFET Qs can be made thin like the gate insulating film 6i2. This is because while in a conventional substrate bias method the potential applied to the gate electrode is constantly positive and the gate insulating film 6i1 is applied with a high voltage since the word line boost method is adopted, in case of adopting negative bias operation the potential of the gate electrode 7g1 ranges from a negative value to a positive value in relation to the potential of the p-well 3P1 as a channel region, with the result that the voltage applied to the gate insulating film 6i1 of the memory cell selection MISFET Qs can be substantially reduced.

Thereafter, a conductive film for forming gate electrodes is coated on the gate insulating films 6i1 and 6i2, and a cap insulating film 8 made of, for example, a silicon nitride film is coated thereon. In case of forming a gate electrode having a polycide structure in a single gate electrode structure (in which both the gate electrodes of the pMIS and nMIS are formed of n-type polysilicon), the conductive film for forming gate electrodes as described above is formed by depositing tungsten silicide on a n-type low resistance polysilicon film orderly from the lower layer. Note that this n-type polysilicon film may be formed by doping phosphorus during deposition of the polysilicon film or may be formed by depositing a polysilicon film containing no impurities by a CVD method and by thereafter implanting phosphorus or arsenic into the polysilicon film by thermal diffusion or an ion-implantation method.

In case of forming a gate electrode having a poly-metal structure in the single gate electrode structure, the conductive film for forming the gate electrode is formed by coating a tungsten nitride film or the like on, for example, a n-type low resistance polysilicon film by a CVD method and by further coating thereafter tungsten or the like thereon. Note that the n-type low resistance polysilicon film in this case is formed in a manner that for example, polysilicon containing no impurities is deposited by a CVD method and then phosphorus, arsenic, or the like is formed by effecting thermal diffusion or an ion-implantation method.

In case of a dual gate electrode in any of the polycide gate structure and the poly-metal gate structure, polysilicon doped with no impurities is deposited. Thereafter, phosphorus, arsenic, or the like is thereafter implanted into the nMIS region by an ion-implantation method with use of a mask not shown, and boron or the like is implanted into the pMIS region by an ion-implantation method with use of a mask. In the case of the dual gate electrode, phosphorus is introduced by an ion-implantation method to set the threshold voltage of the pMIS Qp shown in FIG. 10. Subsequently, tungsten silicide or the like is deposited by a CVD method in case of the polycide gate structure. Meanwhile, a tungsten nitride film or the like is deposited by a CVD method, and thereafter, a tungsten film or the like is coated thereon by a CVD method or the like. At this time, the silicon nitride film for forming the cap insulating film 8 is deposited, for example, by a CVD method at a temperature of 70° C. or less in order to prevent acceleration and diffusion of boron caused by existence of halogen.

Figure 15:
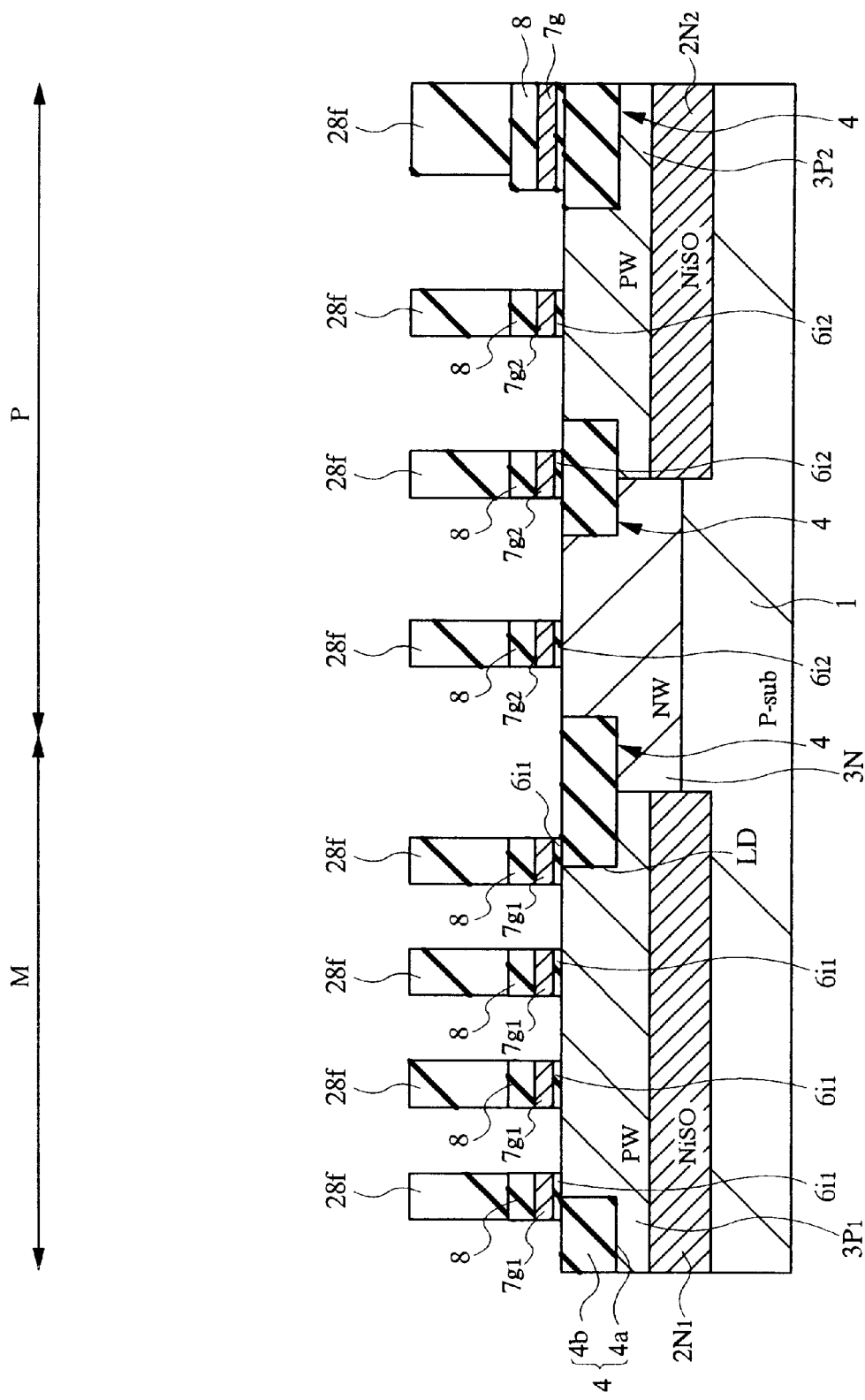
FIG. 15 is a cross-sectional view showing a main portion of the semiconductor integrated circuit device shown in FIG. 1 in a manufacturing step subsequent to the step of FIG. 14.

Subsequently, as shown in FIG. 15, a photoresist pattern 28*f* for forming gate electrodes is formed on the cap insulating film 8, and thereafter, those portions of the cap insulating film 8 and the conductive film for forming the gate electrodes that are exposed through the photoresist pattern 28*f* are etched and removed with the pattern used as an etching mask. Gate electrode 7*g*, 7g1, and 7g2 and the cap insulating film 8 thereon are formed thereby. While in the present embodiment, the photoresist pattern 28*f* is not removed but is left unremoved until working on the gate electrodes is finished, the present embodiment is not limited hitherto. At first, the cap insulating film 8 made of, for example, a silicon nitride film or the like is processed with the photoresist pattern 28*f* used as an etching mask, and the photoresist pattern 28*f* is thereafter removed. Subsequently, gate electrodes are processed with the patterned cap insulating film 8 used as an etching mask. According to this method, no photoresist exists during processing of the gate electrodes, and it is therefore possible to eliminate reaction products created between the photoresist film and a gas generated from the photoresist film or a gas such as a chlorine gas in a processing gas, so that processing can be achieved with high controllability.

Also, in the present embodiment, the photoresist patterns for forming the gate electrode 7g1 of the memory cell selection MISFET Qs of the DRAM, and the gate electrodes 7g2 and 7*g* of the nMIS Qn and pMIS Qp forming the peripheral circuit of the DRAM are transferred to a photoresist film with use of one same photo-mask. However, the photo resist patterns may be transferred respectively with use of different photoresist patterns.

That is, at first, a cap insulating film made of a silicon nitride film or the like is coated on a conductive film for forming gate electrodes, like in the manner as described above, and thereafter, a photoresist film is applied thereon. Subsequently, the gate electrode portion of the memory selection MISFET of the DRAM is exposed with use of a first photo-mask. At this time, exposure processing is carried out under exposure conditions optimal for forming gate electrodes of the memory cell selection MISFET. In addition, the first photo-mask is formed so as not to expose the formation regions of the nMIS Qn and pMIS Qp. Subsequently, the gate electrode portions of the nMIS Qn and PMIS Qp are exposed with use of a second photo-mask different from the first photo-mask. At this time, exposure processing is carried out under exposure conditions optimal for forming gate electrodes of the nMIS Qn and pMIS Qp. In addition, the second photo-mask is arranged such that the formation region of the memory cell selection MISFET is not exposed. Thereafter, the cap insulating film 8 is processed by the photoresist pattern formed by the first and second photo-masks. Further, the photoresist pattern is removed, and thereafter, the gate electrodes of the memory cell selection MISFET Qs, nMIS Qn, and pMIS Qp are processed with the processed cap insulating film 8 used as an etching mask.

Figure 16:
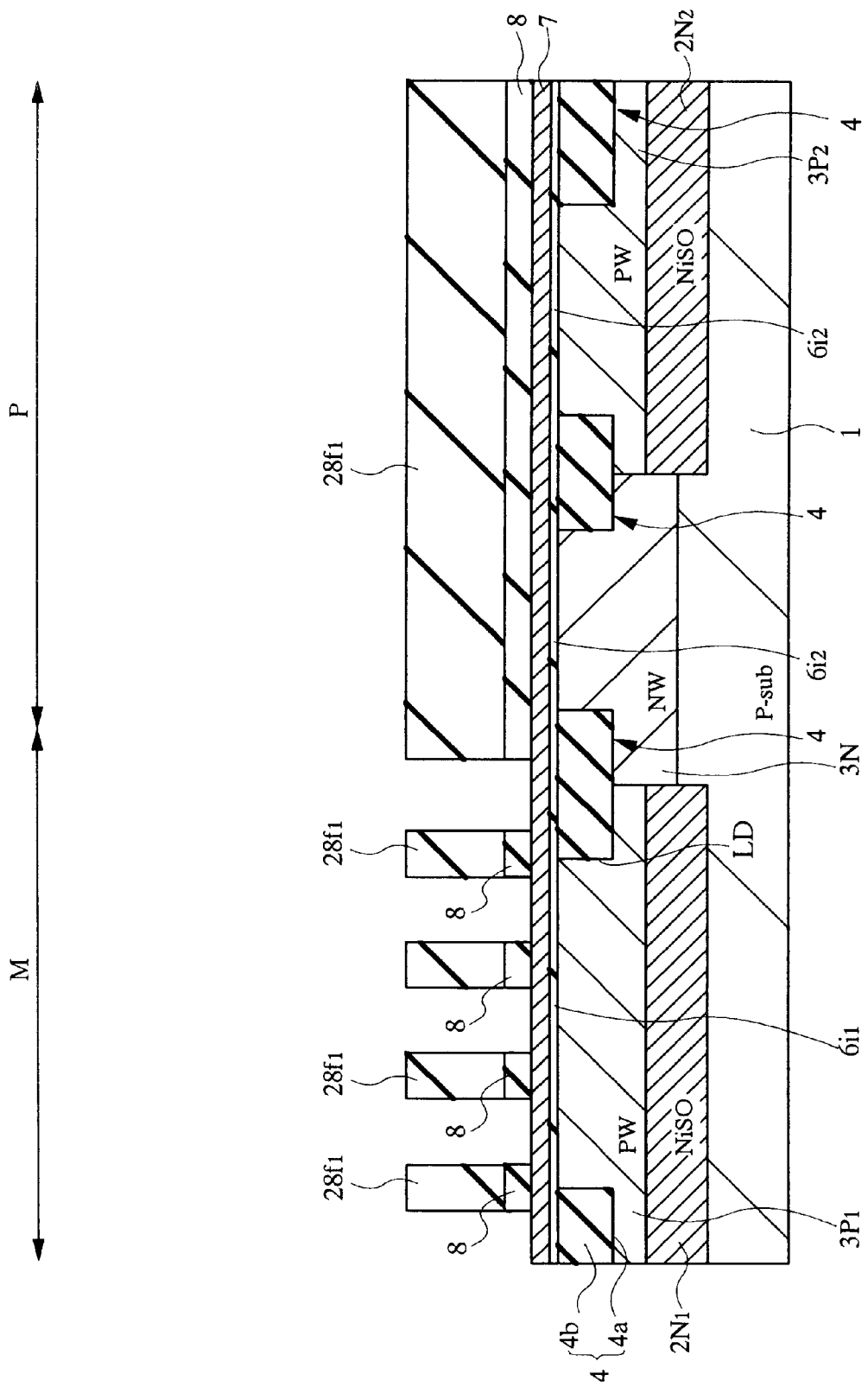
FIG. 16 is a cross-sectional view showing a main portion of the semiconductor integrated circuit device shown in FIG. 1 in a manufacturing step, for explaining a modification example of the manufacturing steps thereof.
Figure 17:
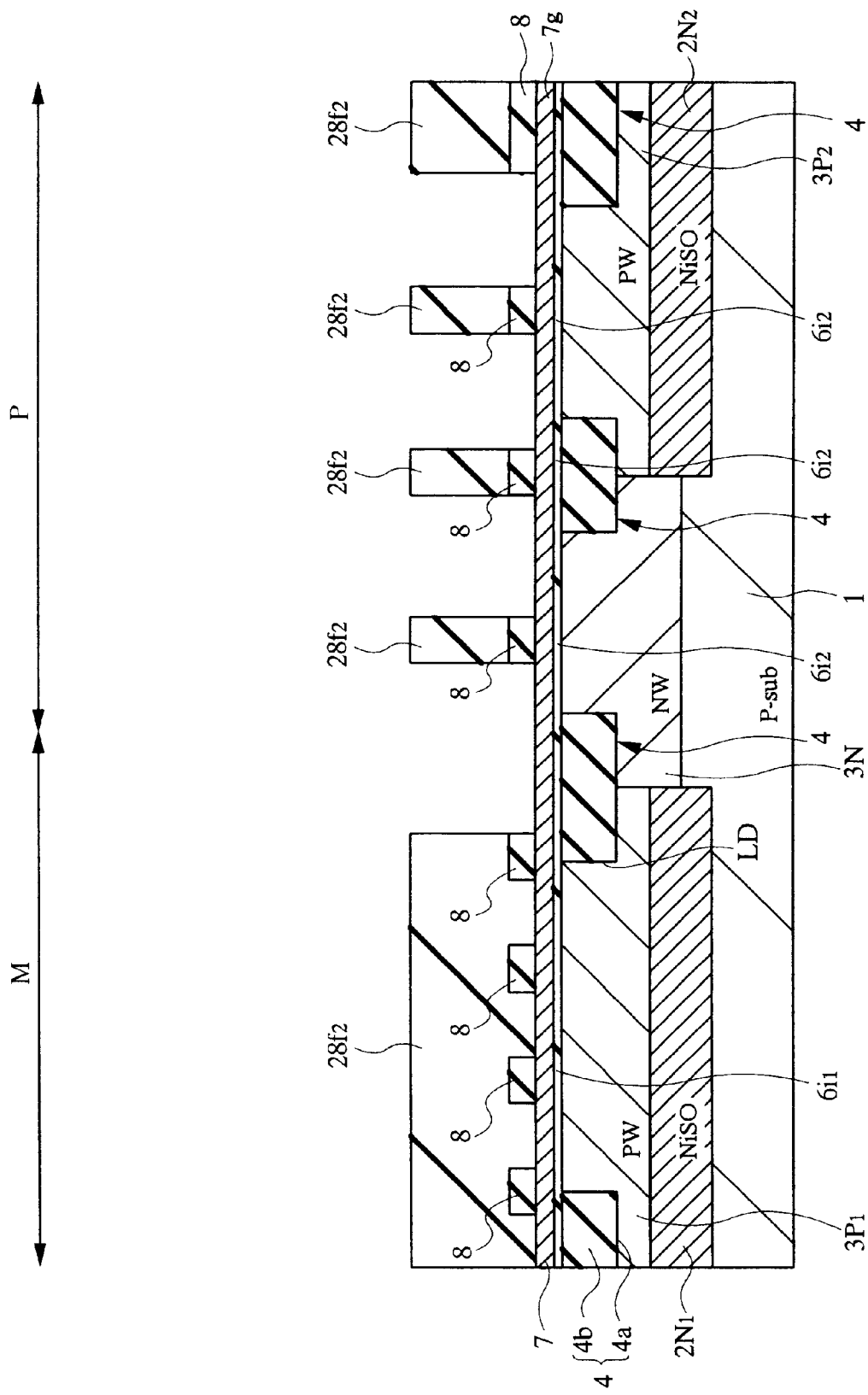
FIG. 17 is a cross-sectional view showing a main portion of the semiconductor integrated circuit device shown in FIG. 1 in a manufacturing step subsequent to the step of FIG. 16.
Figure 18:
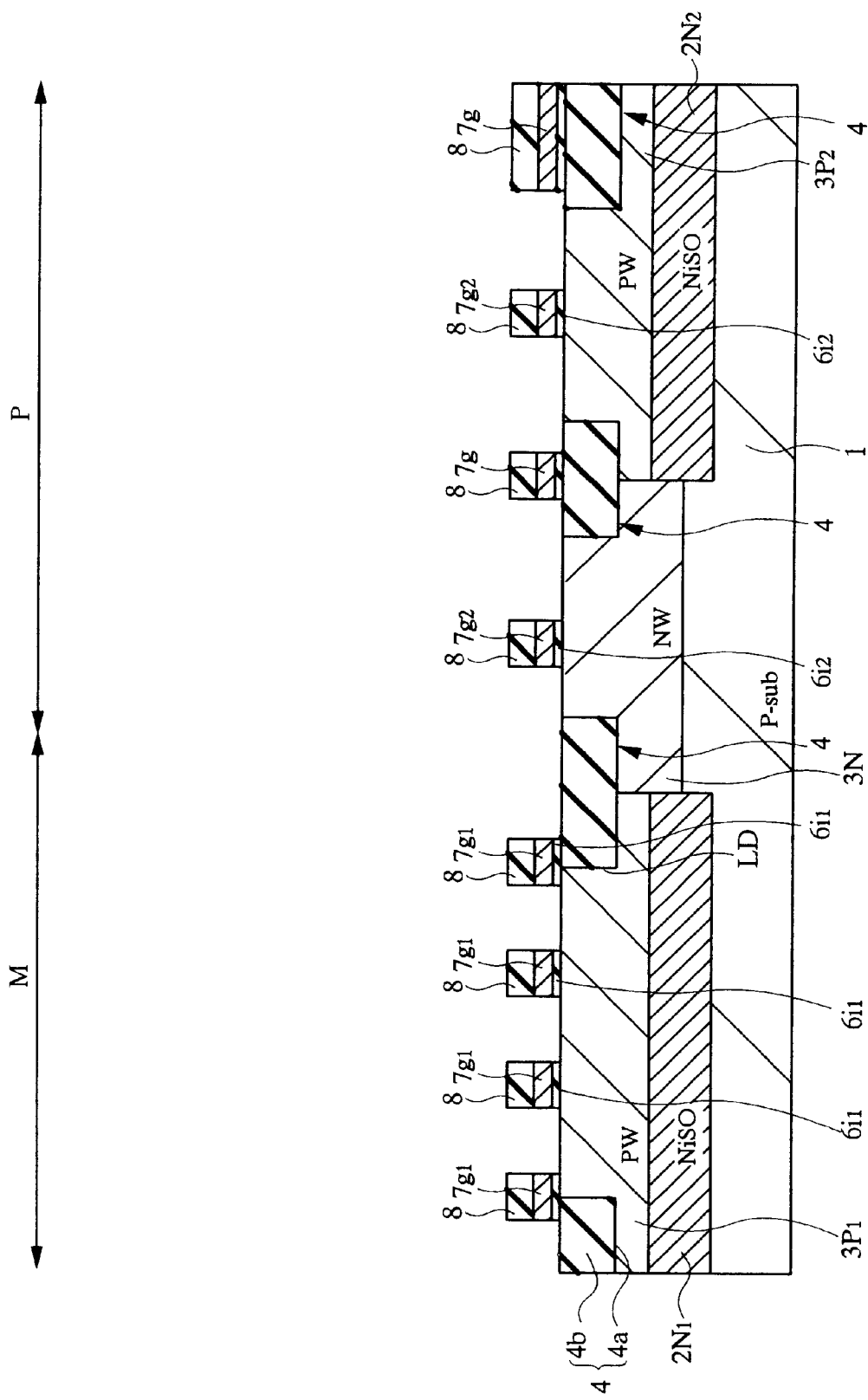
FIG. 18 is a cross-sectional view showing a main portion of the semiconductor integrated circuit device shown in FIG. 1 in a manufacturing step subsequent to the step of FIG. 17.

Alternatively, the following manner can be employed. At first, as shown in FIG. 16, a conductive film 7 for forming gate electrodes and a cap insulating film 8 made of a silicon nitride film or the like are formed on the gate insulating films 6i1 and 6i2, and thereafter, the gate electrode portion of the memory cell selection MISFET of the DRAM is exposed with use of a first photo-mask thereby to form a photoresist pattern 28f1, like in the case described above. With this pattern used as a mask, a cap insulating film 8 is subjected to patterning. Subsequently, the photoresist pattern 28f1 is removed, and thereafter, a new photoresist film is applied. Thereafter, with respect to the photoresist film newly applied, gate electrode portions of nMIS and pMIS are exposed with use of a second photo-mask different from the first photo-mask, like in the case described above, thereby to form a photoresist pattern 28f2. Thereafter, the cap insulating film 8 is subjected to patterning with this pattern used as a mask. Subsequently, the photoresist pattern 28f2 is removed, and thereafter, the gate electrodes 7g1, 7g2, and 7*g* of the memory cell selection MISFET and the nMIS and pMIS are processed with the cap insulating film 8 used as an etching mask, as shown in FIG. 18.

This is because the following problem has been found by the present inventor as a result of study. That is, the optimum exposure conditions for the memory cell region and the peripheral circuit region (or for the memory cell region and the logic circuit region) differ from each other depending on the dimensional conditions including the line widths and the line intervals. Therefore, when the memory cell region and the peripheral circuit region are transferred with the gate electrode patterns by using the same photo-mask, exposure processing must be carried out under exposure condition reasonable for both regions. Besides, in the patterning of extremely downsized elements and wires, sufficient pattern transfer precision cannot be obtained in some cases. In contrast, according to the present embodiment, different photo-masks are used respectively for the memory cell region and the peripheral circuit region as described above, and exposure processing is performed under exposure conditions which are respectively optimized for the regions, so that fine patterns can be transferred to respective regions with high precision. Therefore, Scale down of elements and wires can be realized and the reliability and performance of the elements can be improved.

The above fact applies to the case of using a phase shift technique as an exposure technique. In this case, however, there is another problem as follows but this problem can be solved by the present embodiment. At present, a DRAM of 64 Mbit or higher normally uses a phase shift method to reduce the processing pitch (equivalent to the sum of the line width and the interval) of gate electrodes so that the integration of the memory cell selection MISFET Qs of the DRAM is improved. The phase shift method is an exposure technique capable of improving the transfer precision of a fine pattern by operating the phase of light which has been transmitted through a photo-mask. This phase shift method is effective for patterns having regularity, such as gate electrodes of a memory cell selection MISFET Qs (i.e., word lines WL shown in FIG. 1). However, if this method is employed for forming the nMIS Qn and p MIS Qp at a time which have random patterns, it is difficult to form fine patterns. In contrast, according to the present embodiment, the phase shift method is used for the memory cell region M, for example, and normal exposure processing is performed for the peripheral circuit region where the nMIS Qn and pMIS Qp are formed. In this manner, it is possible to compensate for drawbacks of both methods.

Subsequently, the photoresist pattern 28*f* is removed, and thereafter, a silicon oxide film is formed at a thickness of 3 to 10 nm by a thermal oxidization method, for example, to protect the gate insulating film at end portions of the gate electrodes 7g1, 7g2, and 7g which have been damaged by the processing of these electrodes. In case of a polycide gate structure, this processing is carried out in an $O_2$ atmosphere, for example. In case of a poly-metal gate structure, the processing is carried out in a mixed atmosphere of $H_2+H_2O$.

Figure 19:
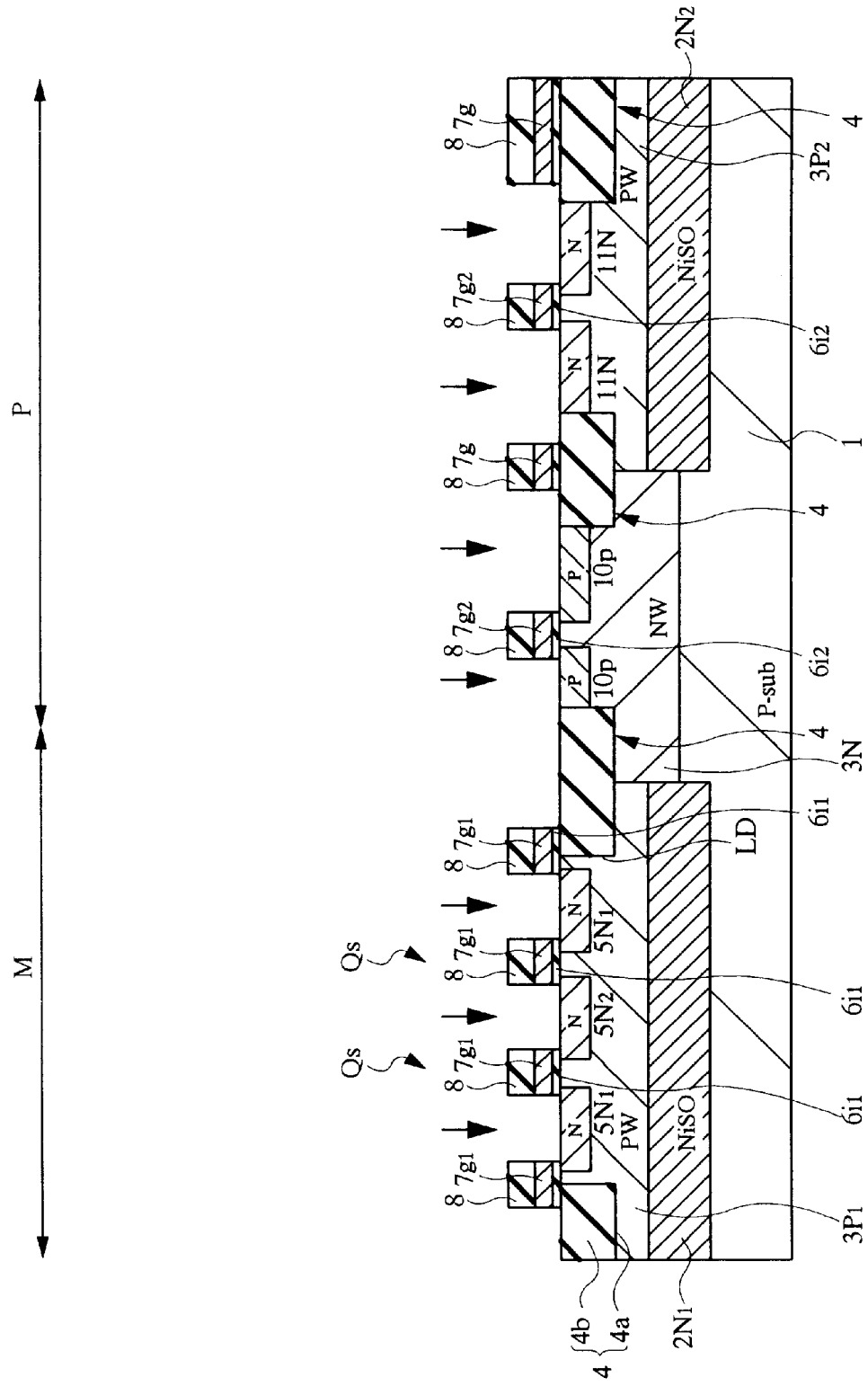
FIG. 19 is a cross-sectional view showing a main portion of the semiconductor integrated circuit device shown in FIG. 1 in a manufacturing step subsequent to the step of FIG. 15.

Subsequently, as shown in FIG. 19, to form semiconductor regions 5N1 and 5N2 which form the source and drain of the MISFET Qs, phosphorus is implanted into the semiconductor substrate 1 by an ion-implantation method, for example, at a doze amount of 1 to $3\times10^{13}/cm^2$. The introduced amount of impurities for forming the source and drain (which are low concentration) of the memory cell selection MISFET Qs is smaller than the introduced amount of impurities for forming the source and drain of nMIS and pMIS, which will be described later on, and can therefore be cancelled. Therefore, the impurities for forming the source and drain (which are low concentration regions) of the memory cell selection MISFET Qs are introduced to the entire surface of the semiconductor substrate 1 under a condition that such a photoresist pattern which covers the nMIS formation region and pMIS formation region is not formed. Phosphorus is employed as impurities for forming the source and drain of the memory cell selection MISFET Qs because it is desired to avoid deterioration in the refresh characteristic. That is, if the junction withstand voltage between the semiconductor substrate 1 and the semiconductor regions 5N1 and 5N2 for the source and drain of the memory cell selection MISFET Qs is decreased, then the leakage current becomes increased, leading to deterioration in the refresh characteristic.

Figure 20:
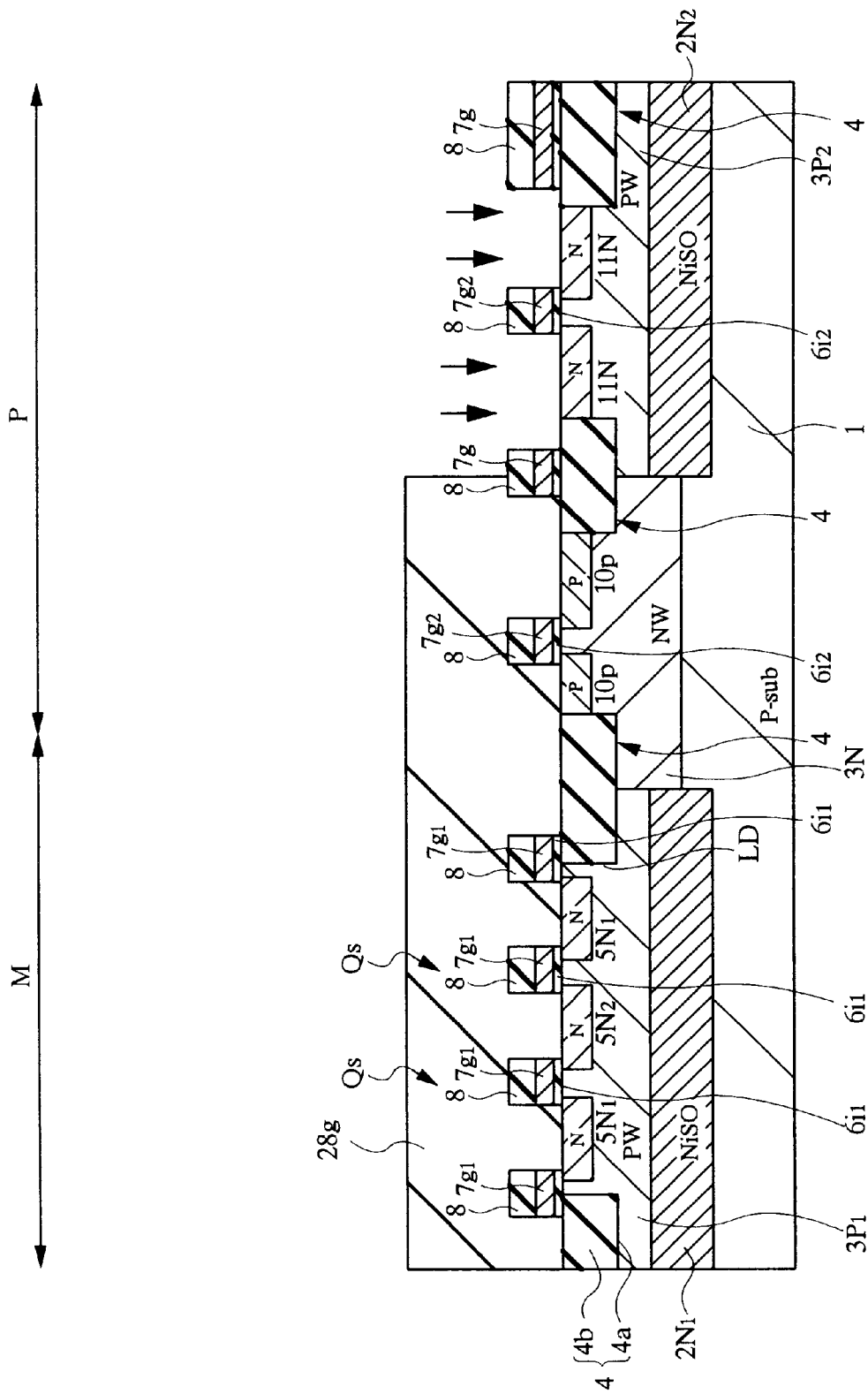
FIG. 20 is a cross-sectional view showing a main portion of the semiconductor integrated circuit device shown in FIG. 1 in a manufacturing step subsequent to the step of FIG. 19.
Figure 21:
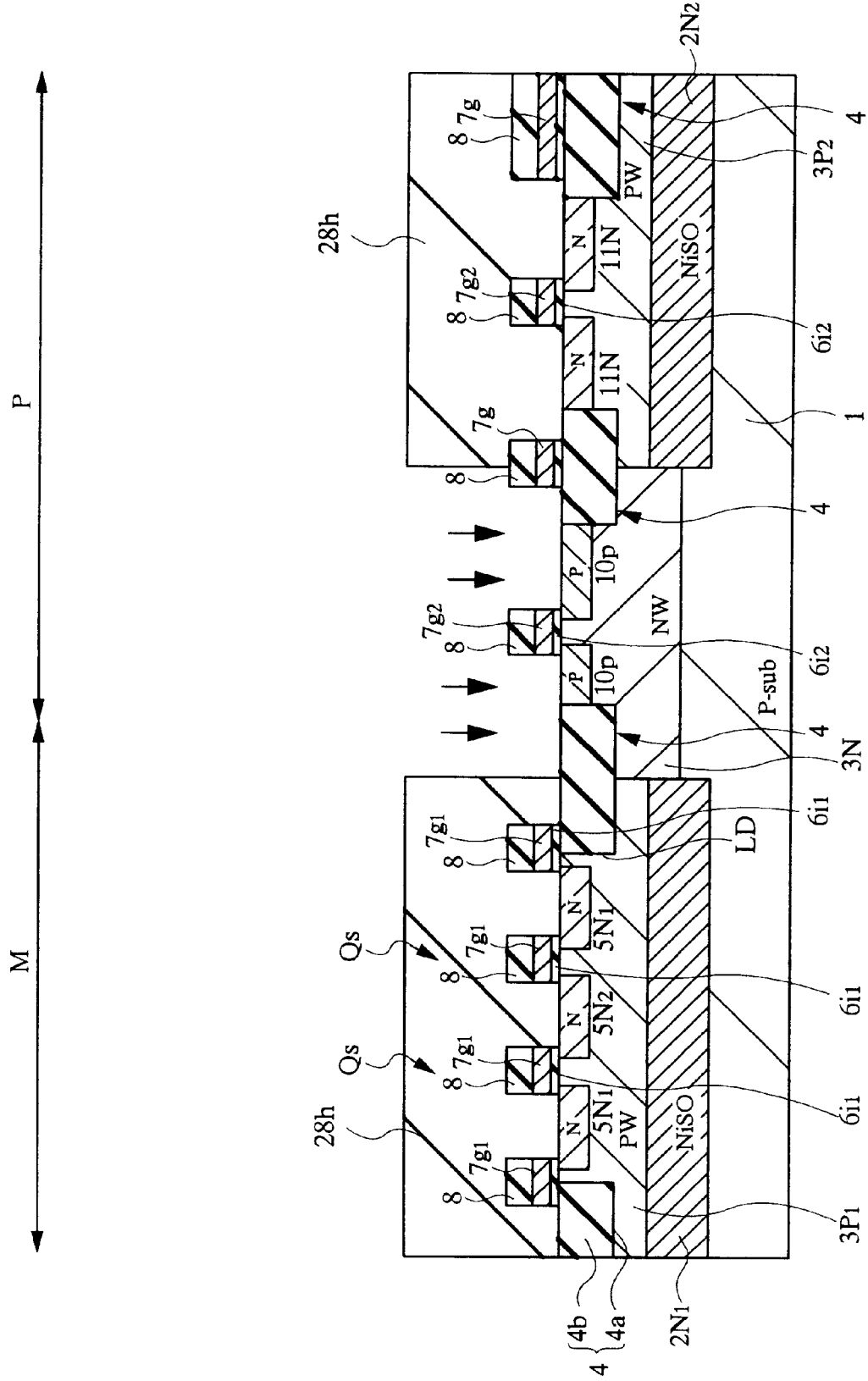
FIG. 21 is a cross-sectional view showing a main portion of the semiconductor integrated circuit device shown in FIG. 1 in a manufacturing step subsequent to the step of FIG. 20.

Next, as shown in FIG. 20, a photoresist pattern 28g which covers the memory cell region M and pMIS formation region and exposes the nMIS formation region is formed, and for example, arsenic is thereafter ion-implanted at a doze amount of about $1\times10^{14}$ to $5\times10^{14}/cm^2$ to form low concentration regions in the semiconductor regions for the source and drain of the nMIS with the pattern used as a mask. Subsequently, impurities for a punch-through stopper are implanted by an ion implantation method with the photoresist pattern 28g unremoved. In this case, for example, boron is implanted at a doze amount of about $1\times10^{14}/cm^2$ or less. Although the memory cell selection MISFET is a nMIS, this MISFET is covered by the photoresist pattern 28g so that arsenic for forming the above-mentioned low concentration regions might not be implanted. Arsenic for forming low concentration regions and boron for a punch-through stopper are implanted into the semiconductor regions 5N1 and 5N2 of the source and drain of the memory cell MISFET, because if the junction withstand voltage between the semiconductor substrate 1 and the semiconductor regions 5N1 and 5N2 for the source and drain of the memory cell selection MISFET is decreased, then the leakage current will be increased, leading to deterioration in the refresh characteristic. To form the low-concentration regions and the punch-through stopper region, the impurity ion may be implanted in a direction oblique to the major surface of the semiconductor substrate, e.g., at an ion-implantation angle of about 30 degrees.

Next, the photoresist pattern 28g is removed, and thereafter, a photoresist pattern 28h which covers the memory cell region M and nMIS formation region and exposes the pMIS formation region is formed. Subsequently, for example, boron is ion-implanted at a doze amount of about $1\times10^{14}$ to $5\times10^{14}/cm^2$ to form low concentration regions in the semiconductor regions for the source and drain of the pMIS, with the pattern 28h used as a mask.

Thereafter, impurities for a punch-through stopper are implanted by an ion implantation method with the photoresist pattern 28h unremoved. In this case, for example, phosphorus or arsenic is implanted at a doze amount of about $1\times10^{14}/cm^2$ or less. To form the low concentration regions and the punch-through stopper region in the pMIS, the impurity ion may also be implanted in a direction oblique to the major surface of the semiconductor substrate, e.g., at an ion-implantation angle of about 30 degrees.

Figure 22:
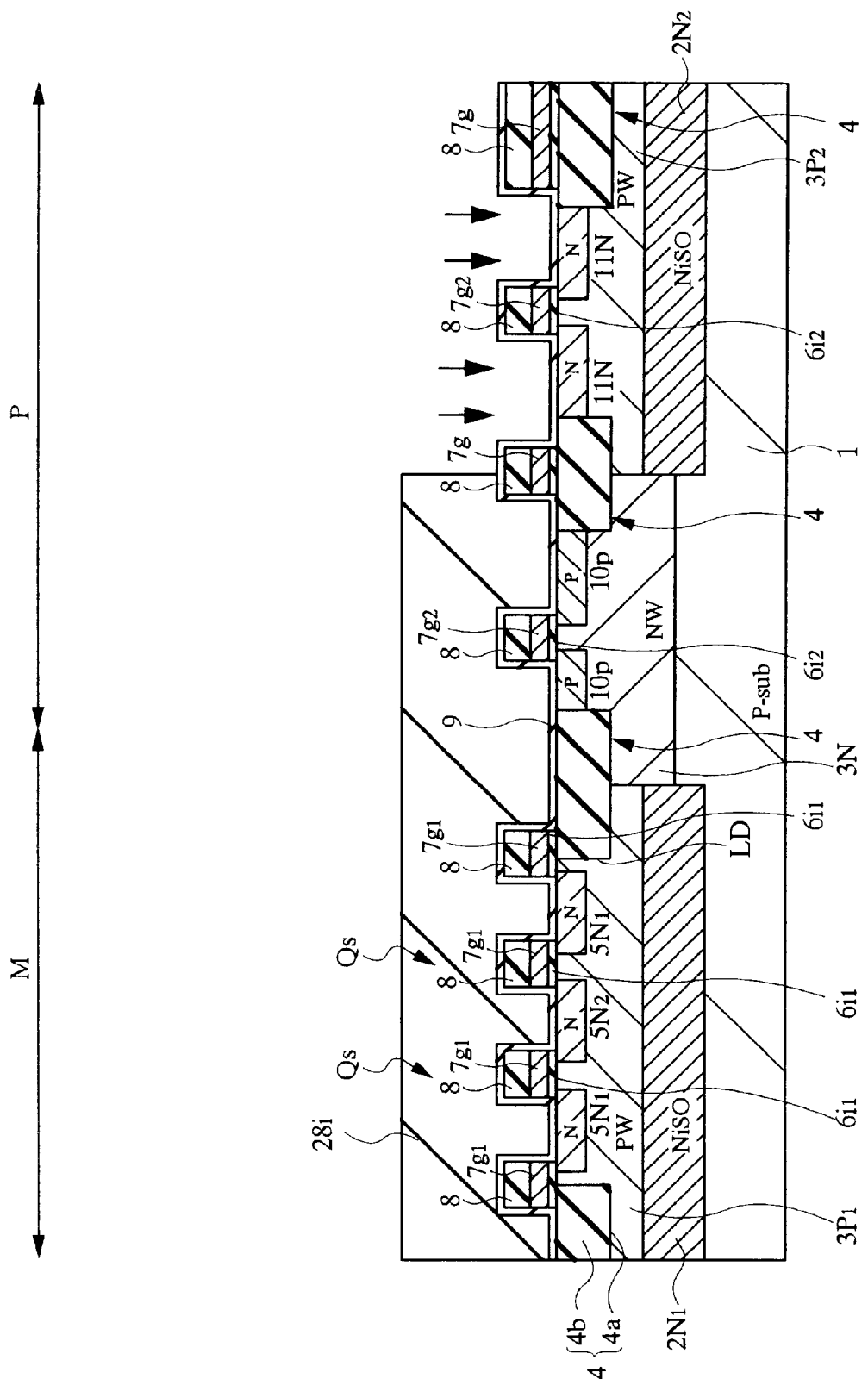
FIG. 22 is a cross-sectional view showing a main portion of the semiconductor integrated circuit device shown in FIG. 1 in a manufacturing step subsequent to the step of FIG. 21.

Subsequently, the photoresist pattern 26h is removed, a thermal treatment is performed on the semiconductor substrate 1 to activate the impurities of the low-concentration regions of the nMIS and pMIS. This activation is carried out, for example, by RTA (Rapid Thermal Annealing) at 950 to 1050° C. for several seconds to several minutes. Subsequently, as shown in FIG. 22, an insulating film 9 made of, for example, a thin silicon nitride film having a thickness of about 50 nm is deposited on the major surface of the semiconductor substrate 1 such that the insulating film 9 reflects steps of the underlaying layers. In this manner, the major surface of the semiconductor substrate 1, the side surfaces of the gate electrodes 7g1, 7g2, and 7g, the surface of the cap insulating film 8, and the upper surface of the isolation portion 4 are covered. In case of a dual gate electrode, deposition is carried out by a CVD method at a temperature of 700° C. or less, so that boron is prevented from being accelerated and diffused, since the silicon nitride film promotes acceleration and diffusion of boron due to existence of hydrogen. This insulating film 9 has the following functions, for example. Firstly, the film 9 functions as a mask when the low-concentration regions are formed. That is, the plan width of the low-concentration region is set by the thickness of the insulating film 9 provided on the side surfaces of the gate electrodes 7g1, 7g2, and 7g. Secondly, the film 9 is used for forming contact holes for bit lines described later and peripheral contact holes by SAC (Self-Align CONT) with respect to the gate electrodes 7g1, 7g2, and 7g and the isolation portion 4.

Figure 23:
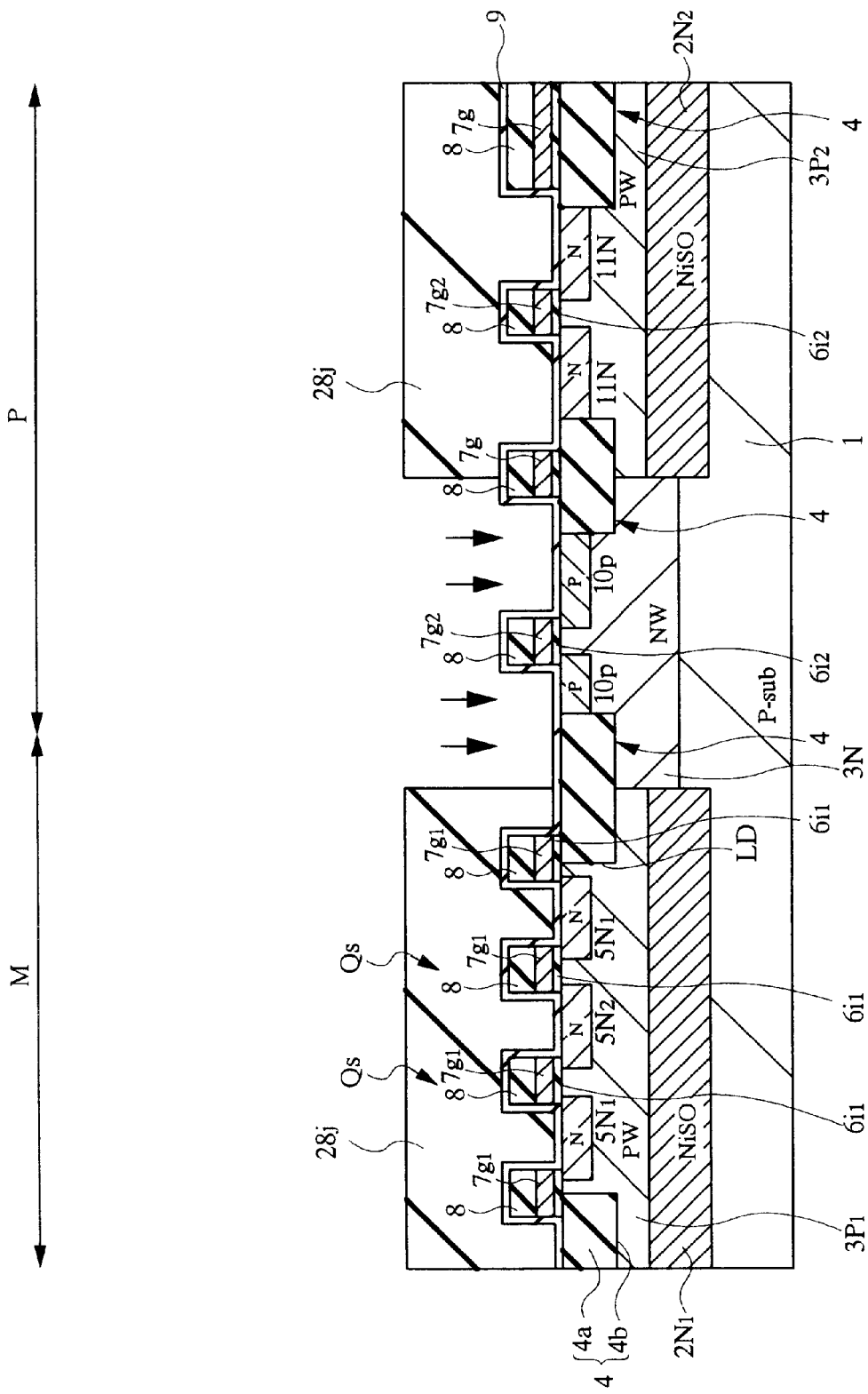
FIG. 23 is a cross-sectional view showing a main portion of the semiconductor integrated circuit device shown in FIG. 1 in a manufacturing step subsequent to the step of FIG. 22.

Next, a photoresist pattern 28I which exposes the nMIS formation region and covers the memory cell region M and pMIS formation region is formed on the insulating film 9. Thereafter, for example, arsenic is ion-implanted into the semiconductor substrate at a doze amount of about $1\times10^{15}$ to $5\times10^{15}/cm^2$ through the insulating film 9 with the pattern used as a mask, to form high concentration regions for the source and drain of the nMIS. Subsequently, the photoresist pattern 28I is removed, and thereafter, as shown in FIG. 23, a photoresist pattern 28j which exposes the pMIS formation region and covers the memory cell region M and the nMIS formation region is formed. Thereafter, for example, boron is ion-implanted into the semiconductor substrate at a doze amount of about $1\times10^{15}$ to $5\times10^{15}/cm^2$ through the insulating film 9 with the pattern 28j used as a mask, to form high concentration regions for the source and drain of the pMIS. After the photoresist pattern 28j is then removed, impurities in the high-concentration regions of the nMIS and pMIS described above is activated by a thermal treatment. This activation is carried out, for example, by RTA (Rapid Thermal Annealing) at 950 to 1050° C. for several seconds to several minutes. The nMIS Qn and PMIS Qp are thus formed.

Although impurities for forming high-concentration regions are implanted through an insulating film 9 in the present embodiment, the impurities may be injected in the following method. At first, the insulating film 9 is etched by anisotropic etching with photoresist patterns 28I and 28j used as masks, respectively, to form side walls made of a silicon nitride film or the like on the side surfaces of the gate electrodes 7g1, 7g2, and 7g of the nMIS and pMIS. At this time, the insulating film 9 is removed on those portions of the major surface of the semiconductor substrate 1 in the nMIS and pMIS formation regions, which are not covered by the photoresist patterns 28i and 28j. Subsequently, impurities are ion-implanted into the nMIS and pMIS formation regions, as described above. As a second example, the insulating film 9 is deposited at first, and thereafter, the insulating film 9 is etched by anisotropic etching, to form side walls made of a silicon nitride film only on the side surfaces of the gate electrodes 7g1, 7g2, and 7g. Subsequently, impurities are ion-implanted with the photoresist patterns 28i and 28j used as masks, respectively. As a third example, after the step of implanting impurity ion in the first and second examples, there is provided a step of newly coating a thin insulating film made of a silicon nitride on the semiconductor substrate by a CVD method or the like, so that the thin film reflects the steps of underlaying layers.

Also, to form a silicide layer on the surfaces of a pair of semiconductor regions 10P and 11N for the source-drain of the pMIS Qp and nMIS Qn in the peripheral circuit region, the following manner is adopted for example. At first, in case of the first example described above, metal for silicide (e.g., titanium or cobalt) is deposited after completion of RTA, and a fist thermal treatment is carried out at about 500° C. or less to form a silicide layer. Subsequently, unreacted metal for silicide is removed. Further, RTA is carried out, for example, at about 700° C. to 900° C. to lower the resistance of the silicide layer. Thereafter, an insulating film made of a silicon nitride film for SAC is newly deposited. In the case of the second example, if the silicide layer is formed on the surface of the semiconductor region which is connected to the capacitor (lower electrode) of the memory cell selection MISFET Qs the leakage current is increased and the refresh characteristic is deteriorated. Therefore, in order to avoid such deterioration, when the insulating film for SAC is etched back by anisotropic etching to form side walls at least a mask for covering the semiconductor region of the memory cell selection MISFET Qs which is connected to the capacitor (lower electrode) is added so that the insulating film for SAC (Self Aligned Control) remains in the region. Further, the silicide layer and the insulating film for SAC are formed like in the case of forming the silicide layer in the first example. In case of the present embodiment (in the case where the insulating film for SAC is not etched back but remains), the silicide layer may be formed like in the manner described above in a condition that at least a mask for covering the semiconductor region of the memory cell selection MISFET Qs which is connected to the capacitor (lower electrode) is added so that the insulating film for SAC remains, like in the case of forming the silicide layer in the second example, and further, an insulating film for SAC may be deposited.

Figure 24:
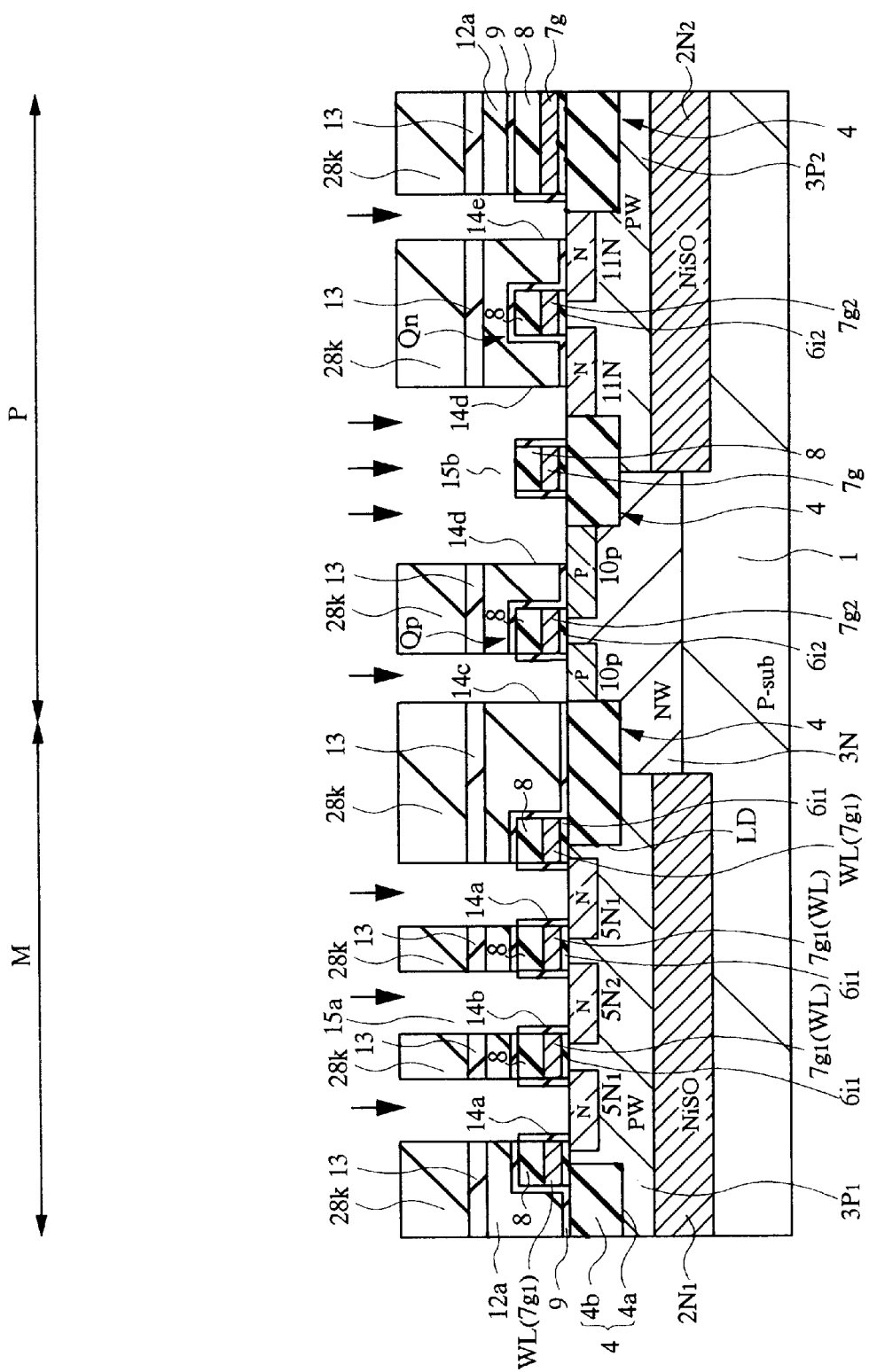
FIG. 24 is a cross-sectional view showing a main portion of the semiconductor integrated circuit device shown in FIG. 1 in a manufacturing step subsequent to the step of FIG. 23.

Subsequently, as shown in FIG. 24, an interlayer insulating film 12a made of a silicon oxide film or the like is deposited on the insulating film 9. This interlayer insulating film 12a is formed by forming a layer film and by thereafter flattening the upper surface of the interlayer by CMP. The layered film consists of a silicon oxide film based on a CVD method or plasma CVD method or a silicon oxide film based on a coating method (SOG: Spin On Glass), and a silicon oxide formed thereon by a CVD method or a plasma CVD method. At this time, it is preferable that the end point of the CMP is set at the silicon nitride film on the gate electrodes 7g1, 7g2, and 7g and a PSG (Phospho Silicate Glass) film is newly deposited thereon. That is, variances of the film thickness caused by the CMP processing can be prevented, by using the silicon nitride film on the gate electrodes 7g1, 7g2, and 7g for detecting the end point of the CMP. In addition, it is possible to prevent the height of bit lines from being increased meaninglessly. The PSG film functions as a getter layer against entering pollution and also functions to decide the thickness of the bit lines with high controllability.

Next, an insulating film 13 made of a silicon nitride film or the like is formed on the interlayer insulating film 12a, and thereafter, a photoresist pattern 28k which exposes semiconductor regions 5N1, 5N2, and 10P, a part of 11N, a wiring groove formation region, and a local wiring formation region and covers the other regions is formed thereon. Subsequently, those portions of the insulating film 13 and the interlayer insulating film 12a that are exposed from the pattern 28k are sequentially removed with the photoresist pattern 28k used as an etching mask, thereby form contact holes 14a to 14e and wiring grooves 15a and 15b. Thereafter, the photoresist pattern 28k is removed. At this time, the etching processing for removing the interlayer insulating film 12a is comprised of the following two steps. In the first step thereof, an etching condition is arranged such that the selectivity on the silicon oxide film and the silicon nitride is made high so that the etching rate of the silicon oxide film is higher than that of the silicon nitride film, whereby the interlayer insulating film 12a made of a silicon oxide film is etched and removed. At this time, since the insulating film 9 under the interlayer insulating film 12 is made of a silicon nitride film or the like, this film is not removed substantially. That is, the insulating film 9 functions as an etching stopper. In the second step, the portions of the insulating film 9 that are exposed from the contact holes 14a to 14e are etched and removed under a condition that the selectivity concerning the silicon oxide film and the silicon nitride film is made substantially the same as described above and the entire of the silicon nitride film (insulating film 9) is removed (depending on the etching time). In this case, the silicon nitride film on the gate electrodes 7g1, 7g2, and 7g is etched and removed. However, the upper surfaces of the gate electrodes 7g1, 7g2, and 7g can be prevented from being exposed through the etching processing, by setting the thickness of the silicon nitride film on the gate electrodes 7g1, 7g2, and 7g (which is the sum of the film thickness of the cap insulating film 8 and that of the insulating film 9) to be larger than the film thickness of the silicon nitride film on the semiconductor substrate 1 (which is the thickness of the insulating film 9). Accordingly, the gate electrodes 7g1, 7g2, and 7g are not exposed from the wiring grooves 15a and 15b. Note that this etching technique will be hereinafter called a SAC (Self Aligned Contact) technique.

Next, for example, phosphorus is implanted into the semiconductor substrate 1 at a doze amount of about $1 \times 10^{13}$/ cm², with the photoresist pattern 28k, the remaining insulating film 13, and the interlayer insulating film 12a used as masks. This is made to relax the electric field of the semiconductor region 5N1 of the memory cell selection MISFET Qs connected to the lower electrode of the capacitor, thereby to prevent the refresh characteristic from being deteriorated. At this time, although phosphorus is also implanted into other semiconductor regions 5N2, 10P, and 11N, the concentration is so low that no problem occurs. Subsequently, the photoresist pattern 28k is removed. Thereafter, an insulating film is deposited on the entire surface, and this insulating film is further etched back by an anisotropic etching method, thereby to form a new insulating film (preferably based on a CVD method or the like at about 700° C. or less) only on the side surfaces of the wiring grooves 15a and 15b. In this manner, the insulation between the gate electrodes 7g1 and 7g2 and the contact holes for bit lines can be much more improved.

Figure 25:
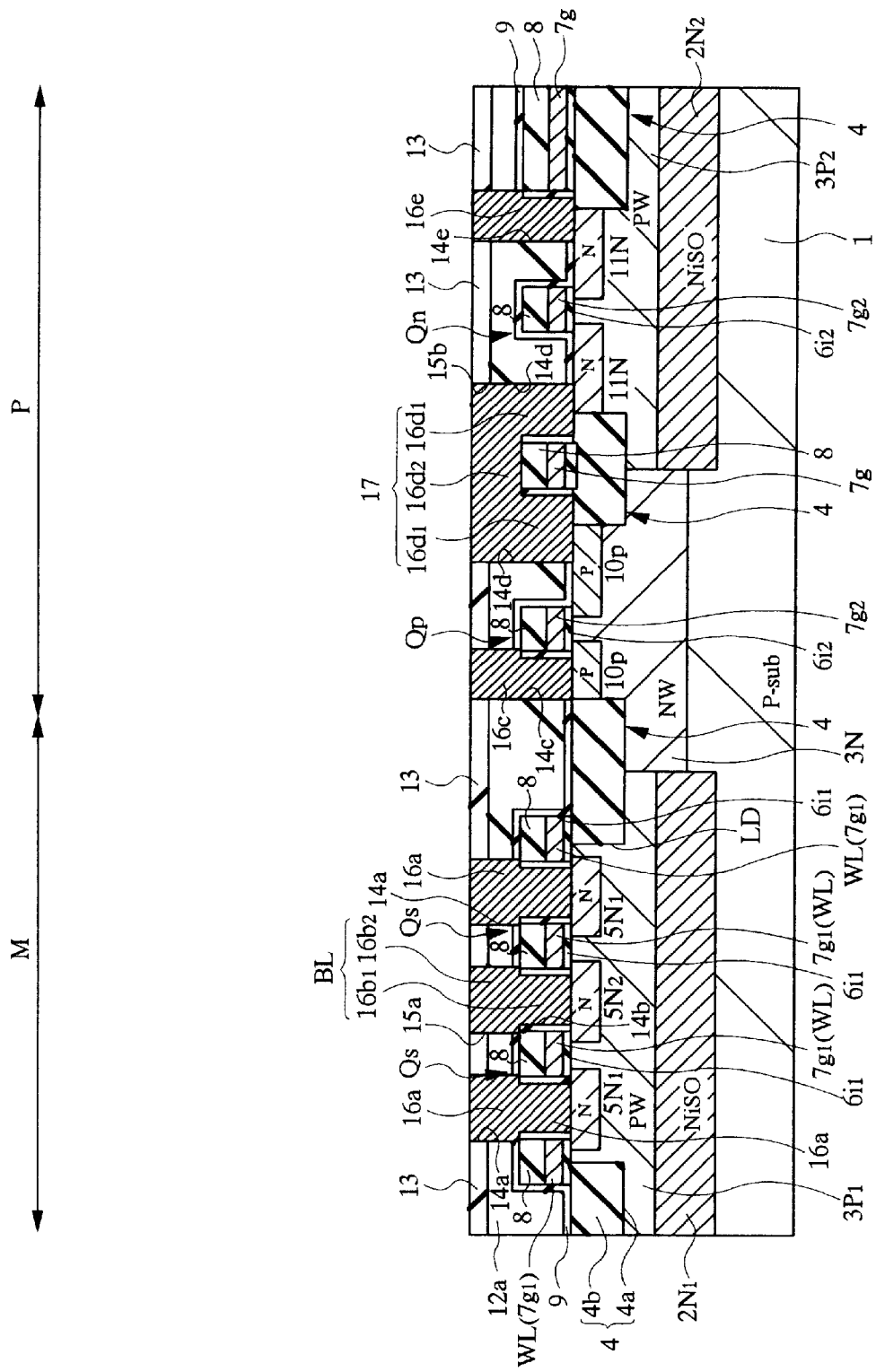
FIG. 25 is a cross-sectional view showing a main portion of the semiconductor integrated circuit device shown in FIG. 1 in a manufacturing step subsequent to the step of FIG. 24.

Next, for example, titanium and titanium nitride are deposited orderly from underside on the semiconductor substrate 1 as described above, by a sputtering method, a CVD method, or the like. Thereafter, a titanium silicide layer is formed between the deposited materials and the semiconductor regions 5N1, 5n2, 10P, and 11N, for example, by RTA at about 600 to 700° C., to reduce the contact resistance. Subsequently, a relatively thick conductive film made of tungsten or the like is coated on the titanium nitride by a CVD method or the like. Thereafter, the conductive film is removed by an etch-back method or CMP method, thereby to form plugs 16A, 16c, and 16e in the contact holes 14a, 14c, and 14e, contact portions 16b1 and 16b2 in the contact hole 14b and the wiring groove 15a, and contact portions 16d1 and 16d2 of the local wire 17 in the contact hole 14d and the wiring groove 15b, as shown in FIG. 25. In the present embodiment, the upper surfaces of the bit lines and local wire 17 substantially correspond to the upper surface of the insulating film 13 and are flattened at this level.

Figure 26:
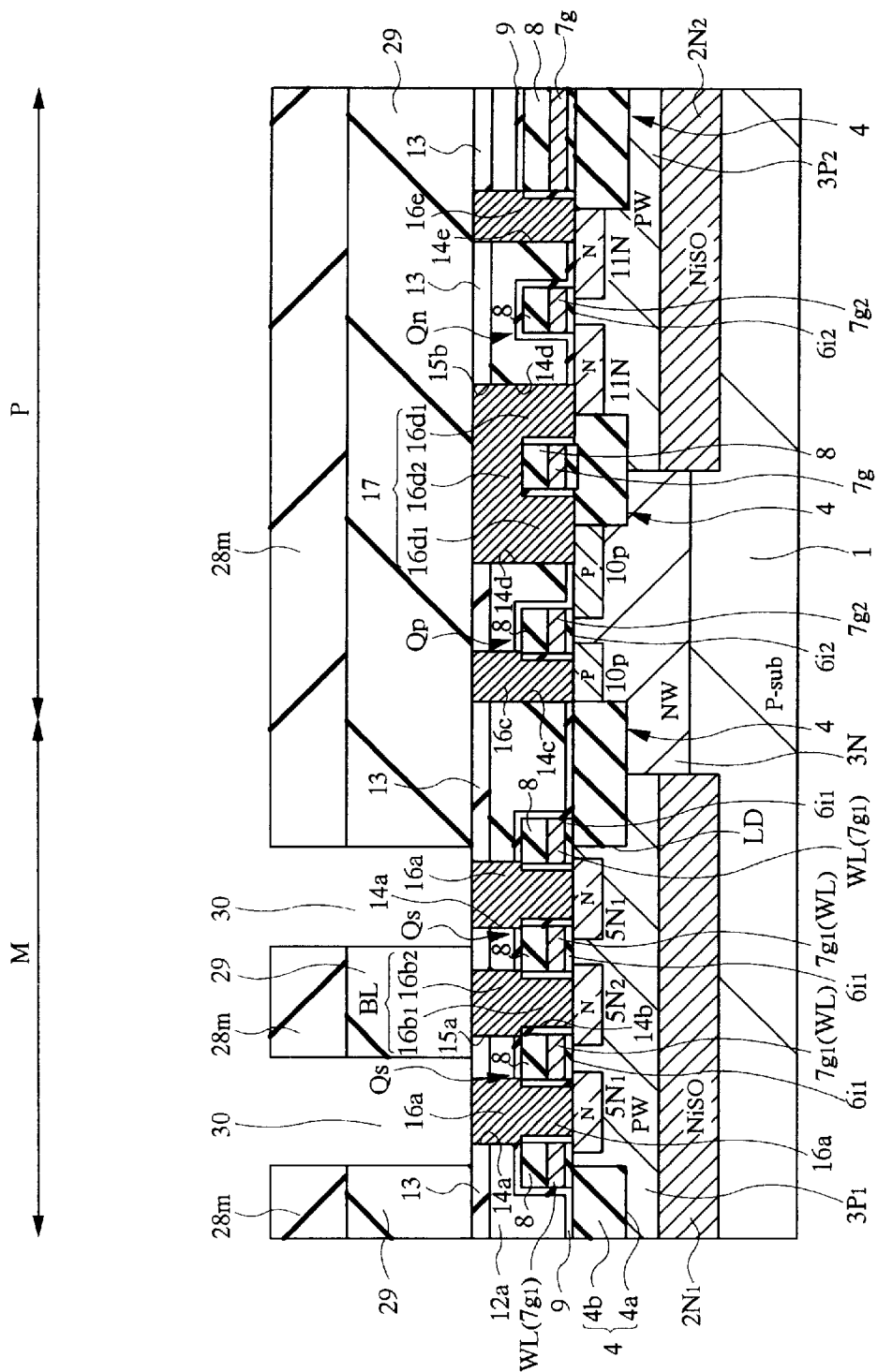
FIG. 26 is a cross-sectional view showing a main portion of the semiconductor integrated circuit device shown in FIG. 1 in a manufacturing step subsequent to the step of FIG. 25.

Next, as shown in FIG. 26, an interlayer insulating film 29, for example, made of a silicon oxide film or the like is formed on the insulating film 13. This insulating film 29 is formed of a layered film consisting of a silicon oxide film based on a CVD method or plasma CVD method or a silicon oxide film based on a coating method (SOG: Spin On Glass), and a silicon oxide formed thereon by a CVD method or a plasma CVD method. Subsequently, a photoresist pattern 28m which exposes the lower electrode formation region of the capacitor and covers the rest is formed on the upper surface of the insulating film 29. Thereafter, with this pattern 28m used as a mask, a capacitor hole 30 for forming the lower electrode of the capacitor is formed in the insulating film 29. In the step of forming the capacitor hole 30, a part of the insulating film 29 made of a silicon oxide film is etched and removed by a SAC technique (under an etching condition that the selectivity of the silicon oxide film and the silicon nitride film is made high), like the step of forming the contact hole 14b of the bit line. The upper surface of the plug 16a is exposed through the bottom portion of the capacitor hole 30.

Figure 27:
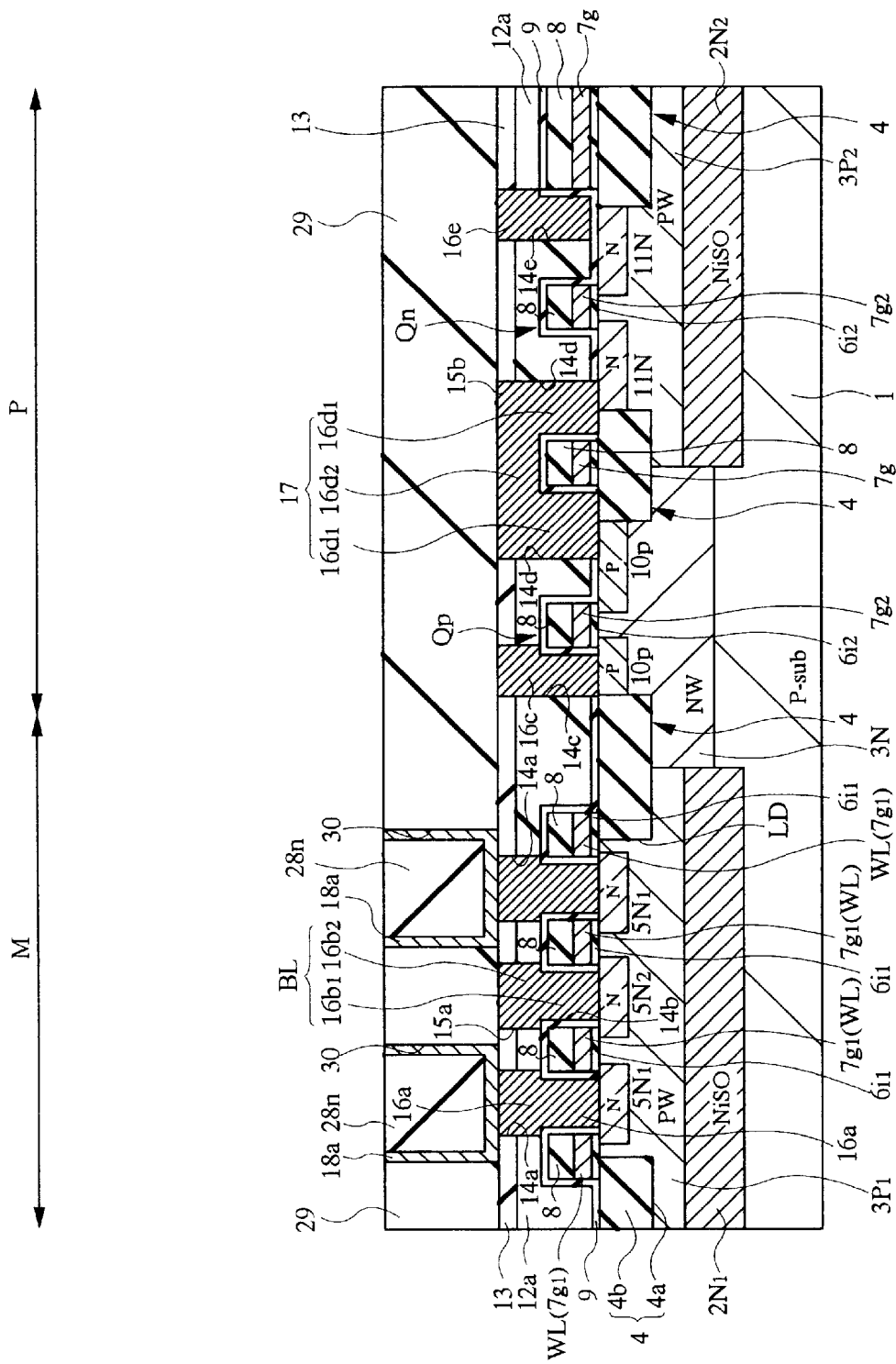
FIG. 27 is a cross-sectional view showing a main portion of the semiconductor integrated circuit device shown in FIG. 1 in a manufacturing step subsequent to the step of FIG. 26.
Figure 28:
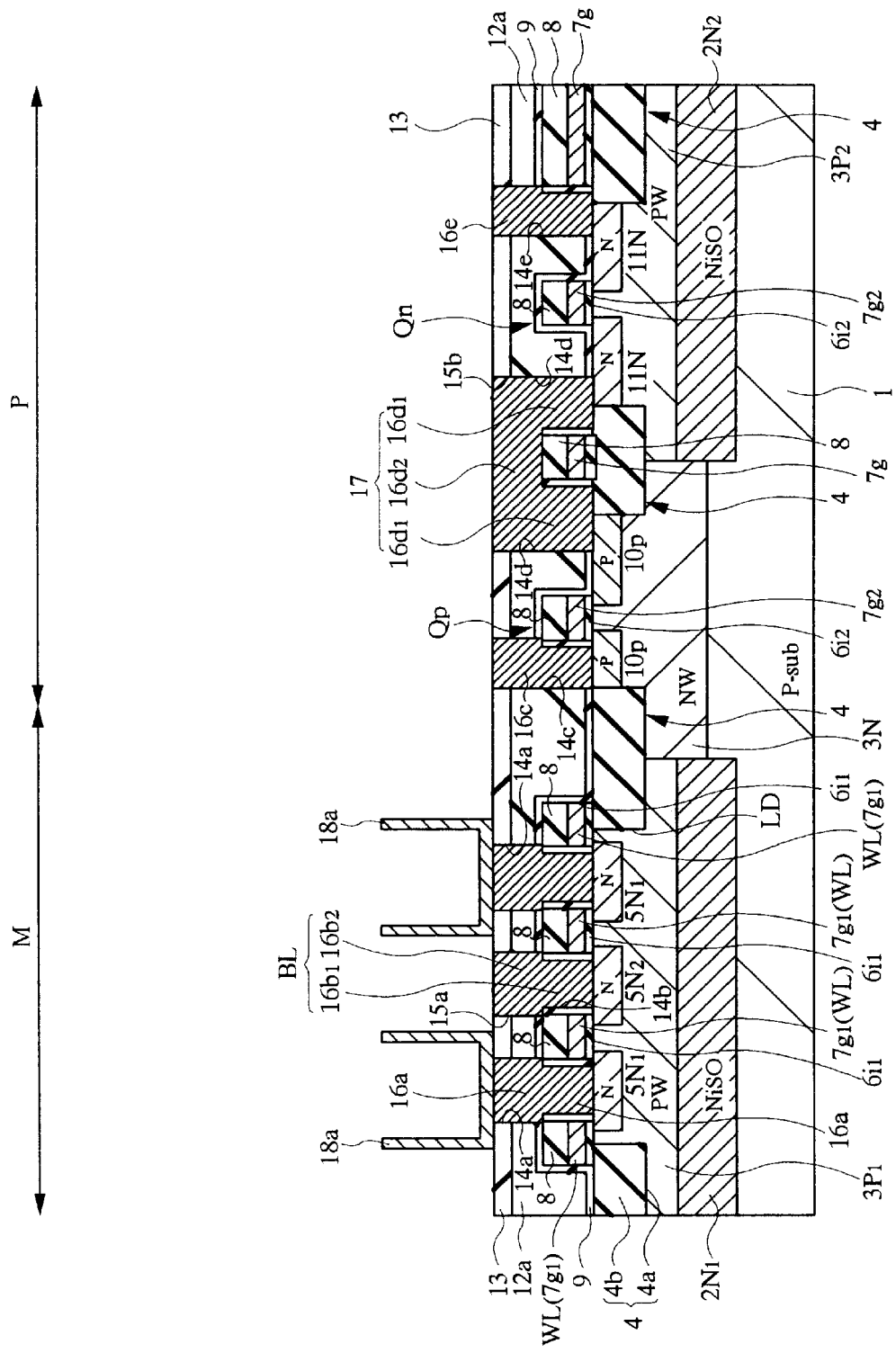
FIG. 28 is a cross-sectional view showing a main portion of the semiconductor integrated circuit device shown in FIG. 1 in a manufacturing step subsequent to the step of FIG. 27.

Next, the photoresist pattern 28m is removed, and thereafter, a conductive film made of, for example, n-type polysilicon is deposited in the insulating film 29 and the capacitor hole 30, by a CVD method. Impurities in this polysilicon are, for example, phosphorus introduced during film formation. Subsequently, a photoresist film is coated thereon and is thereafter etched back such that the photoresist film is left unremoved only in the capacitor hole 30. Thereafter, as shown in FIG. 27, with the remaining photoresist film 28n used as an etching mask, the polysilicon film exposed therefrom is removed thereby to form a lower electrode 18a in the capacitor hole 30. Thereafter, with use of an insulating film 13 made of a silicon nitride film or the like as an etching stopper, the photoresist film 28n and the insulating film 29 are etched and removed by wet etching processing or the like, thereby to form the lower electrode 18a of the capacitor on the insulating film 13, as shown in FIG. 28.

In the present embodiment, the insulating film 29 on all regions on the insulating film 13 is removed (ref. FIG. 27). However, the present embodiment is not limited hitherto but may be modified as follows. That is, a photoresist pattern which exposes the memory cell region M and covers the other regions is formed on the insulating film 29. Thereafter, with this photoresist pattern used as an etching mask, those portions of the insulating film 29 and the photoresist film 28n that are exposed through the mask are removed with use of the insulating film 13 as an etching stopper. That is, the insulating film 29 remains in the peripheral circuit region P. In the following, fabrication is carried out as described above. Although this method requires addition of a new mask, there is an advantage in that flattening of the surfaces required in the later wiring step is facilitated since the insulating film 29 remains in the regions other than the memory cell region of the DRAM.

Figure 29:
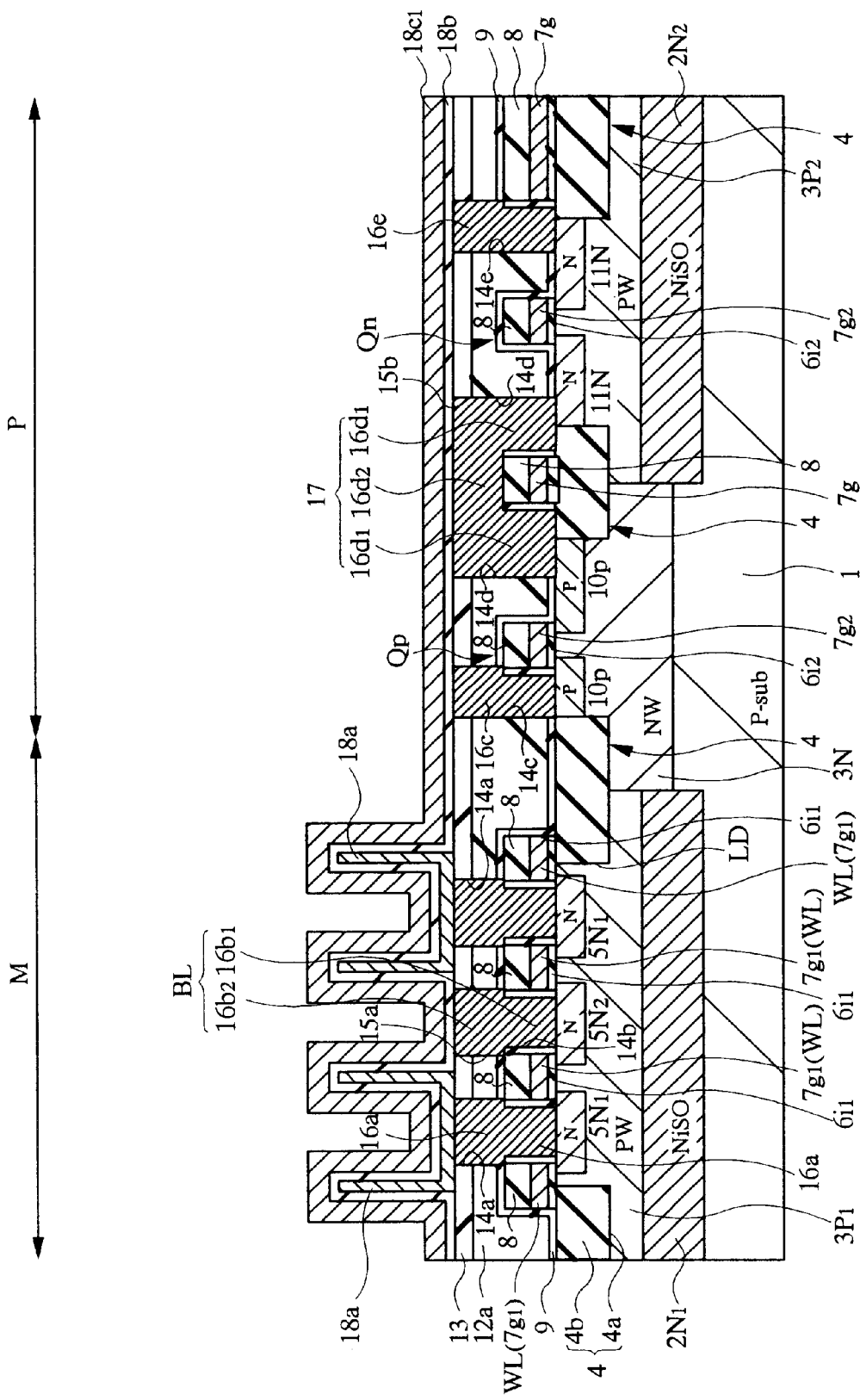
FIG. 29 is a cross-sectional view showing a main portion of the semiconductor integrated circuit device shown in FIG. 1 in a manufacturing step subsequent to the step of FIG. 28.
Figure 30:
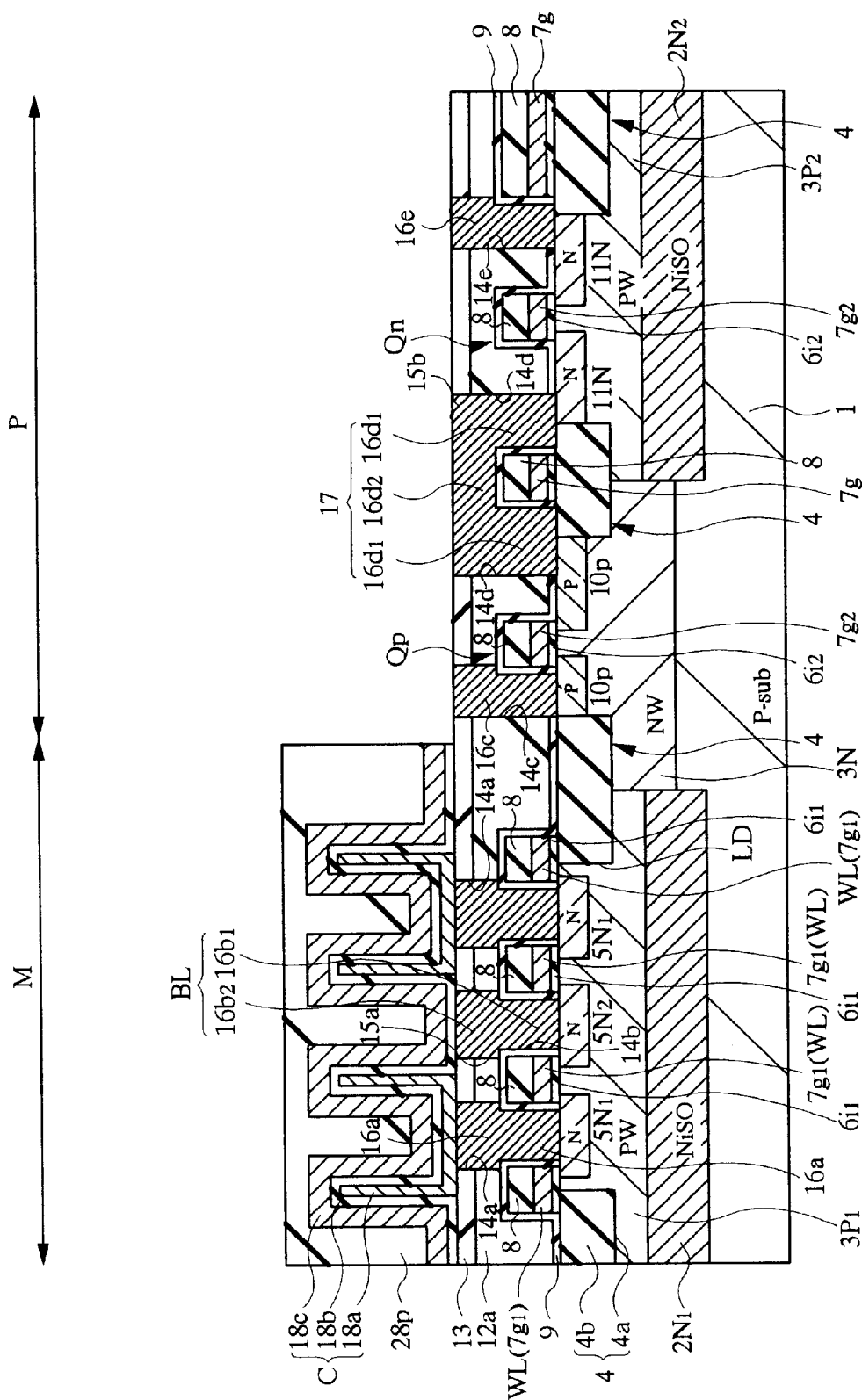
FIG. 30 is a cross-sectional view showing a main portion of the semiconductor integrated circuit device shown in FIG. 1 in a manufacturing step subsequent to the step of FIG. 29.

Next, RTA processing is performed on the semiconductor substrate 1, for example, in an ammonia atmosphere at about 800° C. for several minutes, thereby to form a thin silicon nitride film on the surface of the lower electrode 18a, as shown in FIG. 29. Thereafter, for example, a tantalum oxide film ($Ta_2O_5$) is deposited by a CVD method or the like, and further, RTO (Rapid Thermal Oxide) processing is performed at about 750 to 800° C. for several minutes, thereby to crystallize the tantalum oxide film. With this manner, the film quality becomes stable and leakage current becomes small. Thus, a capacity insulating film 18b is formed on the surface of the lower electrode 18a. Subsequently, to form an upper electrode of the capacitor, for example, titanium nitride and n-type polysilicon are sequentially coated on the semiconductor substrate 1 by a CVD method or the like, thereby to form a conductive film 18c1 for forming the upper electrode, and thereafter, the conductive film 18c1 for forming the upper electrode is subjected to patterning with use of a photoresist pattern 28p shown in FIG. 30 as an etching mask, thereby to form the upper electrode 18c. At this time, the insulating film 13 in the peripheral circuit region P may be simultaneously removed with the photoresist pattern 28p used as a mask. A capacitor C for storing information of the DRAM is formed thus.

Figure 31:
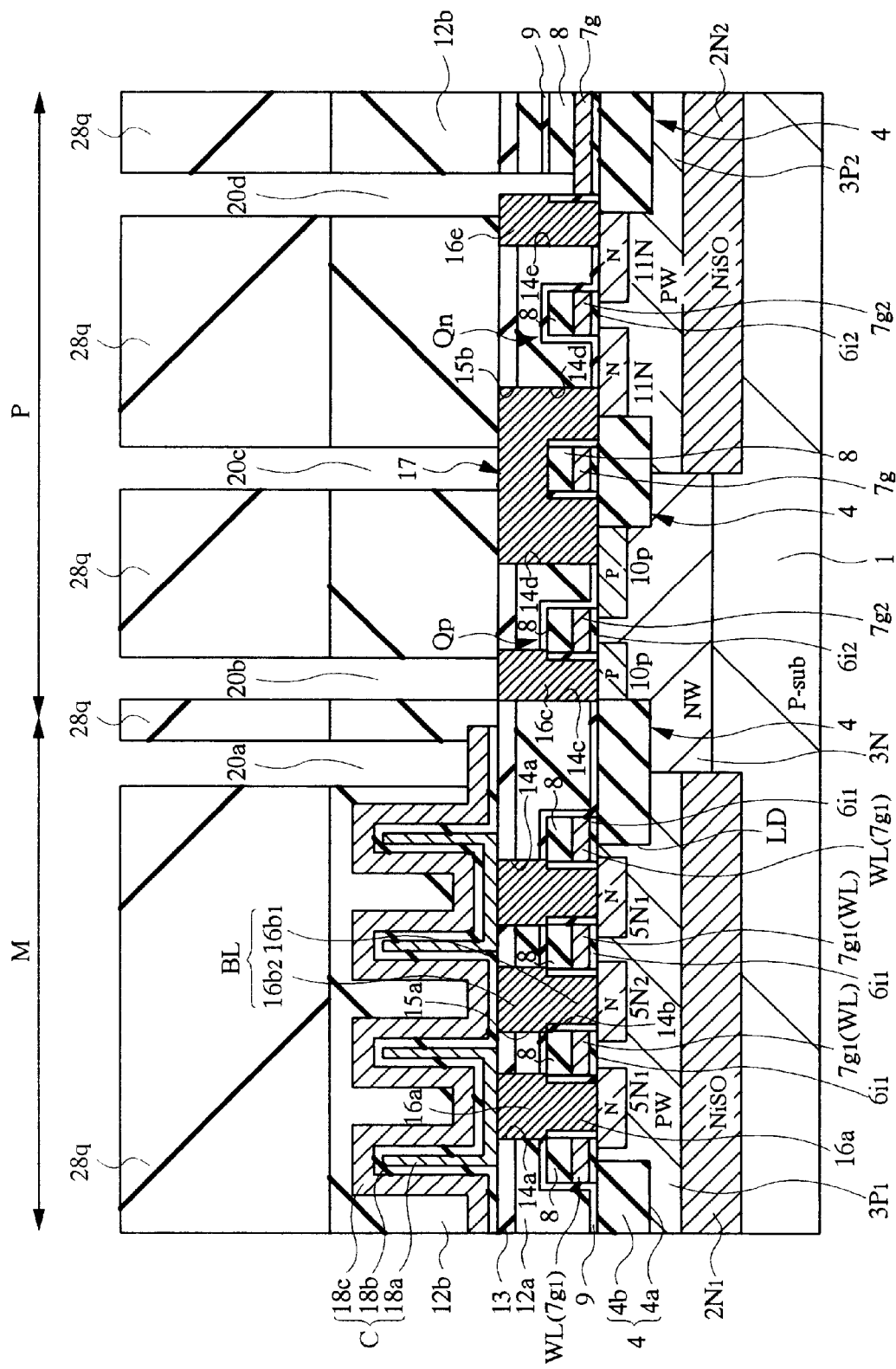
FIG. 31 is a cross-sectional view showing a main portion of the semiconductor integrated circuit device shown in FIG. 1 in a manufacturing step subsequent to the step of FIG. 30.
Figure 32:
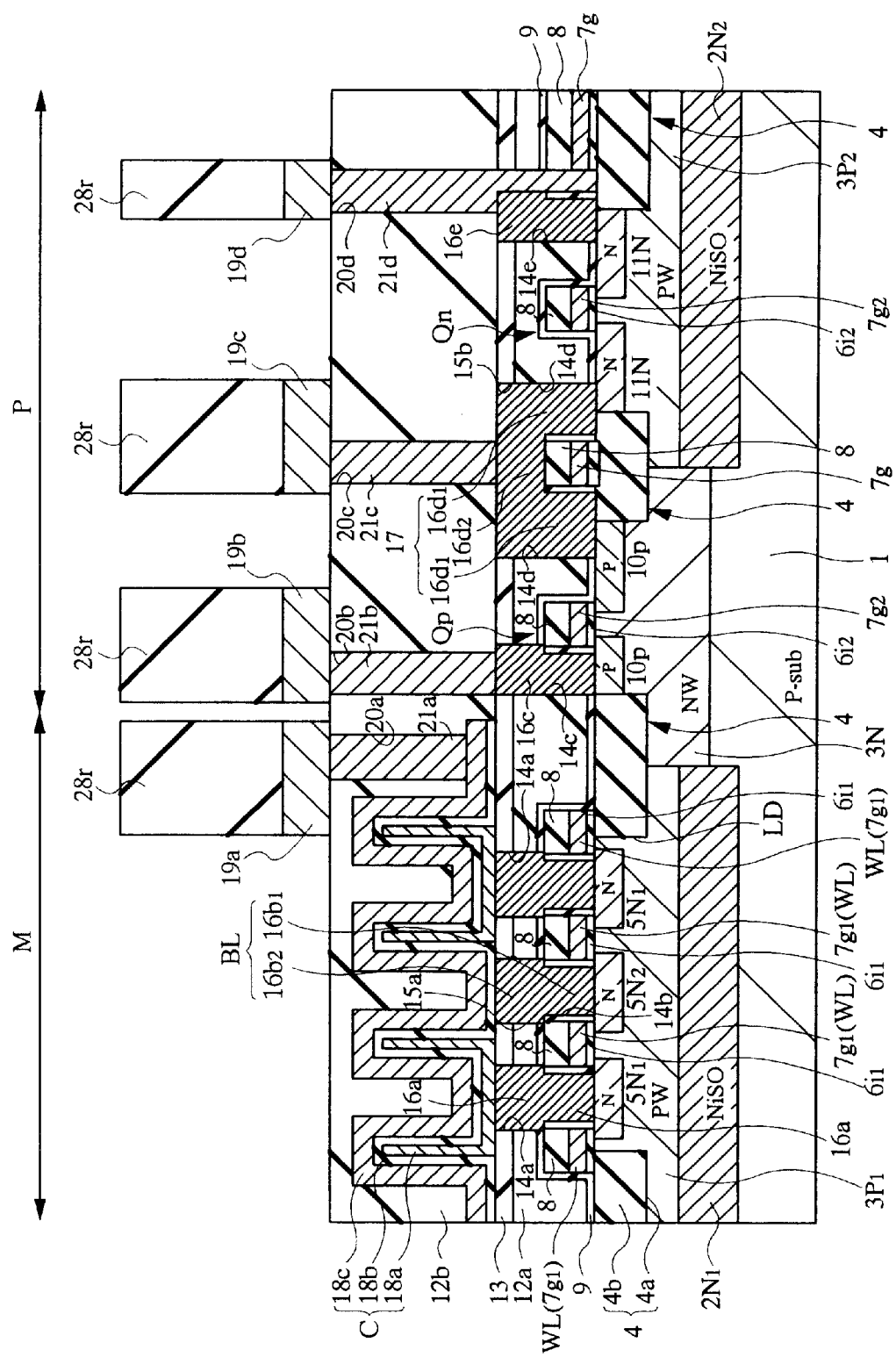
FIG. 32 is a cross-sectional view showing a main portion of the semiconductor integrated circuit device shown in FIG. 1 in a manufacturing step subsequent to the step of FIG. 31.

Next, the photoresist pattern 28p is removed, and thereafter, an insulating film made of, for example, a silicon oxide film or the like is deposited on the semiconductor substrate 1 by a CVD method or the like. Further, the upper surface of the insulating film is flattened by an etch-back method or a CMP method (which is more preferable), thereby to form an interlayer insulating film 12b, as shown in FIG. 31. Subsequently, a photoresist pattern 28q which exposes the upper electrode 18c, plug 16c, local wire 17, plug 16e, and a part of gate electrode 7g and covers the rest is formed on the upper surface of the interlayer insulating film 12b. Thereafter, with the pattern 28q used as an etching mask, contact holes 20a to 20d are formed in the interlayer insulating film 12b. Exposed from the contact hole 20d are the upper surface and upper side surfaces of the plug 16e and the part of the upper surface of the gate electrode 7g. Thereafter, the photoresist pattern 28q is removed, and thereafter, for example, titanium, titanium nitride, and tungsten are deposited orderly from downside. Further, the conductive layered film is removed by an etch back method or CMP method, thereby to form plugs 21a to 21d in the contact holes 20a to 20d, as shown in FIG. 32. The plug 21d is electrically connected to the plug 16e and the gate electrode 7g.

Next, for example, titanium, titanium nitride, aluminum (or aluminum-silicon-copper alloy), titanium, and titanium nitride are orderly deposited from downside by a sputtering method or the like, on the interlayer insulating film 12b and the plugs 21a to 21d. Thereafter, a photoresist pattern 28r which covers a first layering wire formation region and exposes the other portions is formed on the layered conductive film for forming the first layer wire. Further, with this pattern 28r used as an etching mask, the layered conductive film is subjected to patterning thereby to form first layer wires 19a to 19d.

Although the present embodiment has been explained with reference to the case where the first layer wires 19a to 19d are constructed in a normal wiring structure, the present invention is not limited hitherto, but the first layer wires 19a to 19d may be formed as embedded wires like bit lines BL or the like. In this case, the wires are formed in the following procedure, for example. At first, a first insulating film made of a relatively thin silicon nitride film and a second insulating film made of a relatively thick silicon oxide film are deposited orderly from downside on the interlayer insulating film 12b, by a CVD method or the like. Thereafter, a photoresist pattern which exposes the wiring groove formation region and covers the other regions is formed thereon. Subsequently, with the photoresist pattern used as a mask, etching processing is performed under an etching condition which allows high selectivity on the silicon oxide film and the silicon nitride film, whereby the second insulating film exposed from the photoresist pattern is etched and removed, with the lower first insulating film made of a silicon nitride film used as an etching stopper. Thus, the wiring groove for forming the first layer wire is formed. Thereafter, the photoresist pattern for forming the wiring groove is removed, and a photoresist pattern for forming a contact hole is formed thereafter. With this pattern used as a mask, etching processing is performed thereby to etch and remove sequentially the first insulating film and the interlayer insulating film 12b exposed from the photoresist pattern for forming the contact holes, thereby to form contact holes through which the upper electrode 18c, plug 16c, local wire 17, plug 16e, and a part of the gate electrode 7g are exposed. Further, a conductive film for forming wires is deposited and is thereafter removed by a CMP method or the like such that the conductive film remains only in the wiring groove for forming the first layer wires. The first layer wire is thereby formed in the wiring groove.

In this step of forming first layer wires, the photoresist pattern 28r is removed, and thereafter, the contact holes 23a and 23b, plugs 24a and 24b, and the second layer wire 22 shown in FIG. 1 are formed. In addition, third and fourth layer wires are sequentially formed if necessary. Subsequently, a silicon nitride film or silicon oxide film based on a plasma CVD method and a surface protection film 25 made of a silicon nitride film thereon are deposited to cover the uppermost wires. Thereafter, a part of the surface protection film 25 is opened such that a part of the uppermost wire is exposed, thereby to form a bonding pad BP. The DRAM is thus completed. In the present embodiment, a two-layer wiring structure having high performance has been manufactured, for example, by using 18 photo-masks or so. Also, in the present embodiment, the capacitor C can be formed with use of three masks regardless of the structure in which capacitors C are provided above bit lines.

Thus, according to the present embodiment, the following advantages can be obtained.

(1) Since the contact portion 16b1 of the bit line BL and the wiring portion 16b2 are integrally made from the same conductive film, the contact resistance between the contact portion 16b1 and the wiring portion 16b2 can be eliminated. Therefor, the total resistance of the bit line BL can be reduced, with the result that the operation speed of the DRAM can be improved.

(2) Since the contact portion 16b1 and the wiring portion 16b2 are integrally made the same conductive film, the parasitic resistance between the semiconductor region 5N1 of the memory cell selection MISFET Qs and the bit line BL can be reduced. Thus, it is possible to detect the signal amount of the capacitor C with ease.

(3) Since the contact portion 16b1 and the wiring portion 16b2 are integrally made from the same conductive film, the steps of manufacturing the DRAM can be simplified so that the manufacturing period can be shortened.

(4) Since the contact portion 16b1 and the wiring portion 16b2 are integrally made from the same conductive film, a margin (so called a dog born) for matching the bit line BL with the contact hole for the bit line is not required. Therefore, the interval between adjacent bit lines BL can be reduced.

(5) Since the bit line BL is formed by being embedded into the wiring groove 15a provided in the interlayer insulating film 12a, foreign materials cannot enter between adjacent bit lines BL, and therefore, the occurrence rate of short-circuiting between adjacent bit lines can be reduced.

(6) Since the bit line BL is formed by being embedded into the wiring groove 15a provided in the interlayer insulating film 12a, side walls can be formed in the wiring groove 15a with high controllability. Therefore, scale down of the bit line BL can be promoted.

(7) Since the bit line BL is formed by being embedded into the wiring groove 15a provided in the interlayer insulating film 12a, no step is formed due to the bit line BL, and therefore, no steps are reflected on the upper surface of the insulating film covering the bit line BL. Accordingly, the upper surface of the insulating film can be easily flattened.

(8) Since scale down of the bit line BL can be promoted by forming the bit line BL to be embedded into the wiring groove 15a formed in the interlayer insulating film 12a, matching margins for matching the bit line BL, storage node of the capacitor C (which includes the lower electrode 18a and plug 16a), and the contact holes 14a and 14b of the semiconductor regions 5N1 and 5n2 of the memory cell selection MISFET Qs can be increased.

(9) Scale down of the memory cell can be promoted much more by the advantages described in items (4), (6), and (8).

(10) Since the local wire 17 forming the peripheral circuit of the DRAM is constructed in an embedded structure, scale down of the peripheral circuit region can be promoted.

(11) When the wiring groove 15b of the local wire 17 forming the peripheral circuit of the DRAM is fabricated, the SAC technique is used. Therefore, it is possible to form a fine local wire 17 which crosses over the gate electrode 7g without electric contact with the gate electrode 7g. Accordingly, scale down of the peripheral circuit region can be promoted.

(12) Since the wiring groove 15b of the local wire 17 forming the peripheral circuit of the DRAM is formed simultaneously when the wiring groove 15a of the bit line BL is formed and one same conductive film is embedded in the wiring grooves 15a and 15b, it is possible to reduce the number of steps for manufacturing the DRAM having the local wire 17 of the embedded structure.

(13) The first layer wires 19b to 19d in the peripheral circuit region P and the semiconductor regions 10P and 11N of the pMIS Qp and nMIS Qn are not connected directly but connected thereto in two stages in the thickness direction of the semiconductor substrate 1. Therefore, a conductive film can be easily and securely embedded in the contact holes 14c to 14e and the contact holes 20b to 20d connecting both of the wires and regions, so that the first layer wires 19b to 19d and the semiconductor regions 10P and 11N of the pMIS Qp and nMIS Qn can be more reliably connected.

(14) Since patterning of the gate electrode 7g1 of the memory cell region M of the DRAM and patterning of the gate electrodes 7g2 and 7g are separately performed with use of different photo-masks, the processing precision of each of the gate electrodes 7g1, 7g2, and 7g can be improved. Therefore, scale down of each of the gate electrodes 7g1, 7g2, and 7g can be promoted.

(Embodiment 2)

FIGS. 33 to 36 are cross-sectional views of a main portion in steps of manufacturing a semiconductor integrated circuit device as another embodiment of the present invention.

The embodiment 2 of the present invention is substantially the same as the first embodiment except that the method of forming the capacitor for storing information described above is slightly different. Note that the same steps as shown in FIGS. 8 to 26 cited in the embodiment 1 of the first invention are used in the embodiment 2 and the following explanation will be made on steps after those steps.

Figure 33:
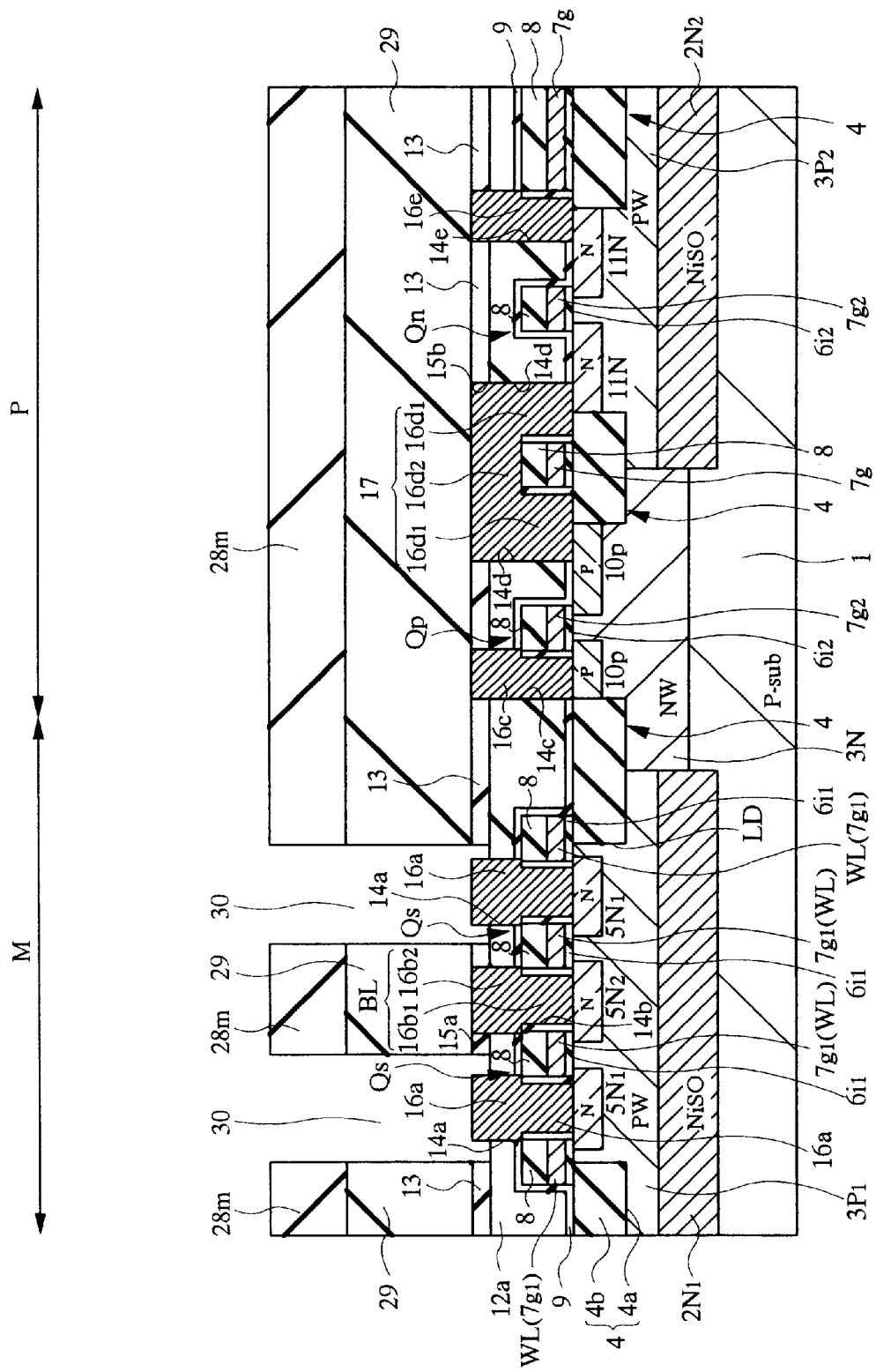
FIG. 33 is a cross-sectional view showing a main portion of a semiconductor integrated circuit device as another embodiment of the present invention, under the steps of manufacturing.

At first, as shown in FIG. 33, etching processing is performed on the semiconductor substrate 1 with the photoresist pattern 28m used as a mask under a condition that the etching rate of the silicon oxide film is higher than that of the silicon nitride film. A capacitor hole 30 is formed in the insulating film 29 with use of the insulating film 13 made of a silicon nitride as an etching stopper. Thereafter, the insulating film 13 exposed through the capacitor hole 30 is removed. In this manner, the structure is arranged such that an upper portion of the plug 16a projects at the bottom portion of the capacitor hole 30. As for the method of removing the insulating film 13, the etching condition may be modified such that the etching rate of the silicon nitride film becomes higher than that of the silicon oxide film at the time when the insulating film 13 is exposed. Or, the etching processing may be terminated at the time when the insulating film 13 is exposed from the capacitor hole 30, and subsequently, the insulating film 13 may be removed by a thermal phosphoric acid ($H_3PO_4$) or the like.

Figure 34:
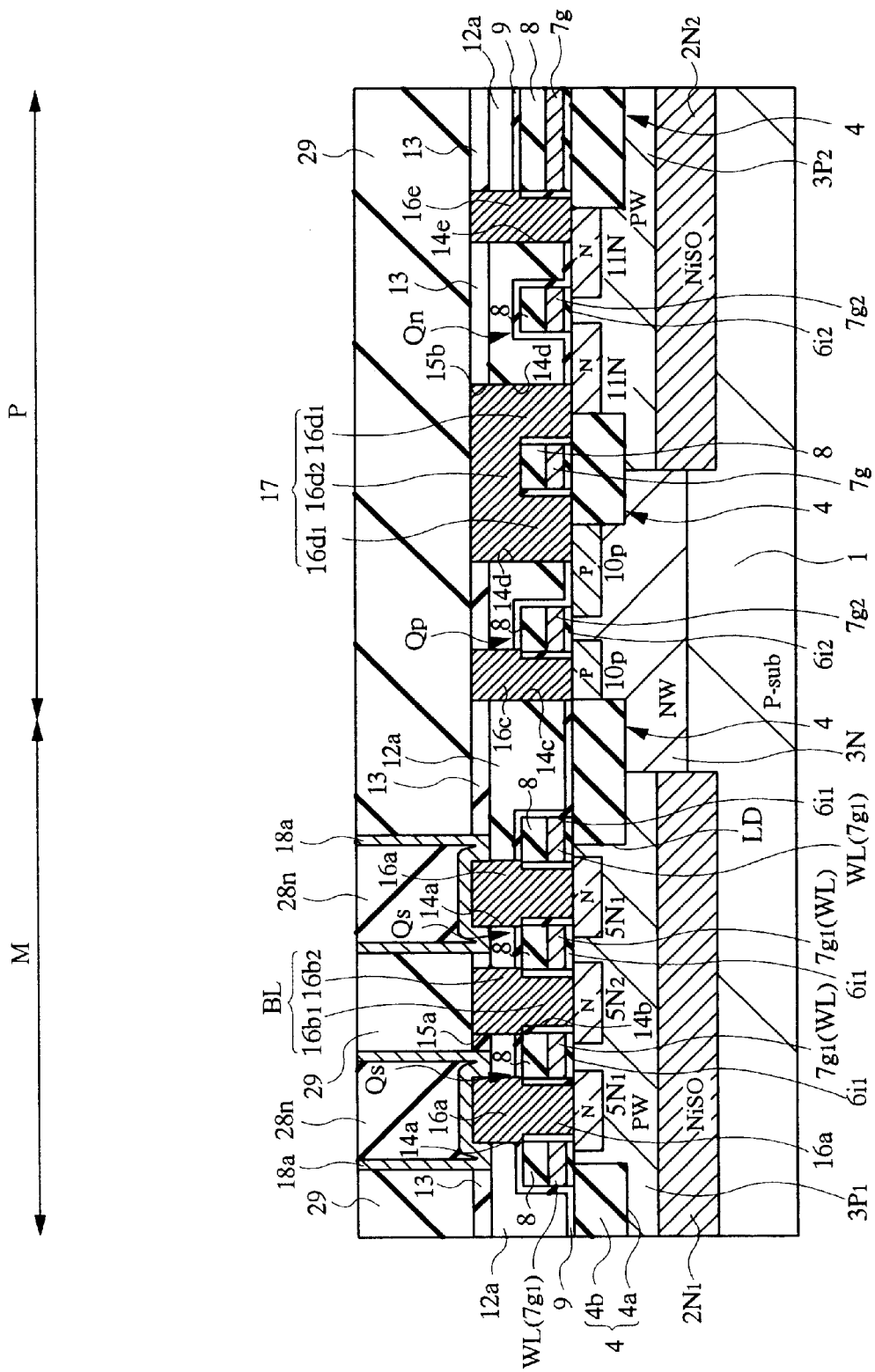
FIG. 34 is a cross-sectional view showing a main portion of the semiconductor integrated circuit device shown in FIG. 1 in a manufacturing step subsequent to the step of FIG. 33.
Figure 35:
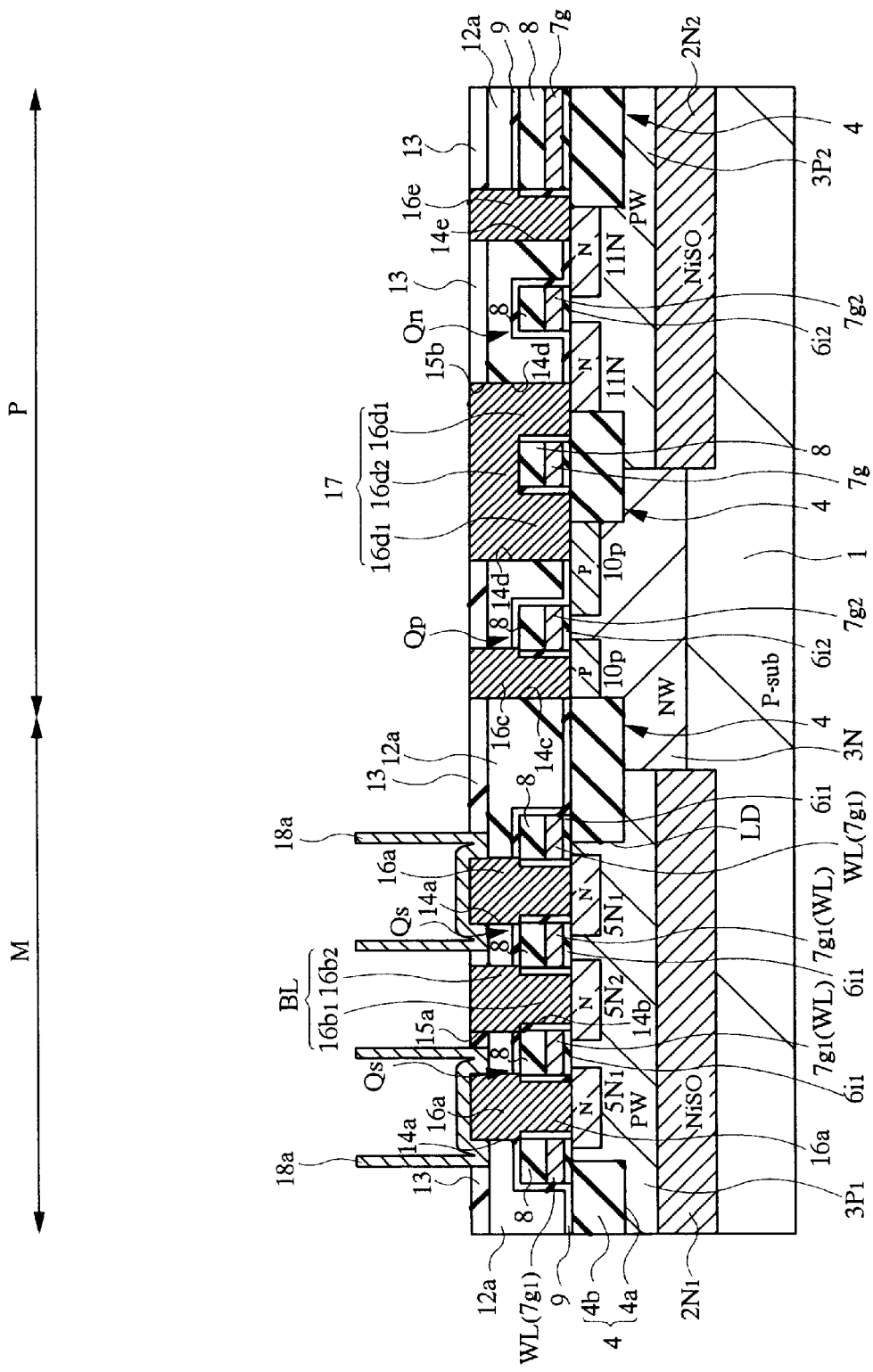
FIG. 35 is a cross-sectional view showing a main portion of the semiconductor integrated circuit device shown in FIG. 1 in a manufacturing step subsequent to the step of FIG. 34.

Subsequently, as shown in FIG. 34, a lower electrode 18a made of, for example, low resistance polysilicon is formed in the capacitor hole 30, like in the embodiment 1 described above. Thereafter, the insulating film 29 and the photoresist film 28n are removed. FIG. 35 shows a cross-sectional view of the semiconductor substrate 1 which has been subjected to this processing. In the present embodiment, a lower portion of the lower electrode 18a is restricted by the insulating film 13. In addition, an upper portion of the plug 16a is arranged so as to project through the bottom portion of the lower electrode 18a. Therefore, the contact area between the plug 16a and the lower electrode 18a can be increased so that the contact resistance therebetween can be reduced and the mechanical coupling strength therebetween can be increased. Accordingly, when removing the insulating film 29 and the photoresist film 28n (ref. FIG. 34), the lower electrode 18a can be prevented from being destructed. In addition, since the plug 16a projects, the bottom portion of the lower electrode 18a projects upward, correspondingly. Therefore, the surface area of the lower electrode 18a can be increased so that increase of the storage capacity can be promoted.

Figure 36:
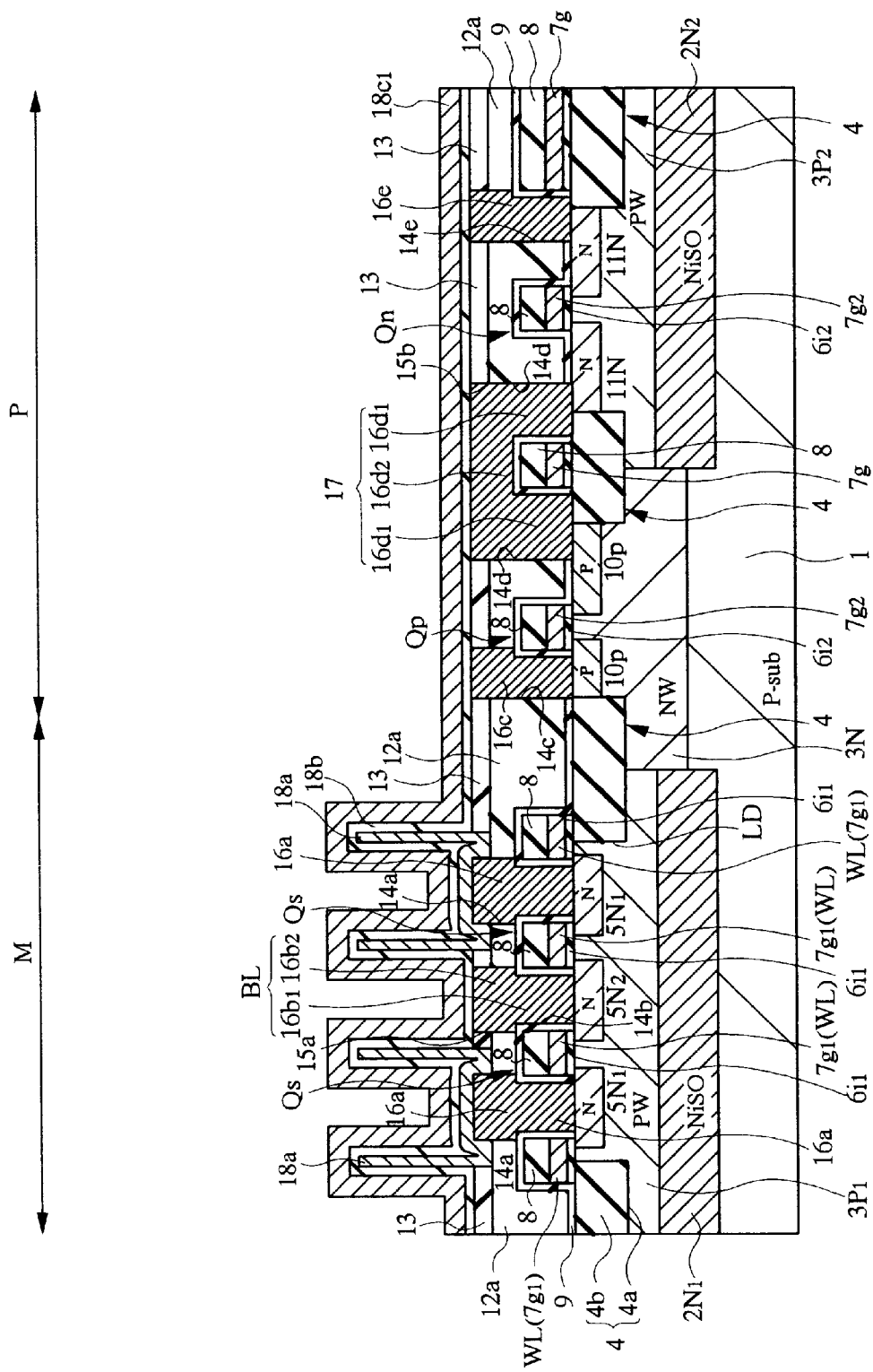
FIG. 36 is a cross-sectional view showing a main portion of the semiconductor integrated circuit device shown in FIG. 1 in a manufacturing step subsequent to the step of FIG. 35.

Thereafter, as shown in FIG. 36, the capacity insulating film 18b and a conductive film 18c1 for forming the lower electrode are coated, like in the embodiment 1, and these films are subjected to patterning like in the embodiment 1 described above. Thus, the capacitor is formed. Since subsequent steps are the same as those in the embodiment 1, explanation thereof will be omitted herefrom.

According to the embodiment 2, the following advantages can be obtained in addition to the advantages obtained by the embodiment 1.

(1) When the lower electrode 18a is formed of the capacitor for information accumulation of a DRAM, the lower electrode 18a can be prevented from being destructed.

(2) The bottom portion of the lower electrode 18a of the capacitor for information accumulation of a DRAM can be formed to be convex so that the surface area thereof can be increased. Therefore, the capacity of the capacitor C can be increased.

(3) The contact area between the lower electrode 18a of the capacitor for information accumulation and the plug 16a of the DRAM can be increased so that the contact resistance between both of the electrode and the plug can be reduced.

(Embodiment 3)

FIGS. 37 to 46 are cross-sectional views showing a main portion at a step of manufacturing a semiconductor integrated circuit device as another embodiment of the present invention.

The embodiment 3 is substantially the same as the embodiment 1 described above except that the capacitor for storing information is slightly different. Note that the same steps as shown in FIGS. 8 to 23 cited in the explanation of the first embodiment are adopted in the third embodiment and the following explanation will therefore be made on steps after those steps.

Figure 37:
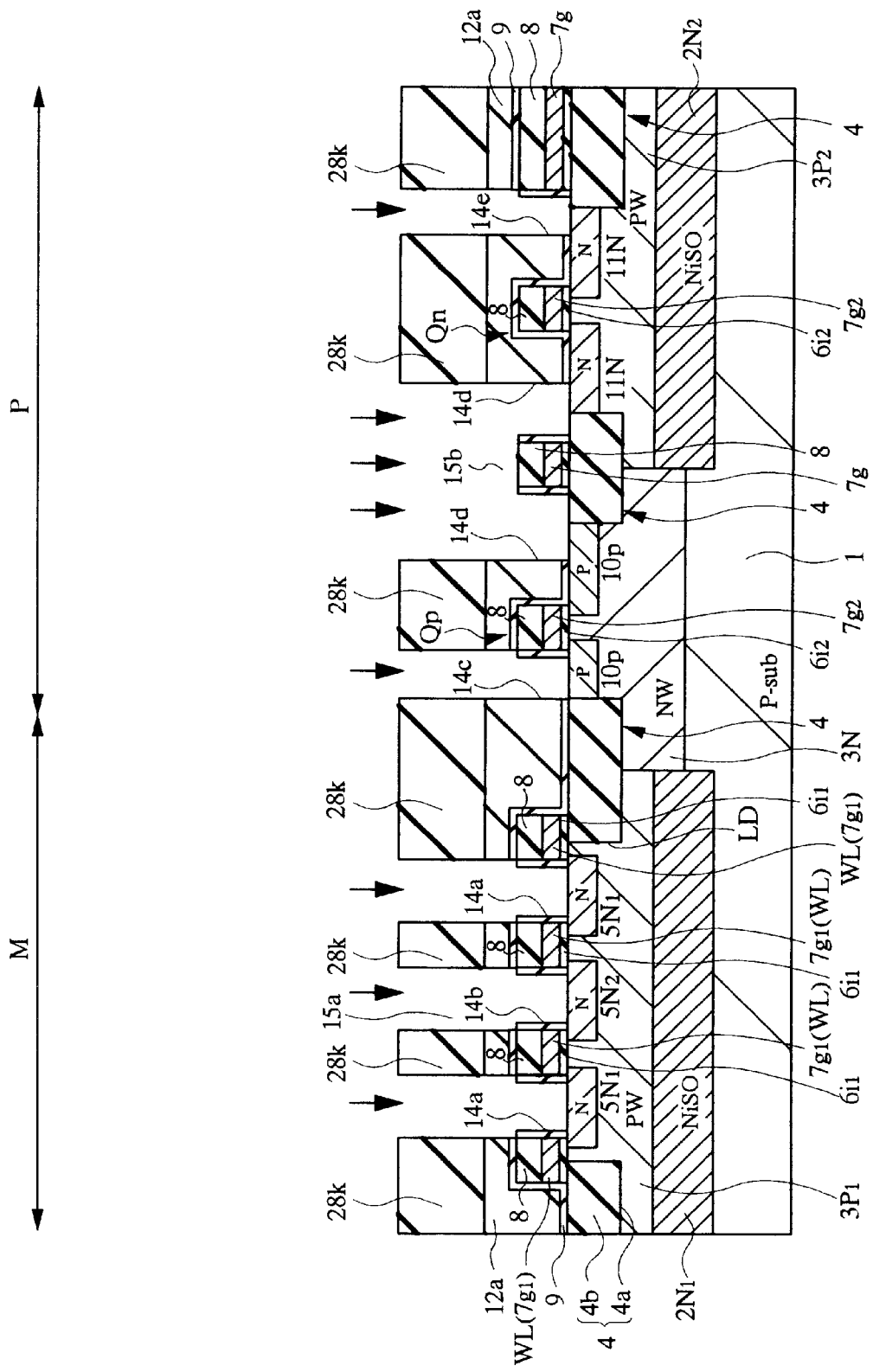
FIG. 37 is a cross-sectional view showing a main portion of a semiconductor integrated circuit device as another embodiment of the present invention, in a manufacturing step thereof.
Figure 38:
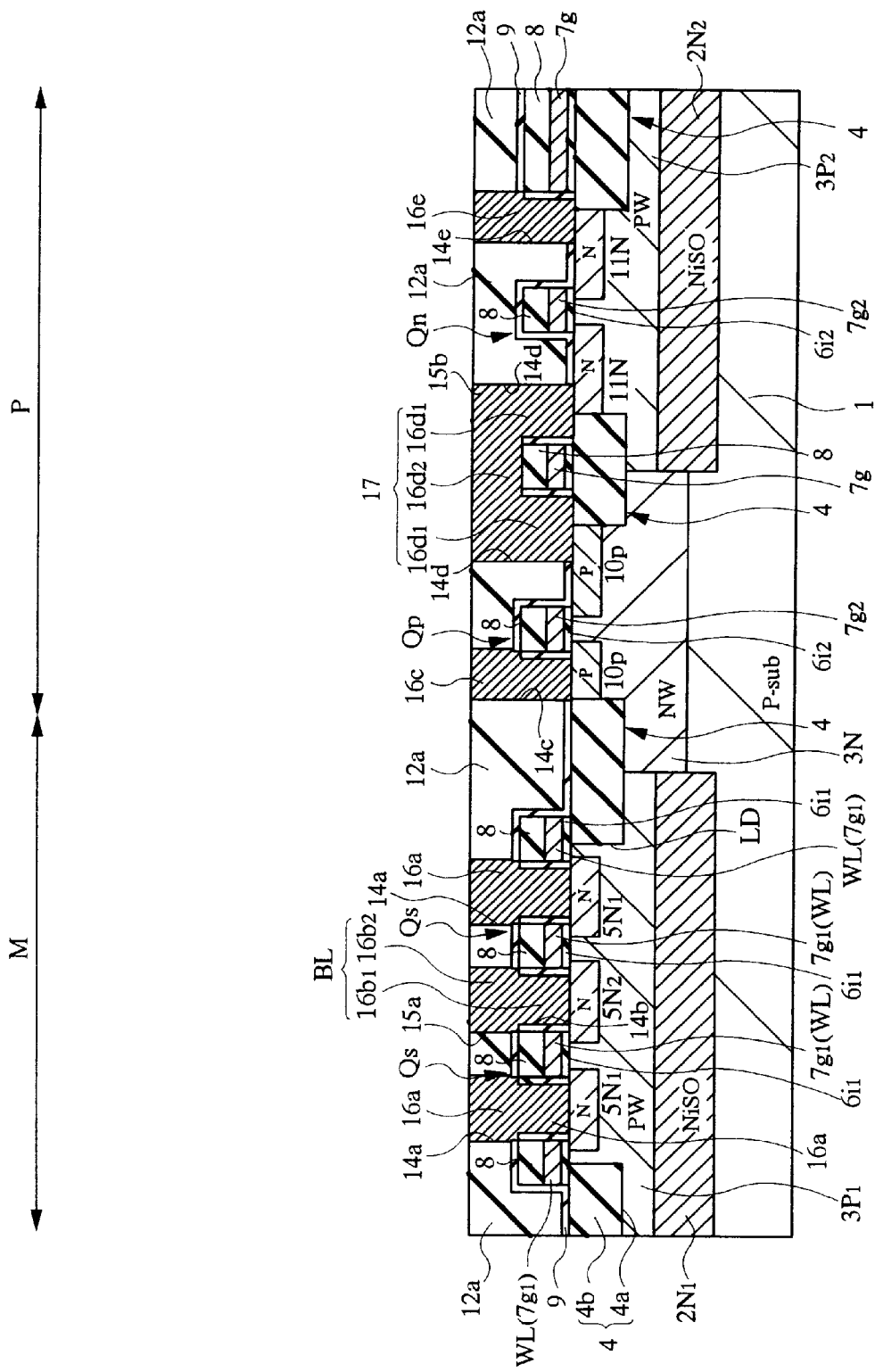
FIG. 38 is a cross-sectional view showing a main portion of the semiconductor integrated circuit device in a manufacturing step subsequent to the step of FIG. 37.
Figure 39:
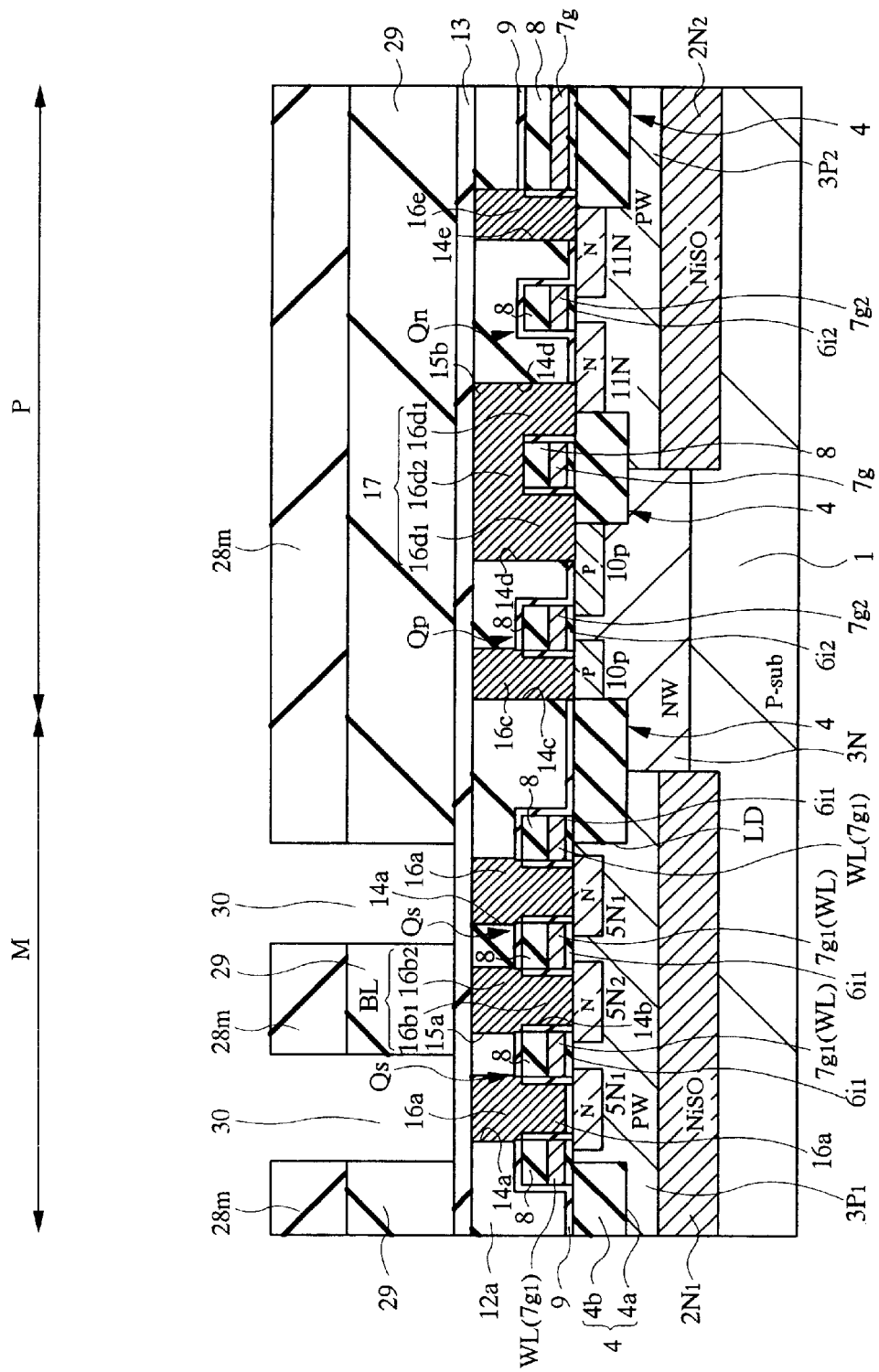
FIG. 39 is a cross-sectional view showing a main portion of the semiconductor integrated circuit device in a manufacturing step subsequent to the step of FIG. 38.

At first, as shown in FIG. 37, an interlayer insulating film 12a is formed on the semiconductor substrate, like in the embodiment 1. However, the insulating film 13 made of a silicon nitride film or the like, which has been explained in the embodiment 1 (ref. FIG. 24), is not deposited in this case. Subsequently, contact holes 14a to 14e and wiring grooves 15a and 15b are formed in the interlayer insulating film 12a by a SAC technique, like in the embodiment 1. Thereafter, the same step of doping impurities for relieving axing the electric field as in the embodiment 1 is carried out. Thereafter, like in the embodiment 1 described above, plugs 16a, 16c, and 16e are formed in the contact holes 14a, 14c, and 14e, a contact portion 16b1 of the bit line BL and a wiring portion 16b2 of the bit line BL are formed in the contact hole 14b and the wiring groove 15a, and a contact portion 16d1 of the local wire 17 and a wiring portion 16d2 of the local wire 17 are formed in the contact hole 14d, as shown in FIG. 38. Thereafter, like in the embodiment 1, an insulating film 13 is formed on the interlayer insulating film 12a and the plugs 16a and 16b, as shown in FIG. 39, and thereafter, an insulating film 29 is formed thereon. Further, a capacitor hole 30 is formed in the insulating film 29, with the insulating film 13 used as an etching stopper film, like in the embodiment 1. Note that, in this stage, the upper surface of the plug 16a is not exposed but is covered by the insulating film 13, unlike in the embodiment 1.

Figure 40:
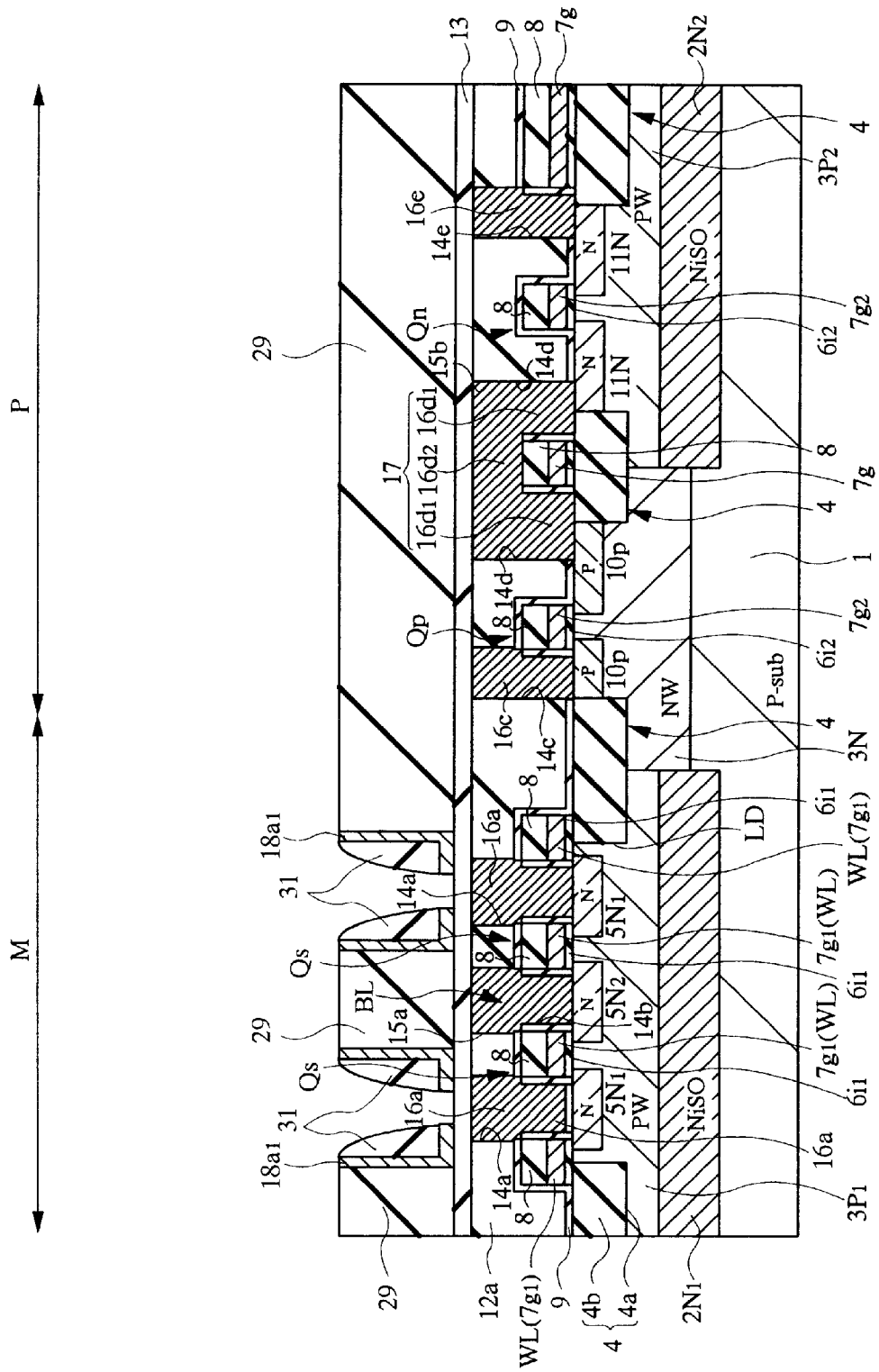
FIG. 40 is a cross-sectional view showing a main portion of the semiconductor integrated circuit device in a manufacturing step subsequent to the step of FIG. 39.
Figure 41:
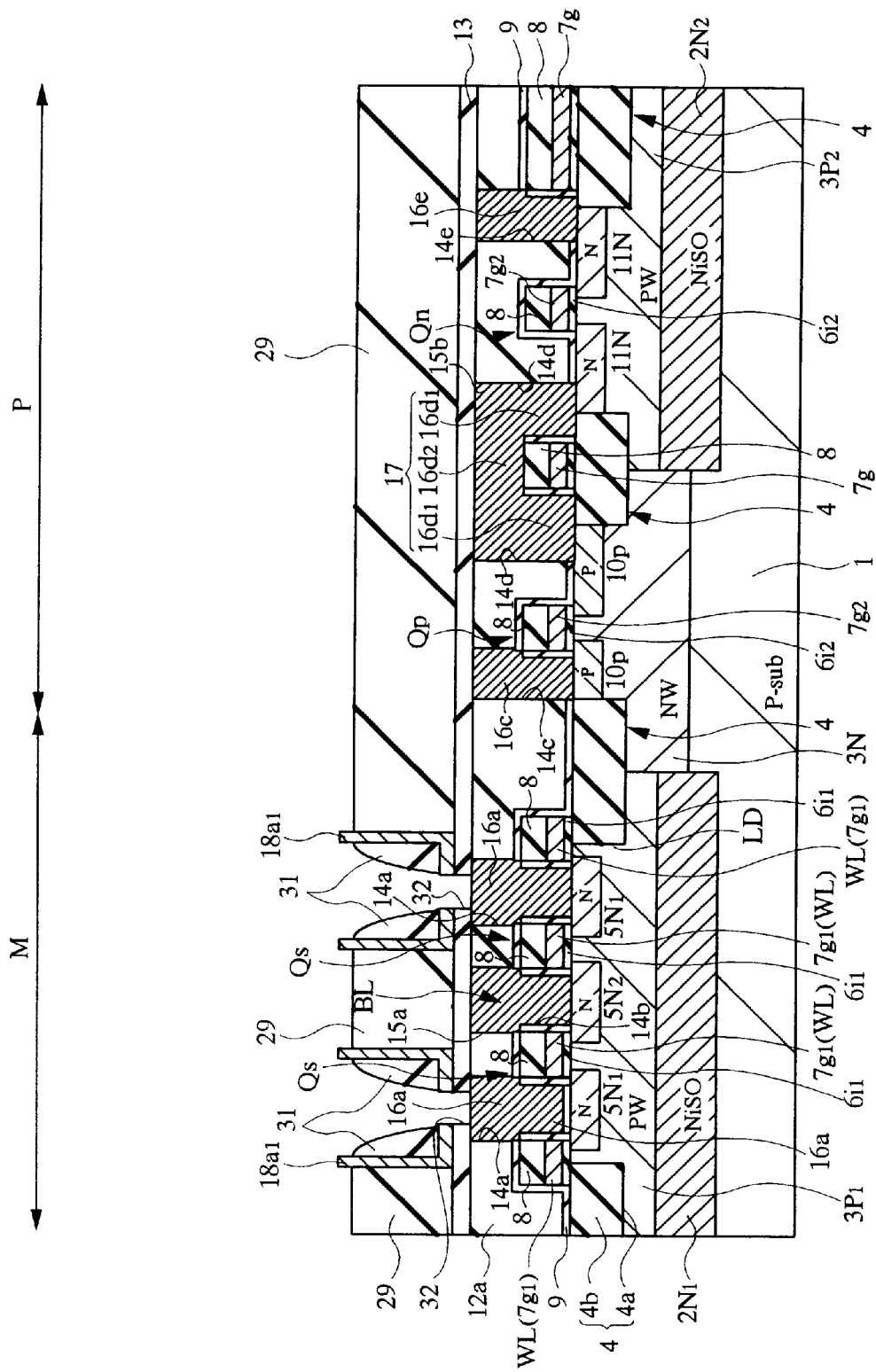
FIG. 41 is a cross-sectional view showing a main portion of the semiconductor integrated circuit device in a manufacturing step subsequent to the step of FIG. 40.

Next, the photoresist pattern 28m is removed, and thereafter, a first conductive film made of n-type low resistance polysilicon (into which phosphorus is doped during film formation) for forming the lower electrode of the capacitor is deposited on the interlayer insulating film 12a in the capacitor hole 30 by a CVD method or the like, and an insulating film made of, for example, a silicon oxide film is deposited thereon by a CVD method or plasma CVD method. Subsequently, the insulating film is etched by anisotropic etching processing, thereby to form a side wall 31 made of, for example, a silicon oxide film or the like on the side surfaces in the capacitor hole 30, with the first conductive film 18a1 inserted thereunder, as shown in FIG. 40. Thereafter, with the side wall 31 used as a mask, the portion of the first conductive film 18a1 which is exposed from the side wall 31 is removed by anisotropic etching processing. In this manner, the substantial center portion of the bottom portion of the first conductive film 18a1 can be removed. Thereafter, in the capacitor hole 30, anisotropic etching processing, is effected to remove those portions of the insulating film 13 exposed through the side wall 31 and the first conductive film 18a1 for forming the lower electrode, thereby to form a connection hole 32 from which a part of the upper surface of the plug 16a is exposed, in the insulating film 13.

Figure 42:
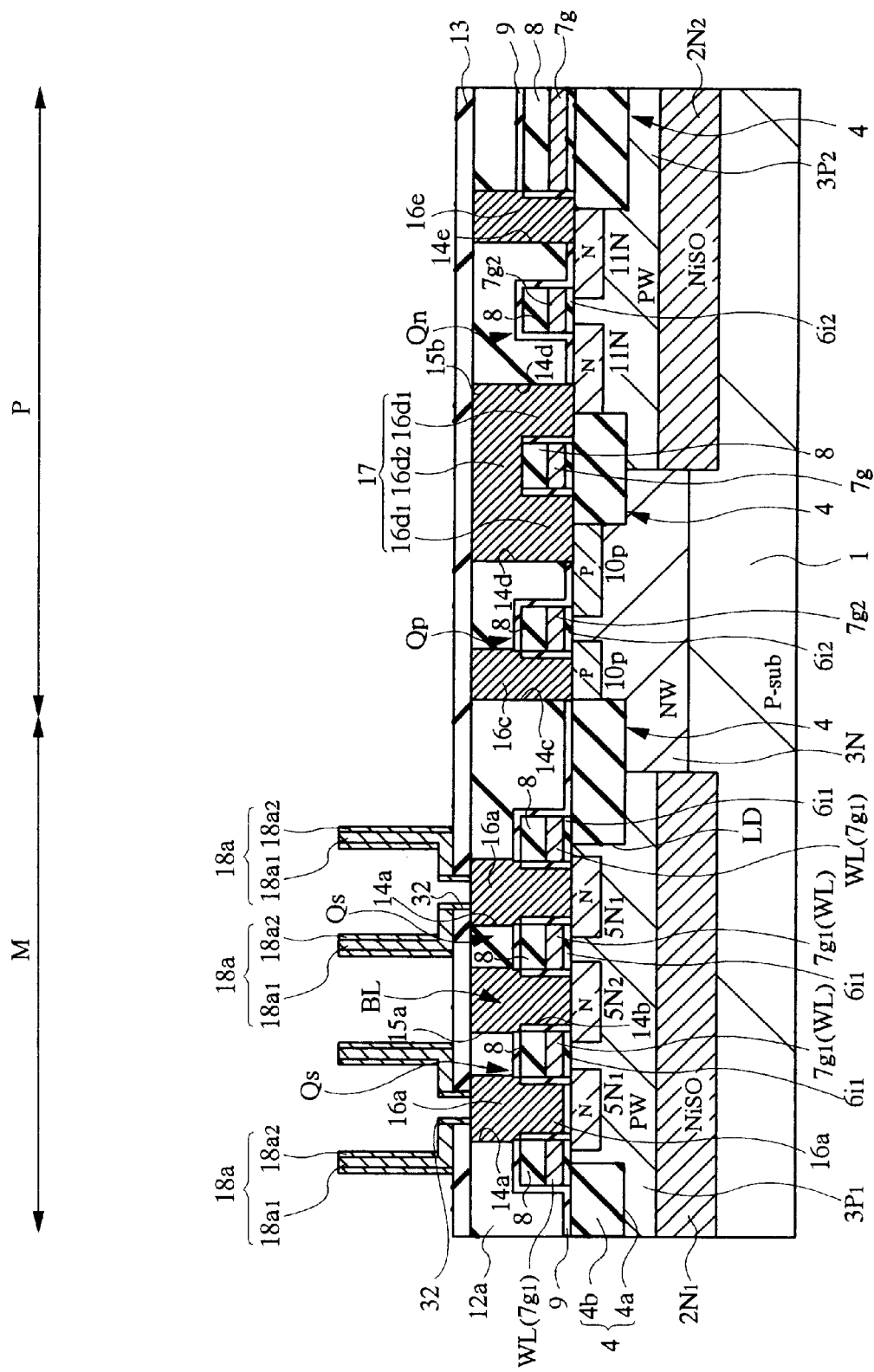
FIG. 42 is a cross-sectional view showing a main portion of the semiconductor integrated circuit device in a manufacturing step subsequent to the step of FIG. 41.

Next, the insulating film 29 made of a silicon oxide film or the like and the side wall 31 are etched and removed by wet etching processing by using the insulating film 13 as an etching stopper. Subsequently, a second conductive film made of n-type low resistance polysilicon film (into which phosphorus is doped as impurities during film formation) for forming the lower electrode is coated on the upper surface of the insulating film 13 and the surface of the conductive film 18a1 for forming the lower electrode, and thereafter, the second conductive film is etched by anisotropic etching processing. In this manner, the second conductive film 18a2 for forming the lower electrode is formed on the surface of the conductive film 18a1 for forming the lower electrode and the side surface of the contact hole 32, as shown in FIG. 42, while the other portion of the second conductive film on the insulating film 13 is removed. In this way, a lower electrode 18a is formed of the conductive films 18a1 and 18a2 so that electrical connection is established from the lower electrode to the plug 16a through the second conductive film 18a2.

Figure 43:
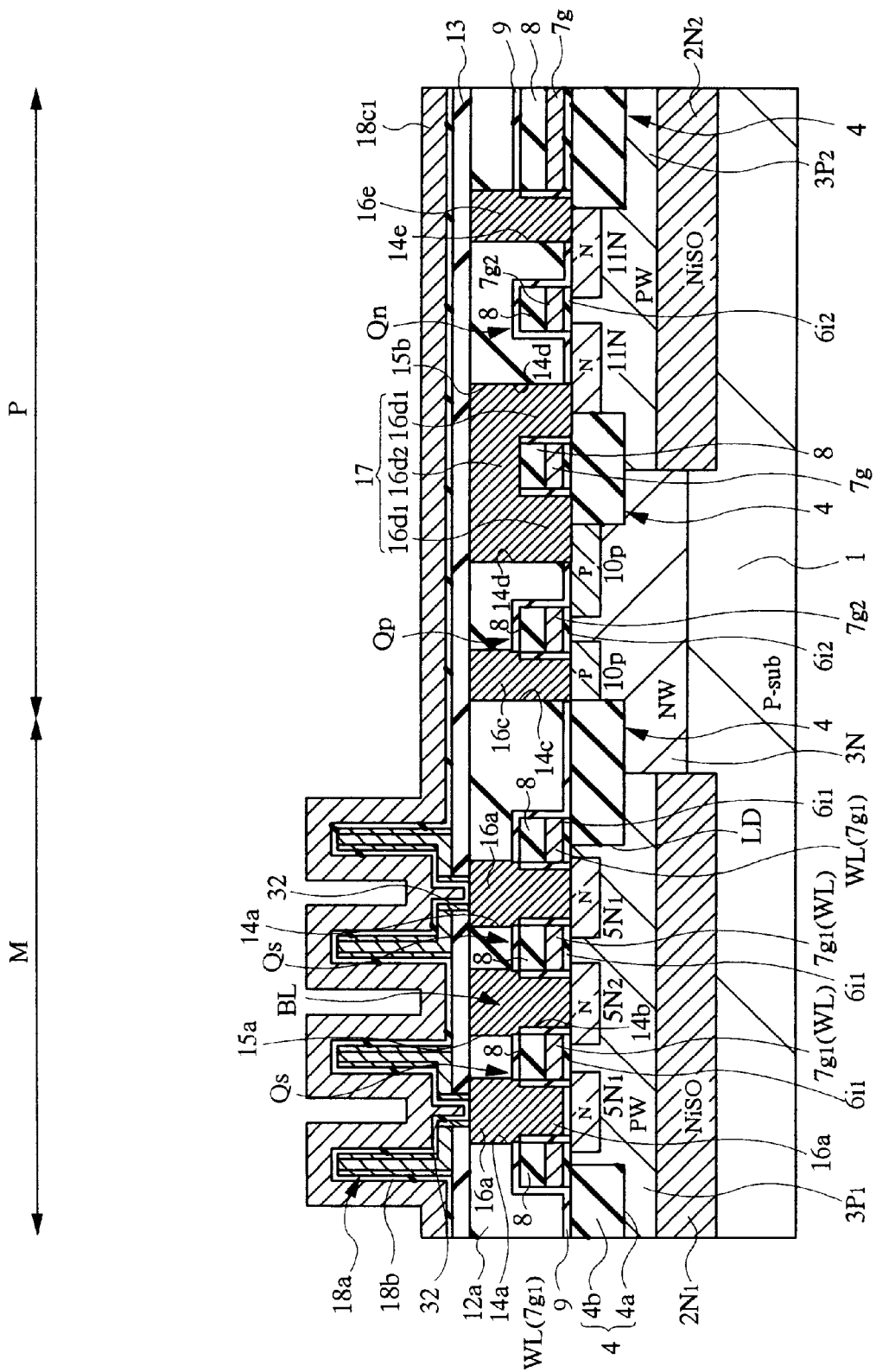
FIG. 43 is a cross-sectional view showing a main portion of the semiconductor integrated circuit device in a manufacturing step subsequent to the step of FIG. 42.
Figure 44:
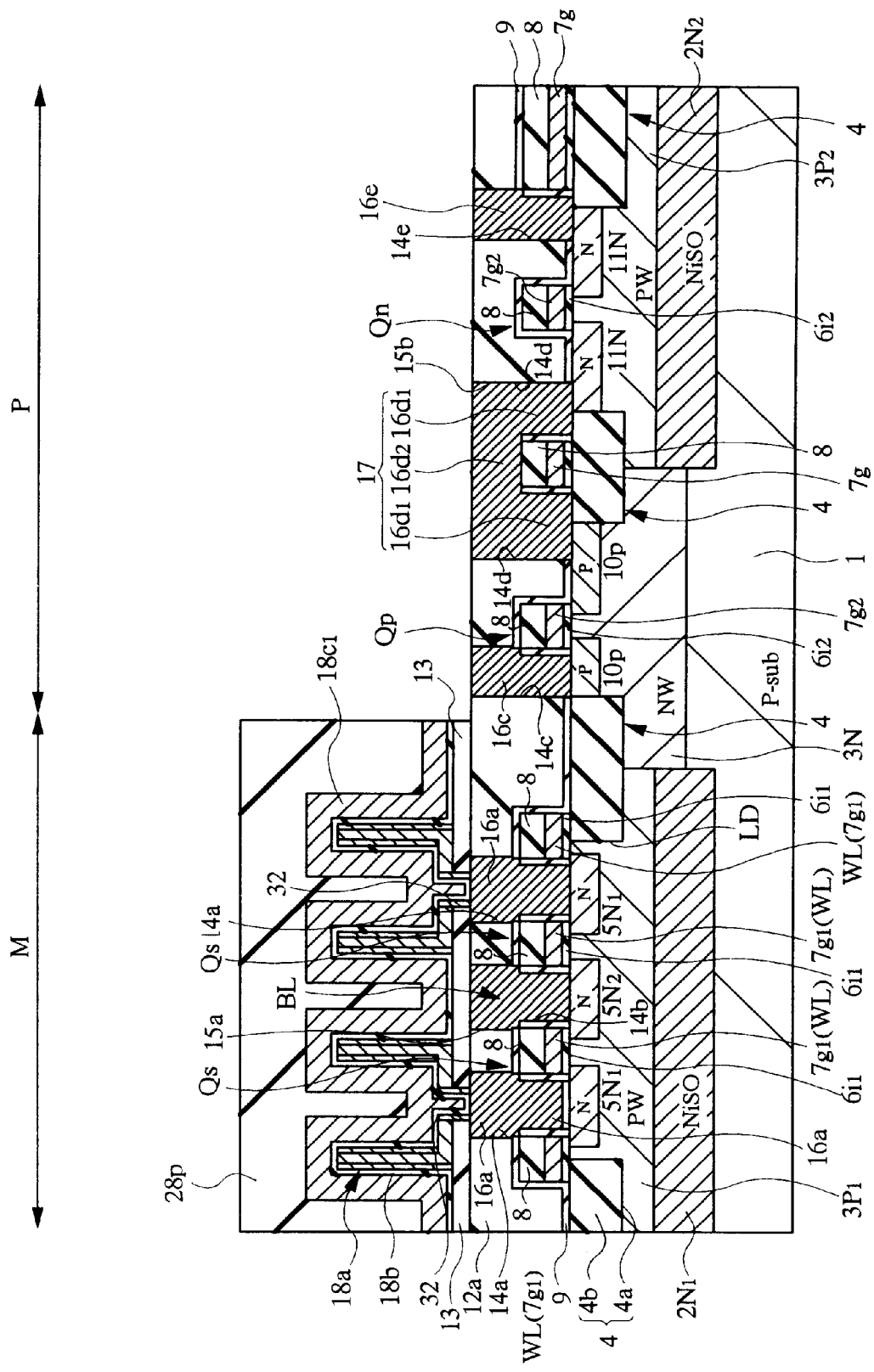
FIG. 44 is a cross-sectional view showing a main portion of the semiconductor integrated circuit device in a manufacturing step subsequent to the step of FIG. 43.
Figure 45:
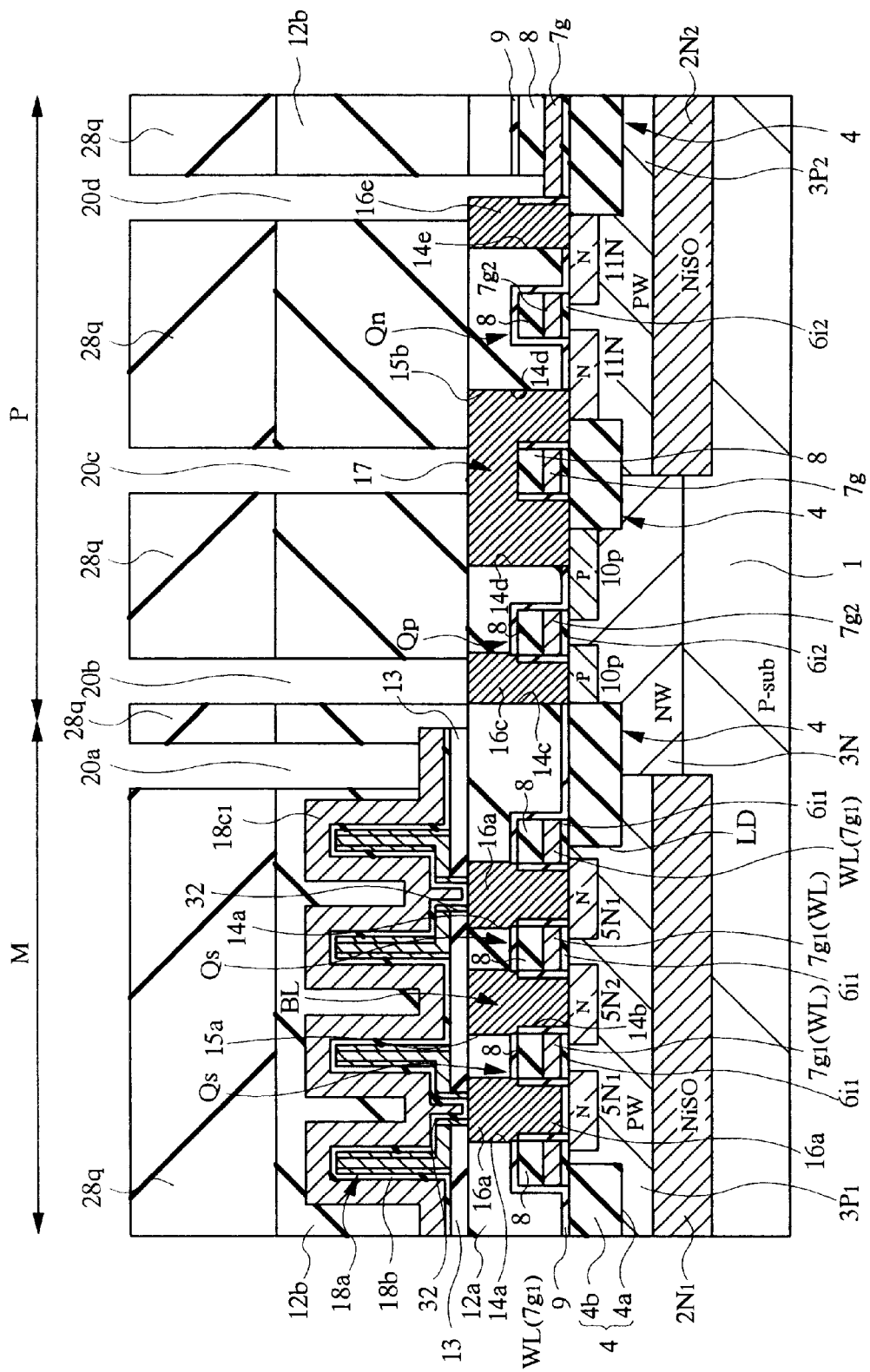
FIG. 45 is a cross-sectional view showing a main portion of the semiconductor integrated circuit device in a manufacturing step subsequent to the step of FIG. 44.
Figure 46:
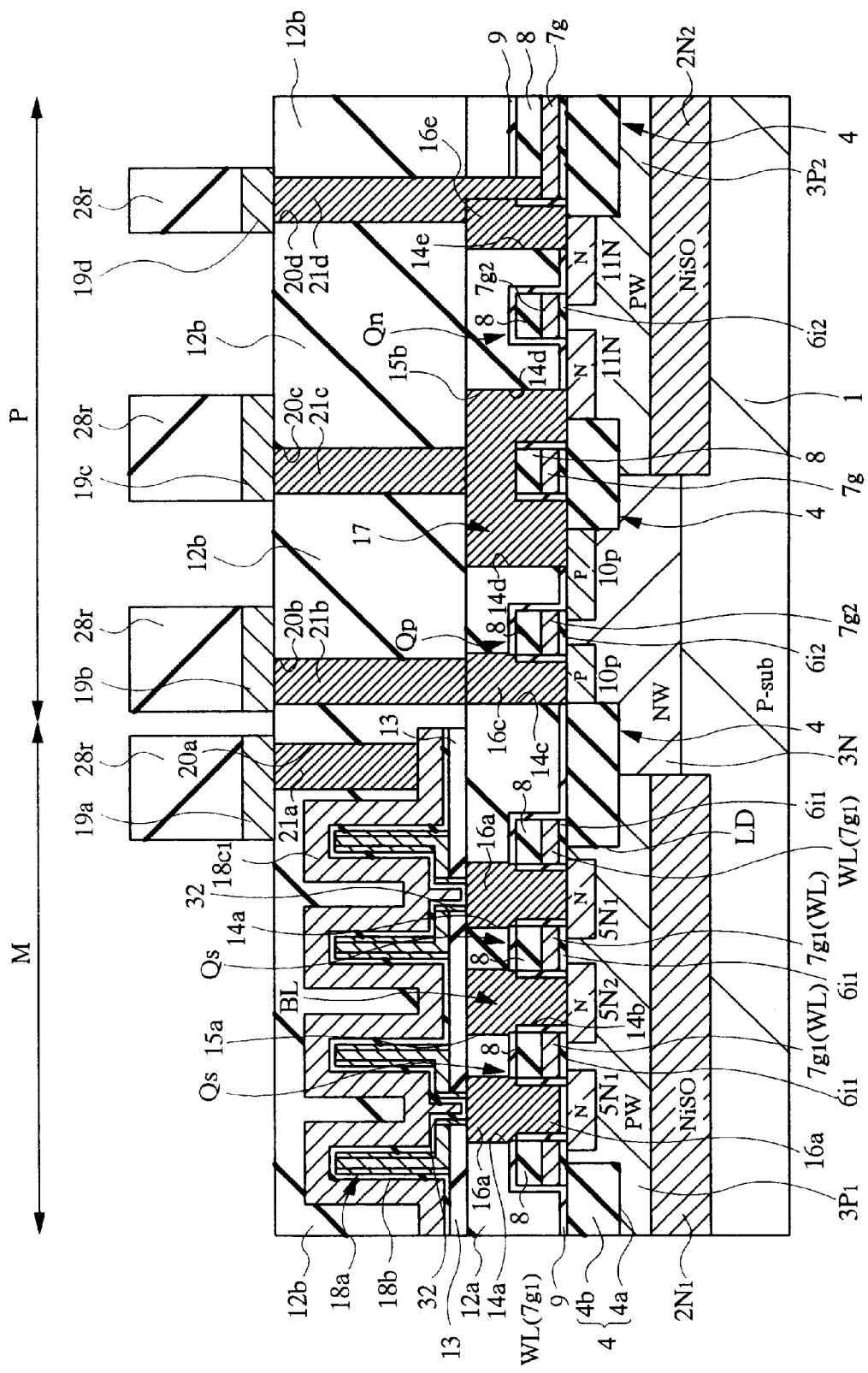
FIG. 46 is a cross-sectional view showing a main portion of the semiconductor integrated circuit device in a manufacturing step subsequent to the step of FIG. 45.
Figure 47:
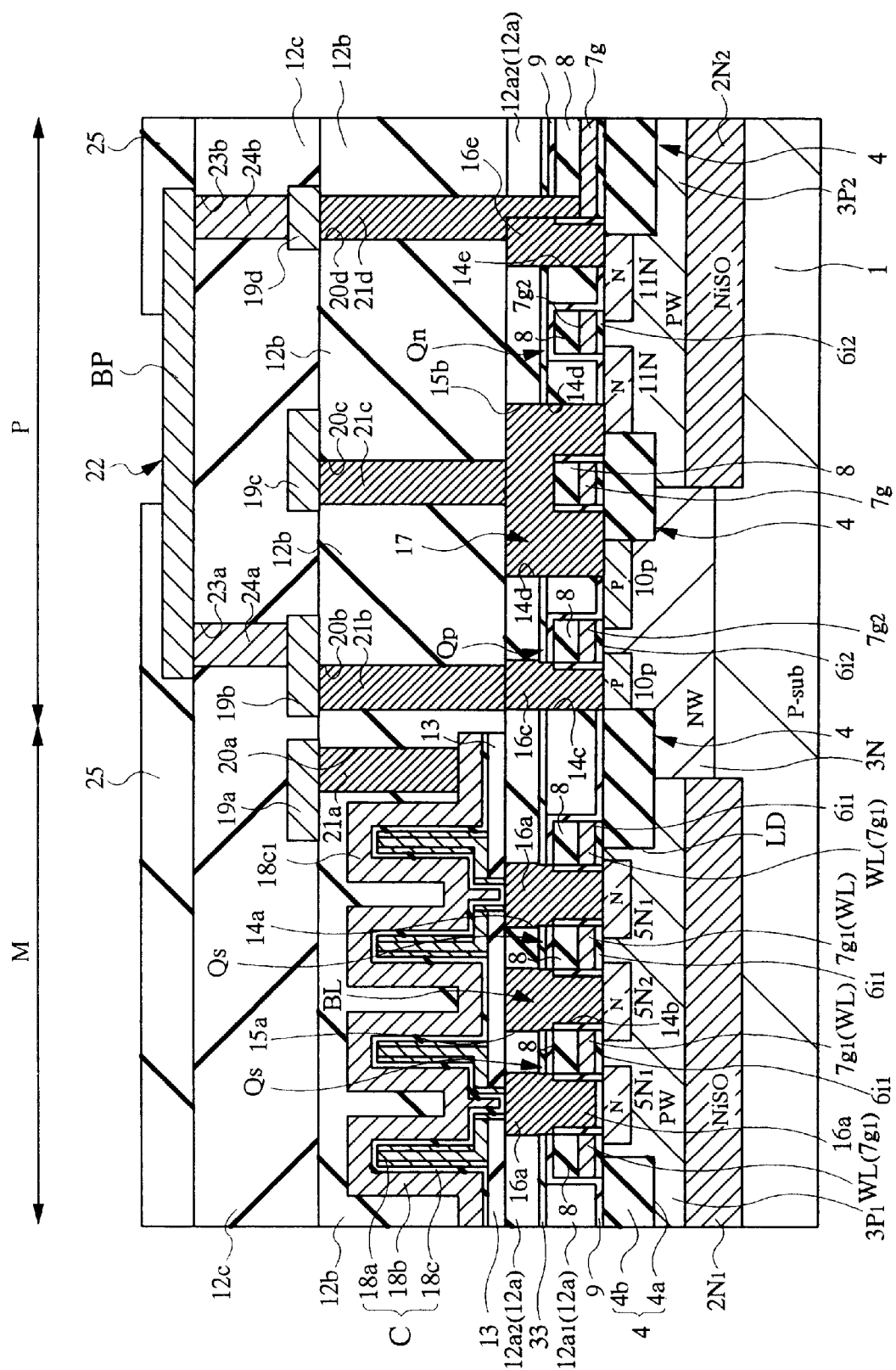
FIG. 47 is a cross-sectional view showing a main portion of a semiconductor integrated circuit device as another embodiment of the present invention, in a manufacturing step thereof.
Figure 48:
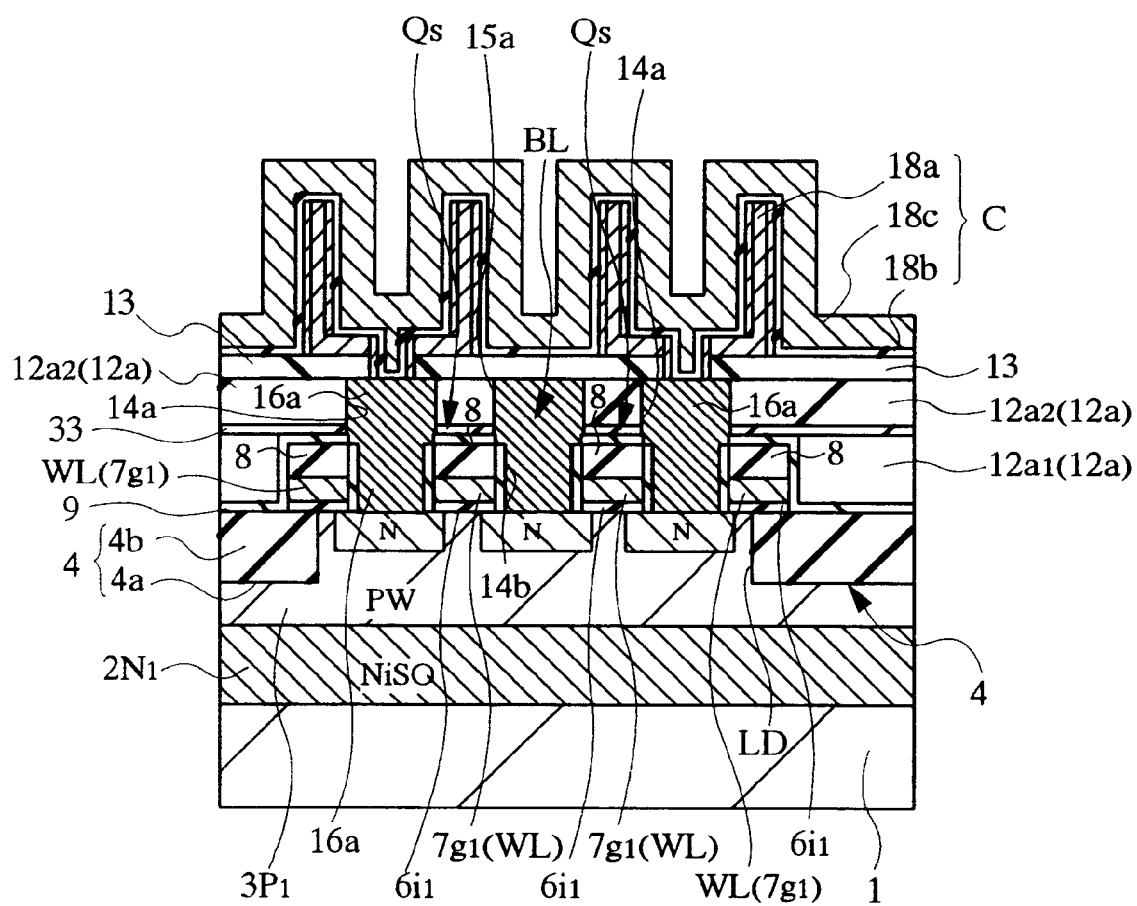
FIG. 48 is a cross-sectional view showing a main portion of the semiconductor integrated circuit device shown in FIG. 47, corresponding to the line A1—A1 in FIG. 2.
Figure 49:
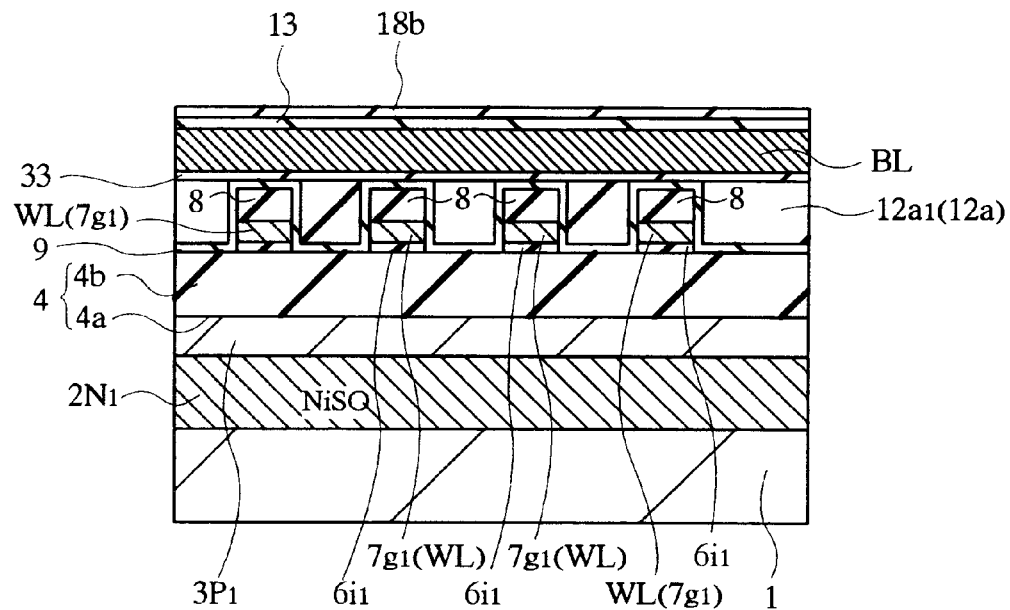
FIG. 49 is a cross-sectional view showing a main portion of the semiconductor integrated circuit device shown in FIG. 47, corresponding to the line A2—A2 in FIG. 2.
Figure 50:
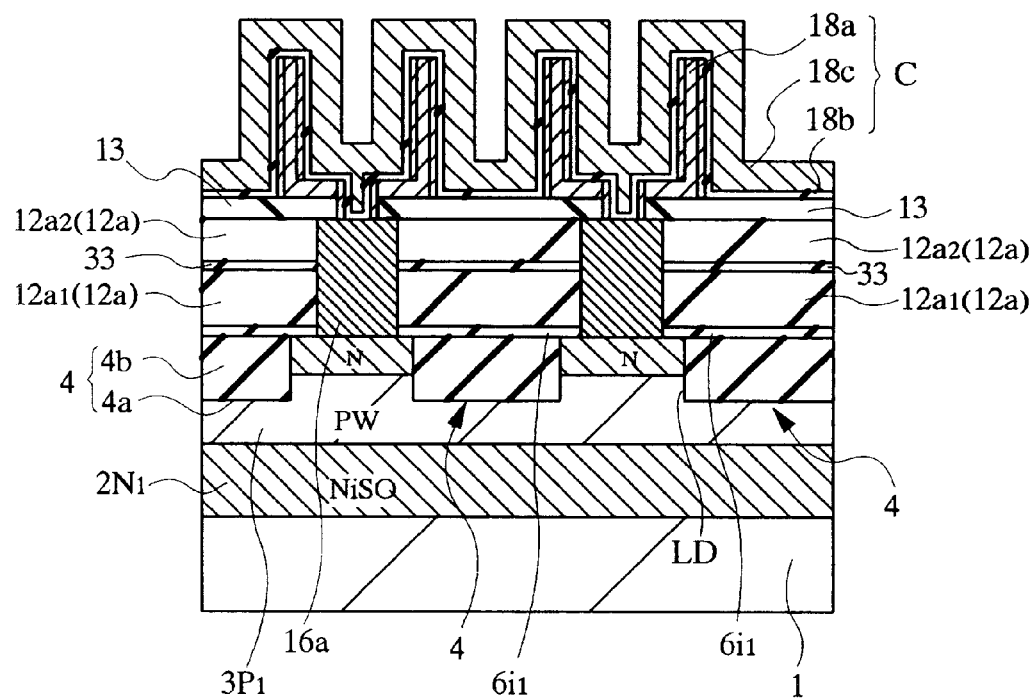
FIG. 50 is a cross-sectional view showing a main portion of the semiconductor integrated circuit device shown in FIG. 47, corresponding to the line B1—B1 in FIG. 2.
Figure 51:
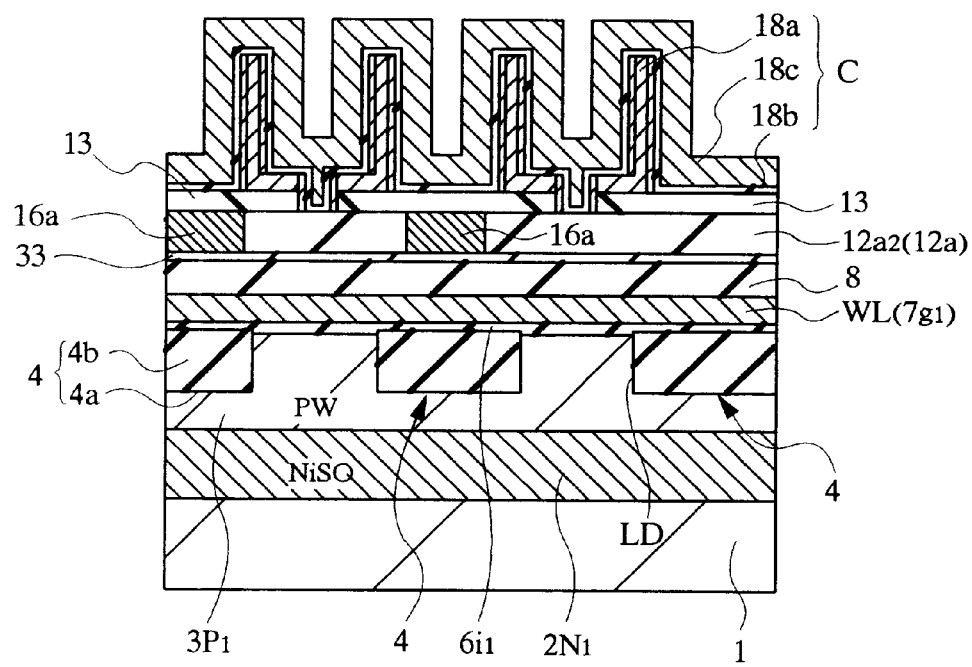
FIG. 51 is a cross-sectional view showing a main portion of the semiconductor integrated circuit device shown in FIG. 47, corresponding to the line B2—B2 in FIG. 2.
Figure 52:
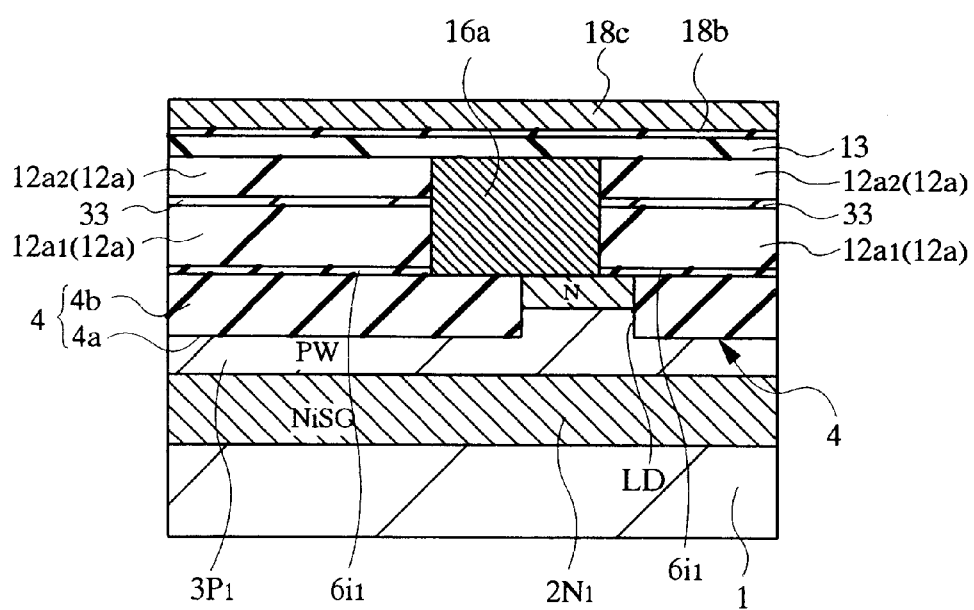
FIG. 52 is a cross-sectional view showing a main portion of the semiconductor integrated circuit device shown in 47, corresponding to the line B3—B3 in FIG. 2.

Next, as shown in FIG. 43, a capacity insulating film 18b and a conductive film 18c1 for forming an upper electrode are coated like in the embodiment 1, and are thereafter subjected to patterning by etching processing as shown in FIG. 44, like in the embodiment 1, thereby to form the upper electrode 18c. At this time, the insulating film 13 in the peripheral circuit region P is removed. In this manner, the parasitic capacity caused by the insulating film 13 can be prevented from being increased. Subsequently, the photoresist pattern 28p is removed. Thereafter, an interlayer insulating film 12b is formed as shown in FIG. 45, like in the embodiment 1, and contact holes 20a to 20d are formed. Thereafter, as shown in FIG. 46, plugs 21a to 21d are formed in the contact holes 20a to 20d like in the embodiment 1, and then, first layer wires 19a to 19d are formed on the interlayer insulating film 12b, like in the embodiment 1. Subsequent steps are the same as those in the embodiment 1, and therefore, explanation thereof will be omitted herefrom.

According to the embodiment 3 as described above, the following advantages can be attained in addition to the advantages obtained by the embodiment 1.

(1) The contact hole 32 between the lower electrode 18a and the plug 16a can be formed in a self-aligning manner, with the side wall 31 provided in the capacitor hole 30 used as an etching mask. Therefore, the fine small contact hole 32 can be formed with excellent positioning precision.

(2) Connection reliability with respect to the contact between the capacitor C and the plug 16a (i.e., the memory cell selection MISFET Qs) can be improved by the advantage (1) described above.

(3) Scale down of the memory cell can be promoted by the advantage (1) described above.

(Embodiment 4)

FIGS. 47 to 52 are cross-sectional views showing a main portion of a semiconductor integrated circuit device as another embodiment of the present invention.

The present embodiment 4 is substantially the same as each of the embodiments 1 to 3 except that the embodiment 4 is constructed so that the bit line capacity can be reduced. That is, in the structure of the present embodiment 4, a thin insulating film 33 made of, for example, a silicon nitride film or the like is formed at an intermediate position in the thickness direction of the interlayer insulating film 12a, as shown in FIGS. 47 to 52. The interlayer insulating films 12a (including 12a1 and 12a2) above and below the insulating film 3 are made of silicon oxide films, like in the embodiment 1.

Wiring grooves 15a and 15b are dug in the interlayer insulating film 12a2 by using the insulating film 33 as an etching stopper. That is, the wiring portions 16b2 and 16d2 of the bit line BL and the local wire 17 are formed on the insulating film 33. Since the conductive member of the bit line BL embedded in the embodiments 1 to 3 described above is provided between memory cell selection MISFET Qs even in the area other than the bit line connection hole 14b, the parasitic capacity of the bit line BL becomes large. According to the arrangement of the embodiment 4, since the wiring portion $16b_2$ of the bit line BL is provided on the insulating film 33 above the memory cell selection MISFET Qs, the parasitic capacity of the bit line BL can be reduced. The same thing applies to the local wire 17.

Contact holes 14a, 14c, and 14e penetrate through the interlayer insulating film 12a2, insulating film 33, and interlayer insulating film 12a1. The plugs 16a, 16c, and 16e inside the holes are electrically connected to the semiconductor regions 5N1, 10P, and 11N below. In addition, contact holes 14b1 and 14d1 penetrate through the insulating film 33 and the interlayer insulating film 12a1, and the contact portions 16b1 and 16d1 inside the holes are electrically connected to the semiconductor regions 5N2, 10P, and 11N. Note that the enlarged plan view of the memory cell region M is the same as FIG. 2 and FIGS. 48 to 52 are respectively cross-sections of FIG. 2 taken along lines A1—A1, A2—A2, B1—B1, and B2—B2.

For example, the following is a description on a method of forming the semiconductor integrated circuit device according to the present embodiment 4.

At first, like in the embodiment 1, an insulating film 9 made of a silicon nitride film or the like is formed, and thereafter, an insulating film is coated thereon. Further, CMP method or the like is effected to remove the insulating film so that the upper surface is flattened, thereby to form an interlayer insulating film 12a1. The insulating film forming this interlayer insulating film 12a1 is formed of a laminated film consisting of a silicon oxide film based on a CVD method or plasma CVD method or a silicon oxide film based on a coating method (SOG: Spin On Glass), and a silicon oxide film formed by a CVD method or plasma CVD method. In addition, the end point of CMP processing is set to the time point when the insulating film 9 on the gate electrodes 7g1, 7g2, and 7g is exposed. Subsequently, a thin insulating film 33 made of, for example, a silicon nitride film or the like is coated on the interlayer insulating film 12a1, by a CVD method (for example, at 700° C. or less) like the insulating film 9. Thereafter, an insulating film made of, for example, a silicon oxide film or the like is coated thereon by a CVD method or the like, and the upper surface thereof a CMP method or the like is effected to flatter, thereby to form an interlayer insulating film 12a2.

Next, a photoresist pattern for forming a wiring groove is formed on the interlayer insulating film 12a2. That is, such a photoresist pattern which exposes a wiring groove formation region is exposed and covers the other regions is formed on the interlayer insulating film 12a2. The portion of the interlayer insulating film 12a2 which is exposed therefrom is etched and removed. Thus wiring grooves 15a and 15b in the interlayer insulating film 12a2 are formed. In this etching processing, by choosing such an etching condition in which the silicon oxide film is removed faster than the silicon nitride film, only the interlayer insulating film 12a made of a silicon oxide film is etched and removed, and the insulating film 33 made of a silicon nitride film is made to serve as an etching stopper. In this manner, the wiring grooves 15a and 15b are prevented from being etched excessively.

Next, the above-mentioned photoresist pattern for forming the wiring grooves is removed, and thereafter, a photoresist pattern for forming contact holes is formed on the interlayer insulating film 12a1 and the insulating film 33. That is, a photoresist pattern which exposes the semiconductor regions 5N1, 5N2, 10P, and 11N and covers the other regions is formed, and thereafter, those portions of the interlayer insulating film 12a2, insulating film 33, and interlayer insulating film 12a1 that are exposed from the pattern are etched and removed by using the pattern as an etching mask. Thus contact holes 14a to 14e in the insulating film 33 and the interlayer insulating film 12a1 are formed.

In the etching processing for forming these contact holes 14a to 14e, the same SAC technique as adopted in the embodiment 1 is used to make the following processing, for example. At first, in the first etching processing, etching processing is performed under a condition that the etching rate of the silicon oxide film is higher than that of the silicon nitride film, thereby to remove the portion of the interlayer insulating film 12a2 made of a silicon oxide film or the like. At this time, the interlayer insulating film 12a2 has already been removed from the contact hole formation regions of the bit line BL and the local wire 17, while etching is not been effected on these regions since the insulating film 33 made of silicon nitride film is provided in these regions. Subsequently, in the second etching processing, etching processing is performed under a condition that the etching rate of the silicon nitride film is higher than that of the silicon oxide film, thereby to etch and remove the portion of the insulating film 33. Thereafter, etching processing is performed again under the same condition as the first etching processing, thereby to etch and remove the portion of the lower interlayer insulating film 12a1. Finally, the silicon oxide film and the silicon nitride film are placed under the condition that they are etched at the same selectivity, and the portion of the insulating film 9 provided on the semiconductor substrate 1 is etched and removed by further setting a condition including the etching time or the like so that this portion is completely removed in its thickness direction. The upper surface of the semiconductor substrate 1 is thereby exposed. Subsequent steps may be the same as those explained in the embodiments 1 to 3, and therefore, explanation of those steps will be omitted herefrom.

According to the present embodiment 4 as described above, the following advantages can be obtained in addition to the advantages obtained in the embodiment 1.

(1) Since the structure can be arranged such that the wiring portions 16b2 and 16d2 of the bit line BL and the local wire 17 do not exist between word lines WL, adjacent to each other, the parasitic capacity between the bit line BL and the word line WL of the memory cell selection MISFET Qs can be reduced.

(2) Owing to the advantage (1), information in the capacitor C can be read with a low voltage.

(3) Owing to the advantage (1), information accumulated in the capacitor C can be read at a high rate.

(4) Since separate photo-masks are utilized for transferring the contact hole 14b of the bit line BL and the wiring groove 15a and for the contact hole 14a of the capacitor C, the distance from the contact hole 14b of the bit line BL and the wiring groove 15a to the contact hole 14a can be reduced. Therefore, it is possible to promote scale down on the memory cells and thus the degree of integration for forming the memory cells can be improved.

(Embodiment 5)

FIGS. 53 to 61 are sectional views showing a main portion of a semiconductor integrated circuit device as another embodiment of the present invention in steps of manufacturing the same.

The present embodiment 5 is substantially the same as the embodiments 1 to 4 except for the structure of the capacitor for information storage and the connection structure between the capacitor and the memory cell selection MISFET.

Figure 53:
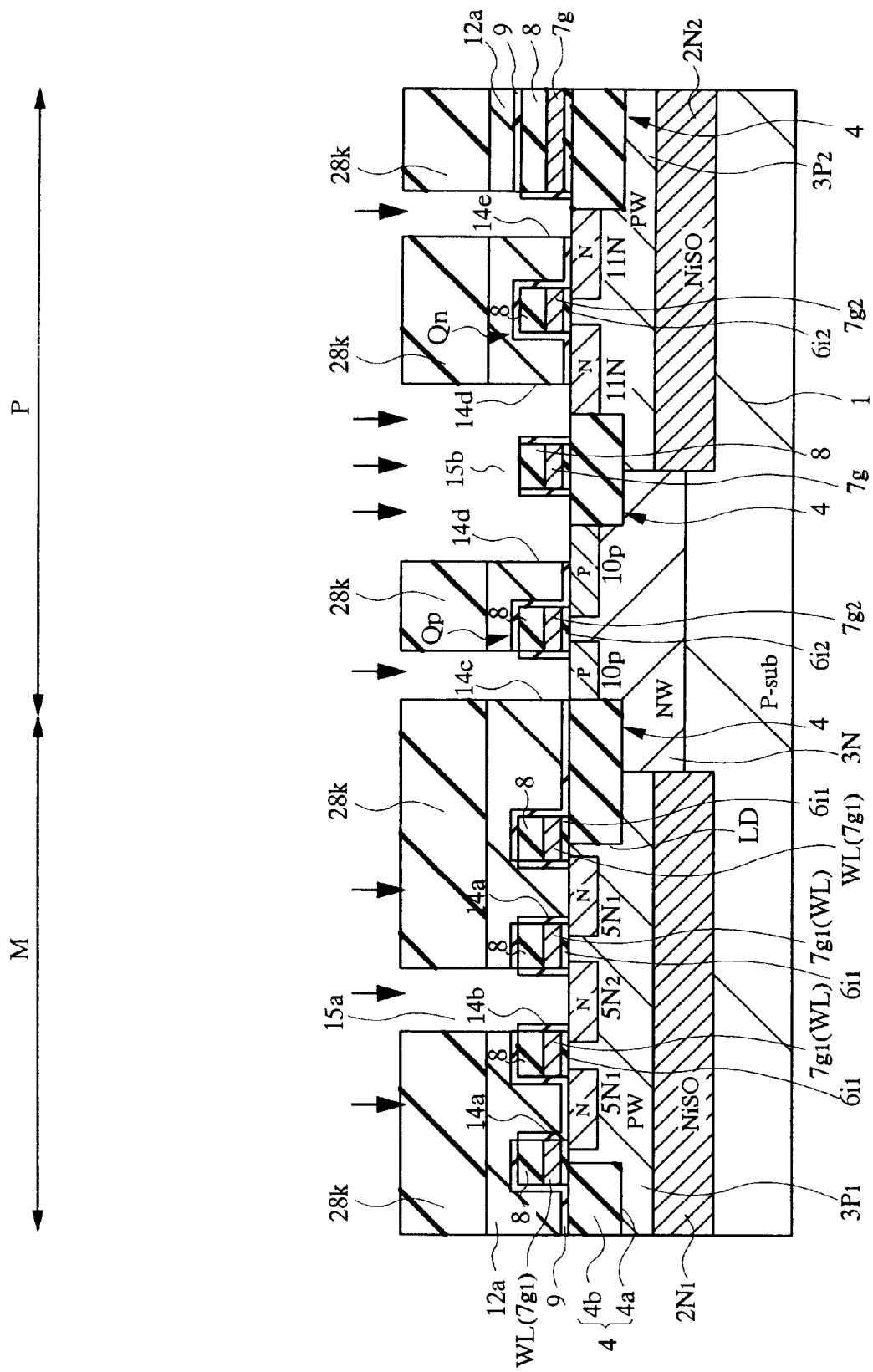
FIG. 53 is a cross-sectional view showing a main portion of a semiconductor integrated circuit device as another embodiment of the present invention, in a manufacturing step thereof.

At first, after the steps explained in FIGS. 8 to 23 in the embodiment 1, an interlayer insulating film 12a made of, for example, a silicon oxide film or the like is formed on the major surface of the semiconductor substrate 1, as shown in FIG. 53, like the embodiment 1 described above. Subsequently, a photoresist pattern 28s for forming the bit line, the wiring grooves for the local wire, and the contact holes in the peripheral circuit region is formed. That is, a photoresist pattern 28s is formed such that it exposes the formation regions of the bit line, wiring grooves for the local wire, and contact holes in the peripheral circuit region and covers the other regions and particularly the regions for forming the contact holes for the capacitor, unlike the embodiment 1. Thereafter, with this photoresist pattern 28s used as an etching mask, etching processing is performed in a manner similar to that of the embodiment 1 thereby to form contact holes 14b to 14e and wiring grooves 15a and 15b.

Figure 54:
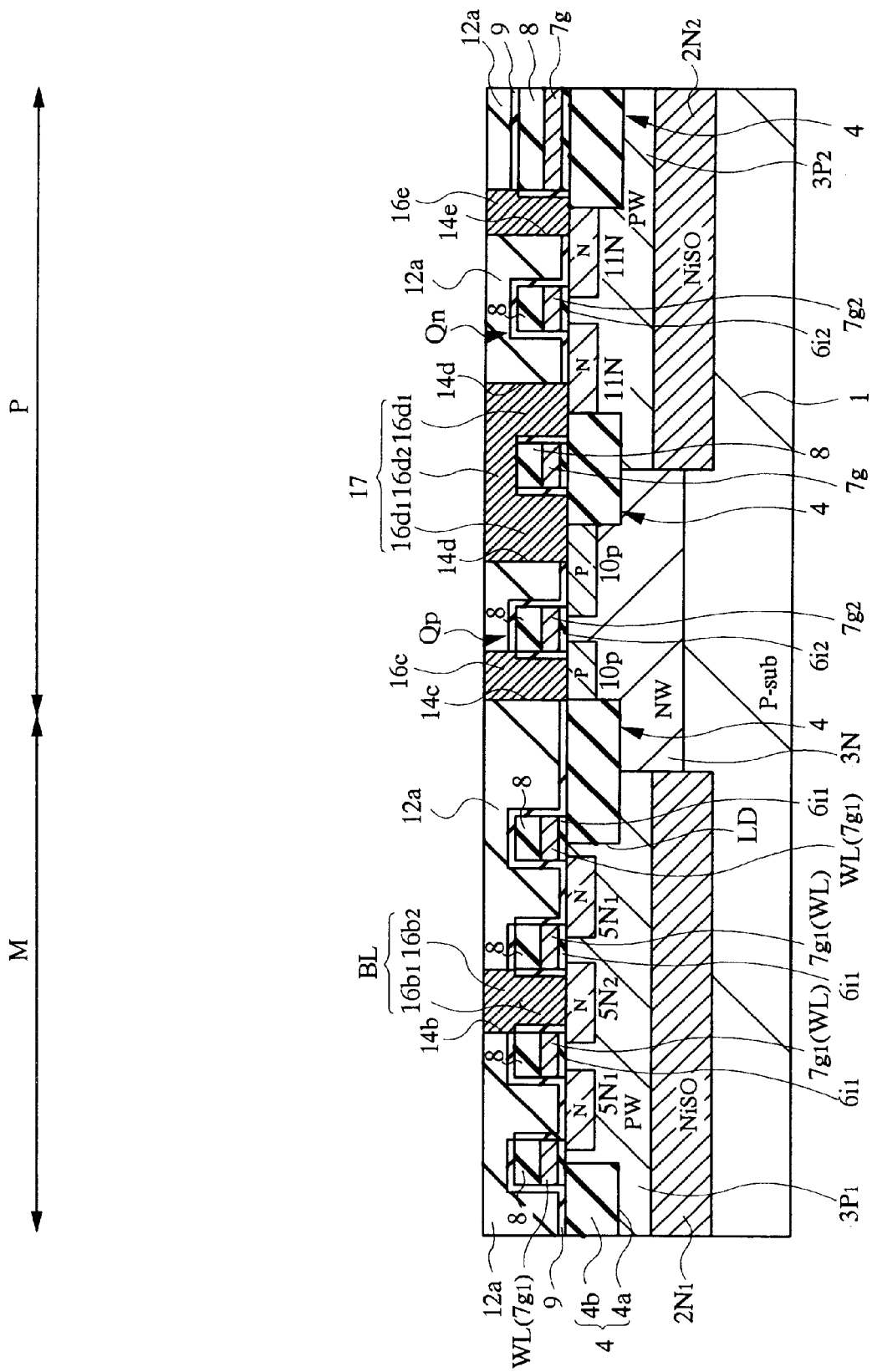
FIG. 54 is a cross-sectional view showing a main portion of the semiconductor integrated circuit device in a manufacturing step subsequent to the step of FIG. 53.

Next, like in the embodiment 1, an insulating film is deposited on the entire surface of the semiconductor substrate 1, and thereafter, anisotropic etching is carried out to form a new insulating film (which is preferably a silicon nitride film formed by a CVD method under a temperature condition of, for example, 700° C. or less) only on the side surfaces of the contact holes 14b to 14e and the wiring grooves 15a and 15b. In this manner, it is possible to further improve (a) the insulation between the gate electrodes 7g1, 7g2, and 7g and the contact hole 14b for the bit line and (b) the insulation between the bit line and the capacitor storage node. Subsequently, as shown in FIG. 54, a conductive film is embedded in the contact holes 14b to 14e and the wiring grooves 15a and 15b, like in the embodiment 1, and the bit line BL, plugs 16c and 16e, and local wire 17 are formed.

Figure 55:
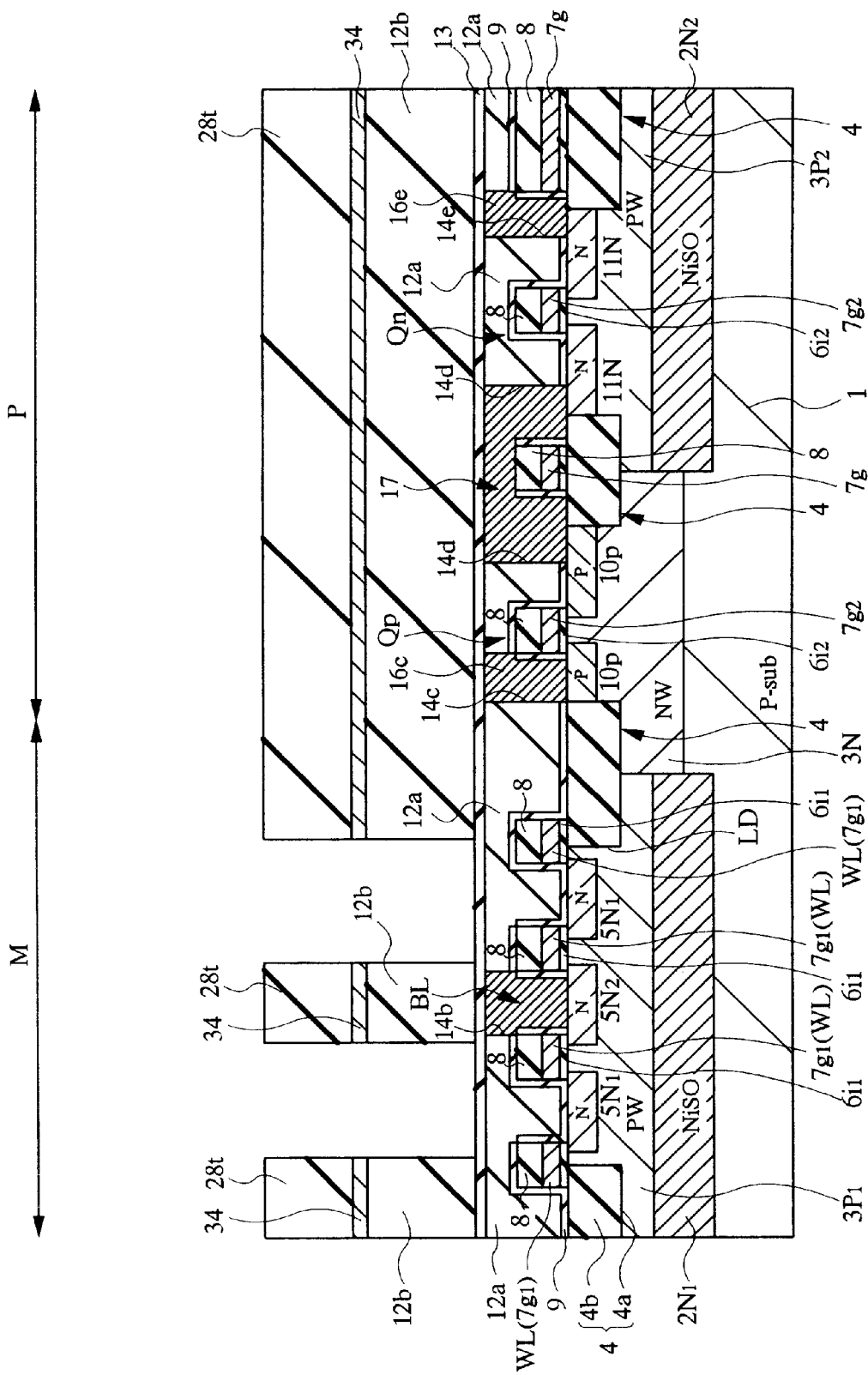
FIG. 55 is a cross-sectional view showing a main portion of the semiconductor integrated circuit device in a manufacturing step subsequent to the step of FIG. 54.

Next, as shown in FIG. 55, an insulating film 13 made of, for example, a silicon nitride film is formed so as to cover the interlayer insulating film 12a, plugs 16c and 16e, bit line BL, and local wire 17, like in the embodiment 3. Subsequently, an interlayer insulating film 12b made of, for example, a silicon oxide film is formed thereon, and thereafter, a conductive film 34 made of, for example, low resistance polysilicon is deposited thereon by a CVD method or the like. This conductive film 34 is used as a mask when an insulating film made of a silicon oxide film described later (which is a side wall for forming contact holes in the capacitor) is removed by wet etching processing. Thereafter, a photoresist pattern 28t for forming a capacitor hole for forming the lower electrode of the capacitor is formed on the conductive film 34, and thereafter, the capacitor hole 30 is formed in the conductive film 34 and the interlayer insulating film 12b, by using the pattern 28t as an etching mask. When the etching processing is carried out, the etching condition is determined such that a high selectivity can work on the silicon oxide film and the silicon nitride film and the silicon oxide film is etched at a rate higher than that of the silicon nitride film, in a manner similar to that of the embodiment 1, and the insulating film 13 is made to serve as an etching stopper.

Figure 56:
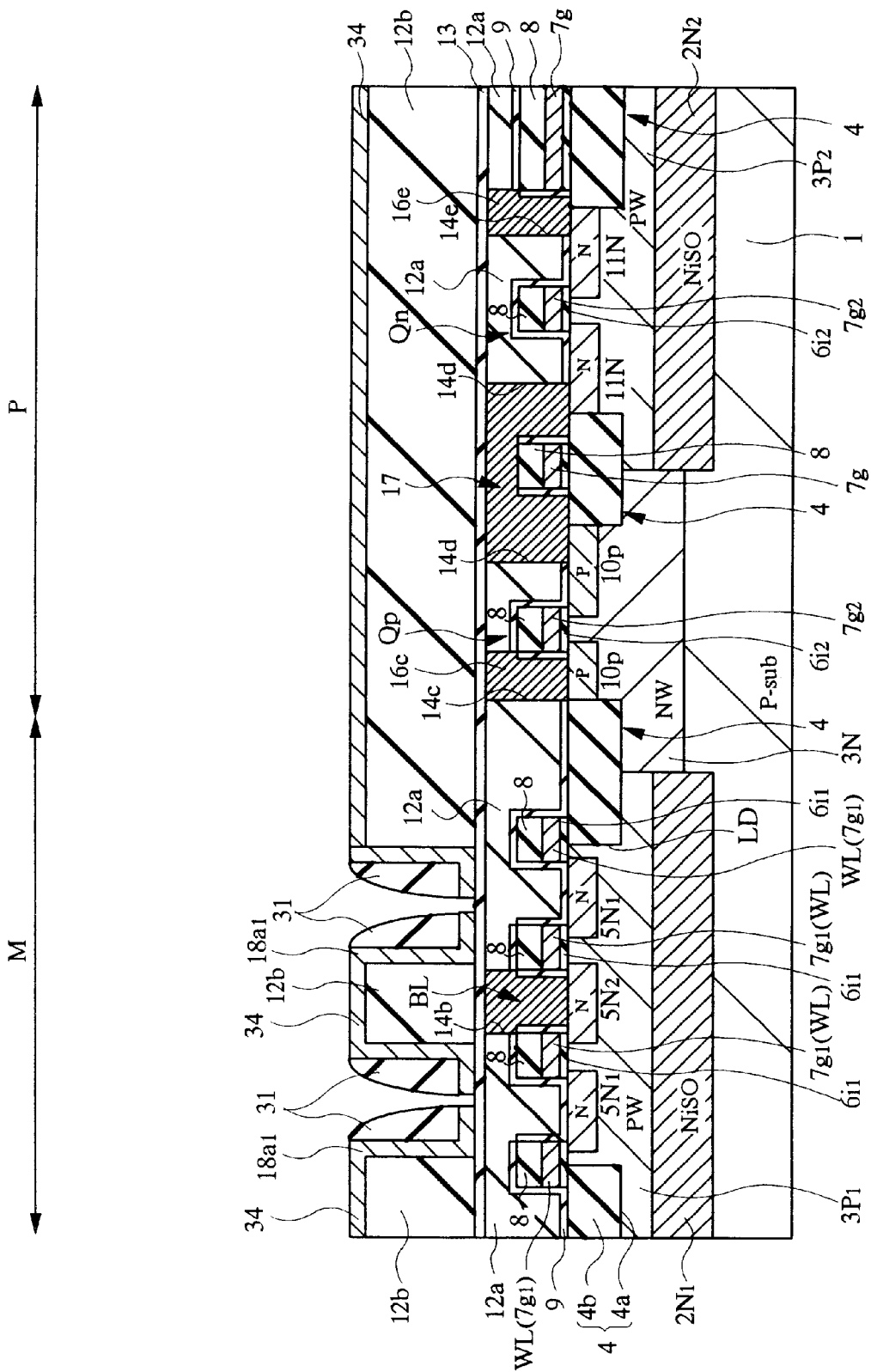
FIG. 56 is a cross-sectional view showing a main portion of the semiconductor integrated circuit device in a manufacturing step subsequent to the step of FIG. 55.

Next, the photoresist pattern 28*t* is removed, and thereafter, as shown in FIG. 56, a conductive film 18a1 for forming the lower electrode of the capacitor is formed in the capacitor hole 30, like in the embodiment 3, a side wall 31 made of, for example, a silicon oxide film is formed on the inner side surfaces of the capacitor hole 30. Subsequently, with the conductive film 34 and the side wall 31 used as masks, the portion of the conductive film 18a1 exposed therefrom is removed thereby to expose the insulating film 13 in the region where the film 18a1 is removed. At this time, by operating the etching selectivity like in the above, the insulating film 13 made of a silicon nitride film is made to serve as an etching stopper. Thereafter, the side wall 31 is removed by a wet etching method using a hydrofluoric acid or the like, for example. At this time, the conductive film 34 as described above is made to serve as an etching stopper such that the interlayer insulating film 12*b* below is not removed.

Figure 57:
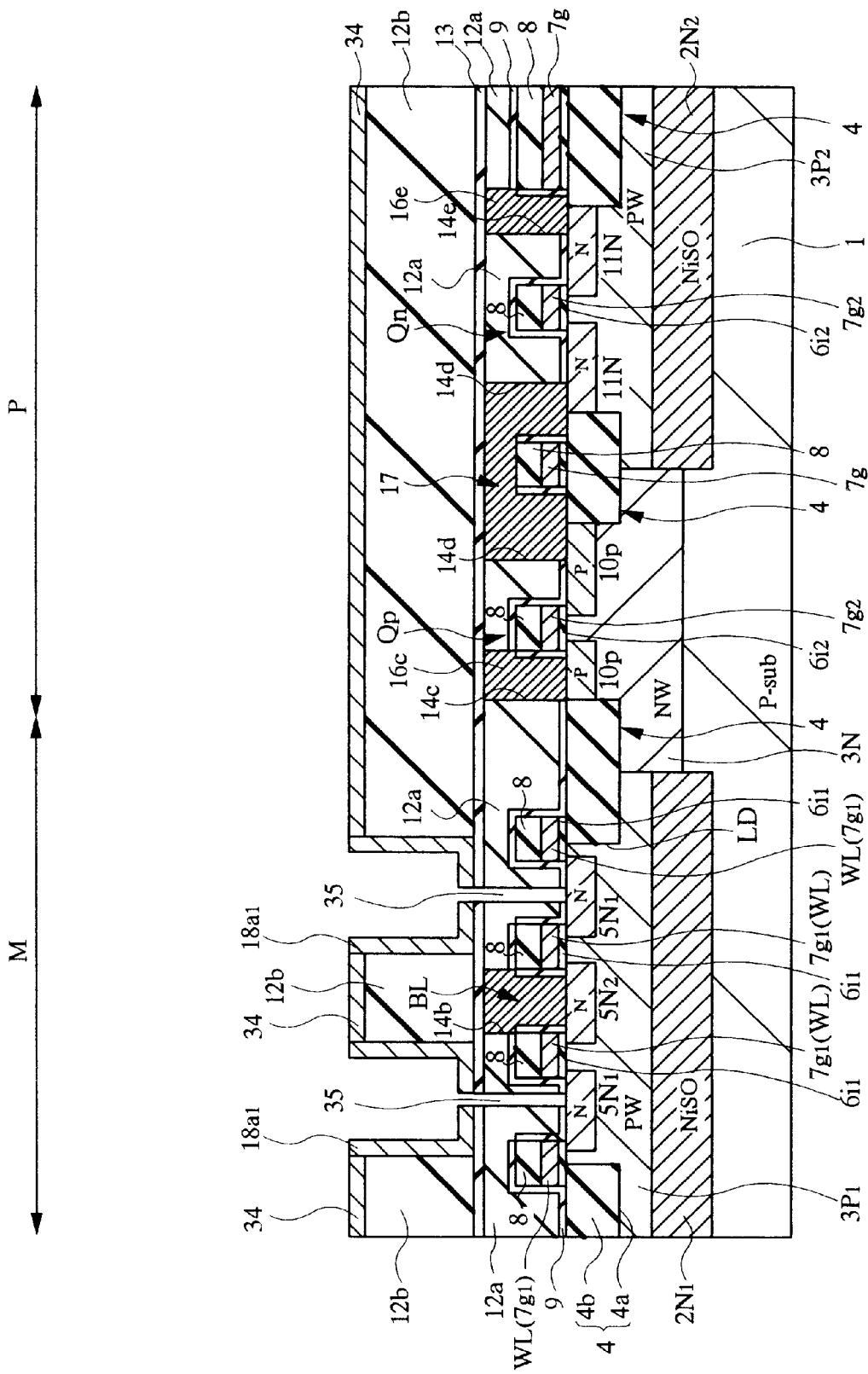
FIG. 57 is a cross-sectional view showing a main portion of the semiconductor integrated circuit device in a manufacturing step subsequent to the step of FIG. 56.

Next, as shown in FIG. 57, with the conductive films 34 and 18a1 used as etching masks, the portions of the insulating film 13, interlayer insulating film 12*b*, and insulating film 9 that are exposed therefrom are etched and removed thereby to form a contact hole 35 at the bottom portion of the capacitor hole 30 so that the semiconductor region 5N1 of the memory cell selection MISFET Qs is exposed thereat. In this etching processing, the hole is formed by the SAC technique like the contact hole 14*a* in the embodiment 1, after etching and removing that portion of the insulating film 13. In this stage, there normally occurs a problem of position alignment between the contact hole 35 and the bit line BL. In the present embodiment, the insulating film made of a silicon nitride film provided on the side surfaces of the wiring groove 15*a* of the bit line BL and the contact hole 14*b* functions as an etching stopper when forming the contact hole 35 of the capacitor. Therefore, the bit line BL is not exposed from the contact hole 35 even if the plan position of the contact hole 35 shifts more or less to overlap the bit line BL when forming the contact hole 35. Therefore, compared with the case in which the silicon nitride film is not provided, the insulation can be improved so that the refresh characteristic due to a leakage current can be prevented from being deteriorated.

Figure 58:
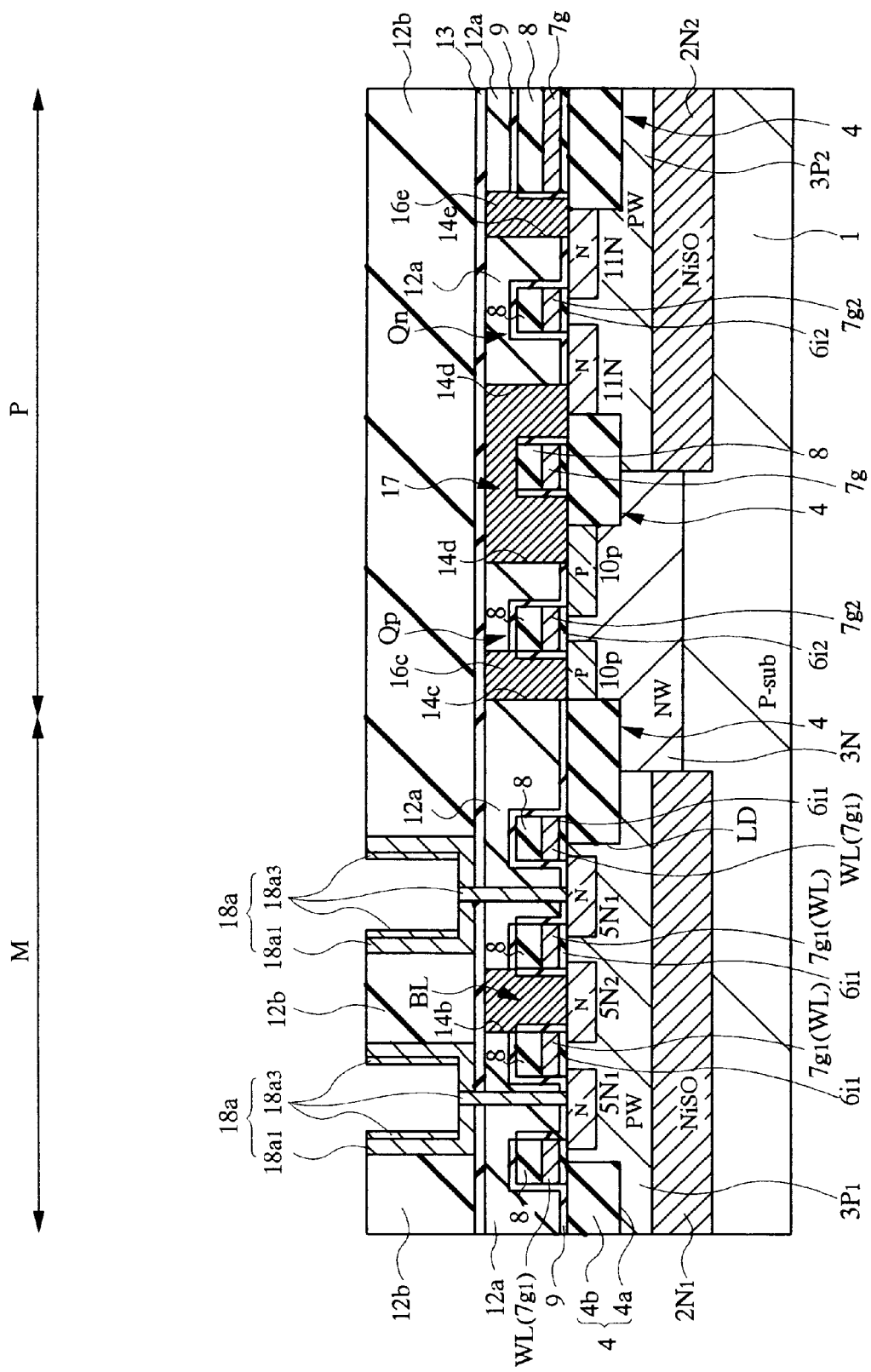
FIG. 58 is a cross-sectional view showing a main portion of the semiconductor integrated circuit device in a manufacturing step subsequent to the step of FIG. 57.

Next, for example, phosphorus is ion-implanted at a doze amount of about $1 \times 10^{13}/cm^2$ or less into the semiconductor substrate 1 through the contact hole 35. This ion-implantation is carried out to prevent deterioration of the refresh characteristic by relaxing the electric field applied to the semiconductor region 5N1 of the memory cell selection MISFET Qs electrically connected to the storage node portion of the capacitor. Subsequently, a conductive film made of, for example, n-type low resistance polysilicon is deposited on the major surface of the semiconductor substrate 1 by a CVD method or the like, and the conductive film is thereby embedded into the contact hole 35. Thereafter, the conductive film 34 on the conductive film and the interlayer insulating film 12*b* is etched back by an anisotropic etching method. FIG. 58 shows a cross-section of a main portion of the semiconductor substrate 1 after this processing. In the capacitor hole 30, a lower electrode 18*a* is formed. The lower electrode 18*a* is formed of the conductive film 18a1 and a remaining portion of the conductive film 18a3 which is thereafter deposited. This conductive film 18a3 is formed on the side wall side of the capacitor hole 30 and in the contact hole 35. Although the conductive film made of a lower resistance polysilicon or the like on the bottom portion of the capacitor hole 30 is etched in this etch-back processing, the low resistance polysilicon film at the bottom portion is formed of a layered film consisting of two low resistance polysilicon films and is therefore so thick that the film remains after the anisotropic etching processing. Also, the other portion of the interlayer insulating film 12*b* than the portion thereof which has existed in the capacitor hole 30 is kept remaining, and therefore, the flatness is maintained.

Figure 59:
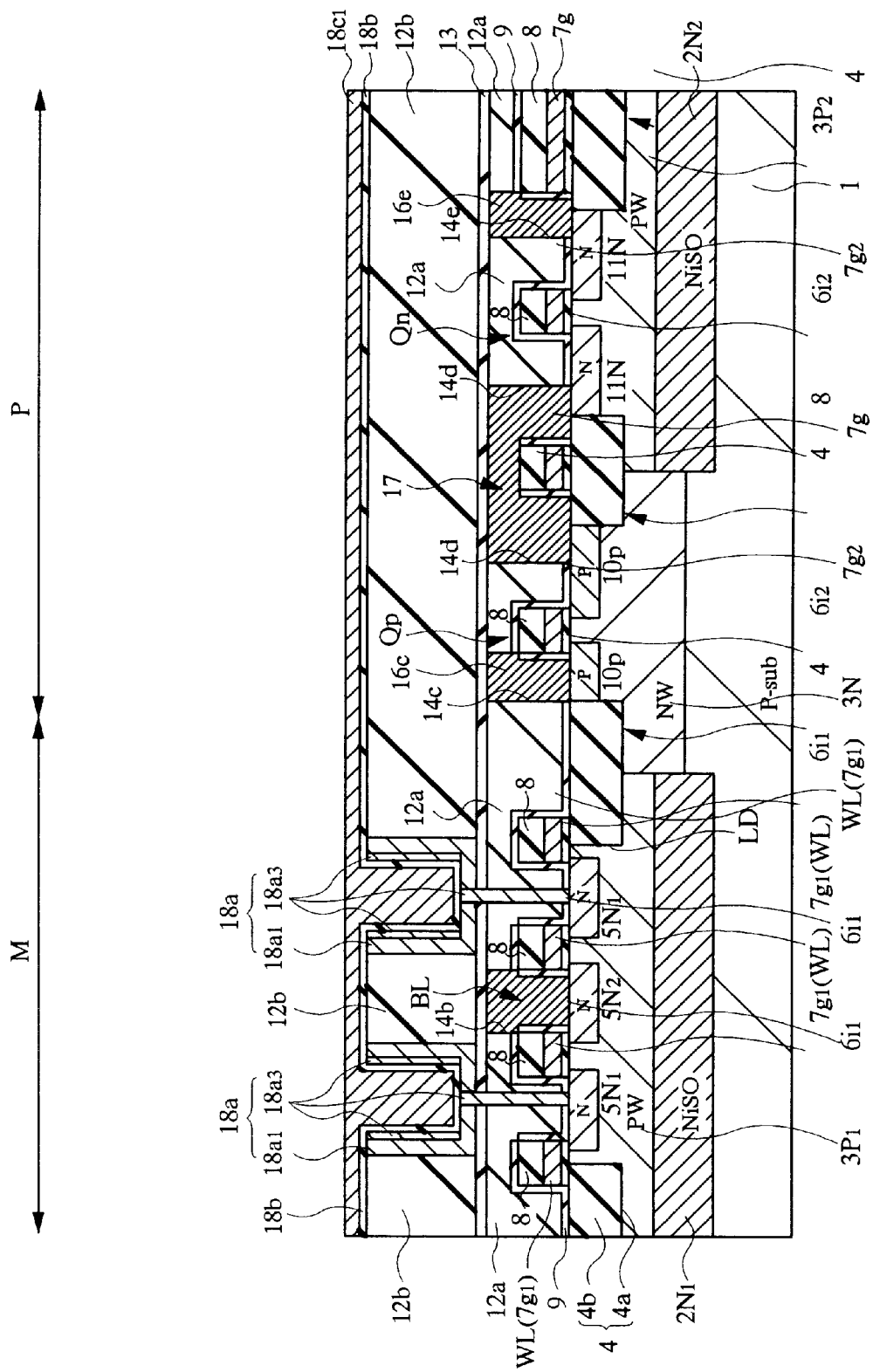
FIG. 59 is a cross-sectional view showing a main portion of the semiconductor integrated circuit device in a manufacturing step subsequent to the step of FIG. 58.
Figure 60:
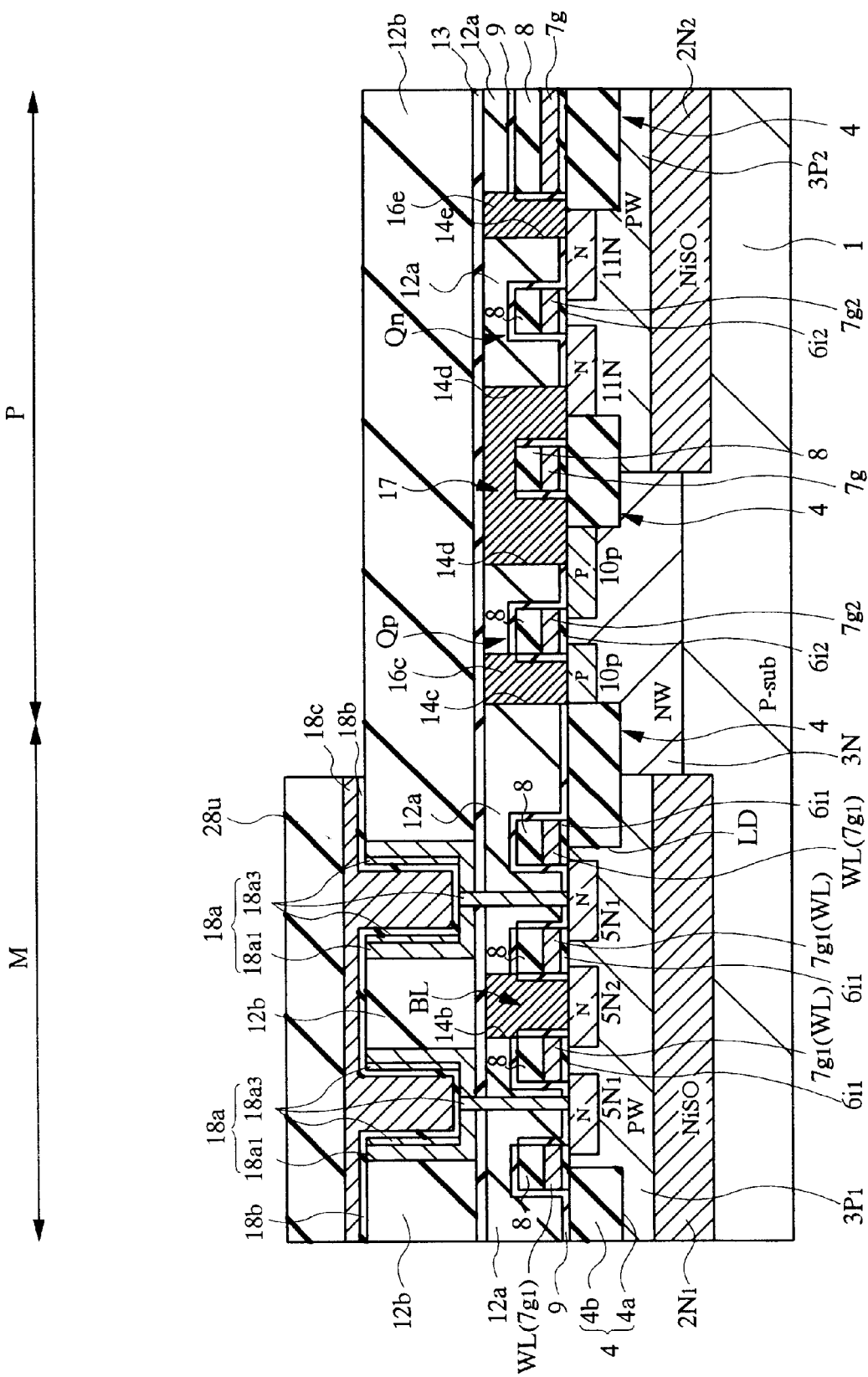
FIG. 60 is a cross-sectional view showing a main portion of the semiconductor integrated circuit device in a manufacturing step subsequent to the step of FIG. 59.
Figure 61:
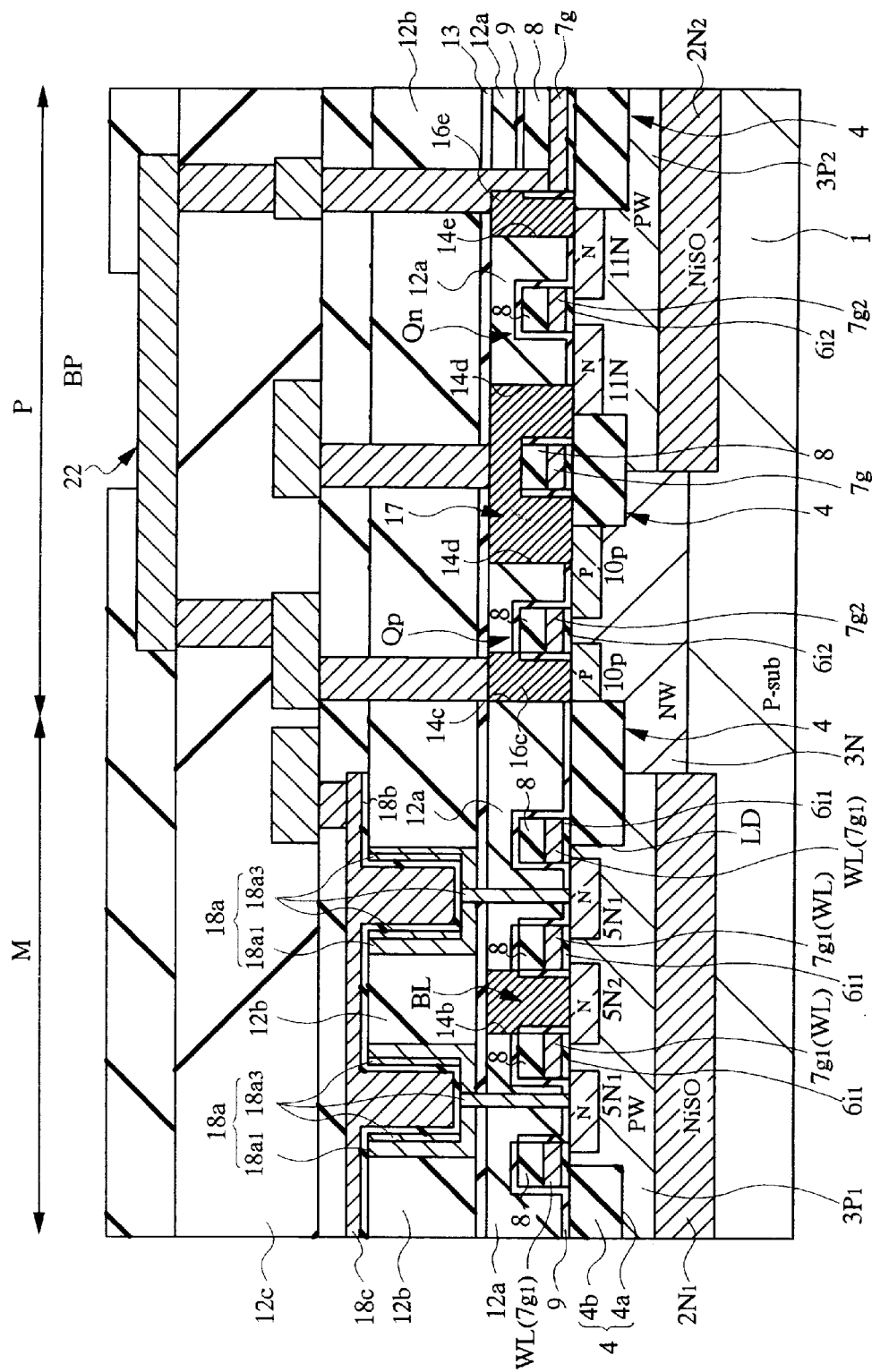
FIG. 61 is a cross-sectional view showing a main portion of the semiconductor integrated circuit device in a manufacturing step subsequent to the step of FIG. 60.

Next, as shown in FIG. 59, after forming the capacity insulating film 18*b* and the conductive film 18c1 for forming the upper electrode, a thermal treatment is performed like in the embodiment 1. Subsequently, as shown in FIG. 60, a photoresist pattern 28*u* for forming the upper electrode is formed on the conductive film 18c1 like in the embodiment 1, and thereafter, the upper electrode 18*c* is subjected to patterning by using the pattern 28*u* as an etching mask. In this manner, the capacitor C is formed. The capacitor C according to the present embodiment 5 has a structure in which the capacity is provided only in the inner wall surface side of the ring-like lower electrode 18*a*. Subsequent steps which are the same as those in the embodiment 1 are carried out, and thus, a DRAM as shown in FIG. 61 is manufactured.

According to the present embodiment 5 as described above, the following advantages can be obtained in addition to the advantages obtained in the embodiment 1.

(1) The structure is arranged such that the capacitor hole 30 is formed in the interlayer insulating film 12*b*, the lower electrode 18*a* of the capacitor C is provided in the hole, and the interlayer insulating film 12*b* is left unremoved in the periphery thereof. Therefore, the step between the memory cell region M and the other regions can be reduced, so that the flatness of the interlayer insulating film 12*c* as an underlaying layer of the first layer wires 19*a* to 19*d* can be improved.

(2) Due to the advantage (1), it is possible to reduce the dimensions of the wires in the wiring layer on the interlayer insulating film 12*c*, as well as the interval distance between adjacent wires.

(Embodiment 6)

Figure 62:
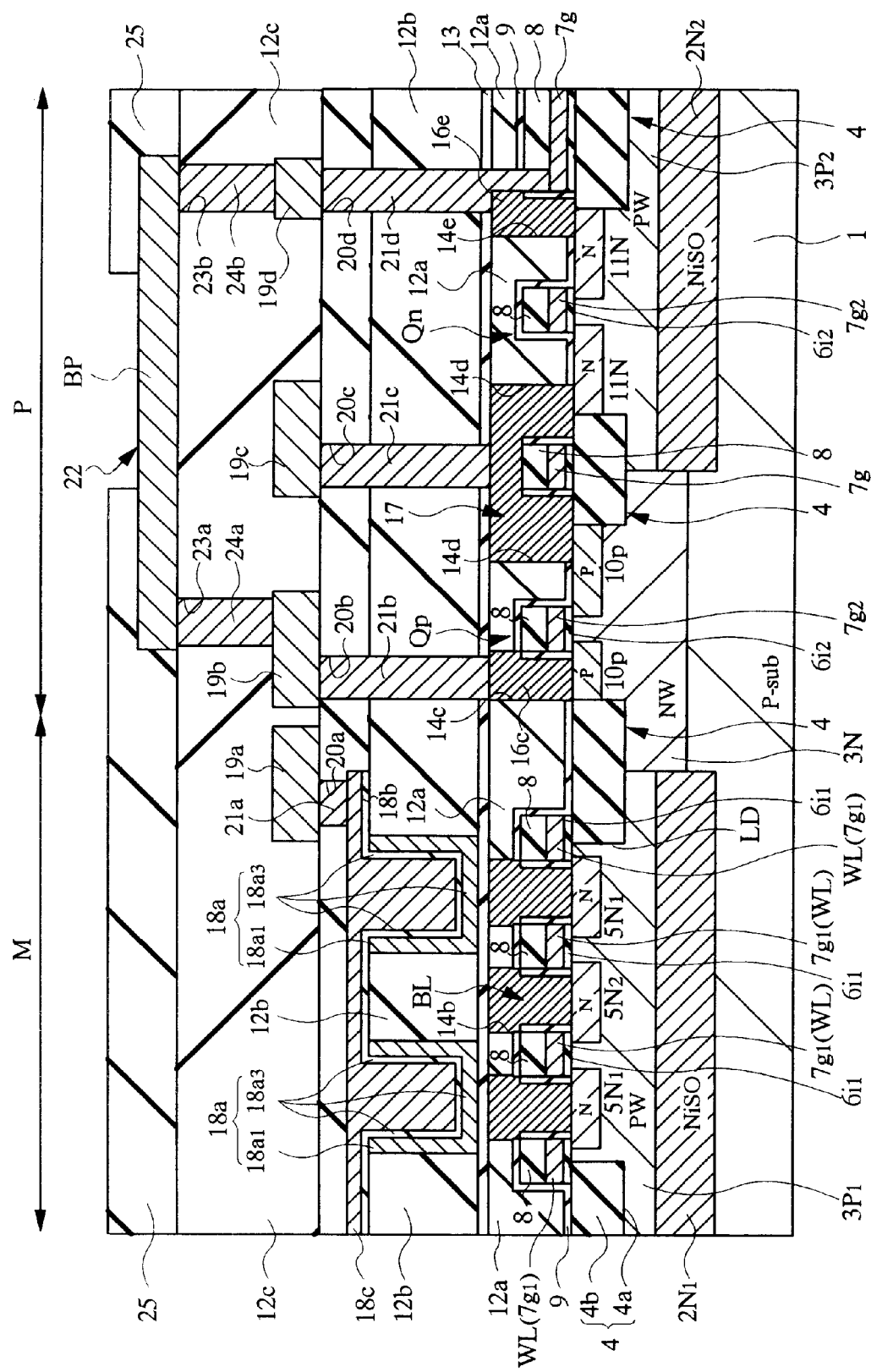
FIG. 62 is a cross-sectional view showing a main portion of a semiconductor integrated circuit device as another embodiment of the present invention, in a manufacturing step thereof.
Figure 63:
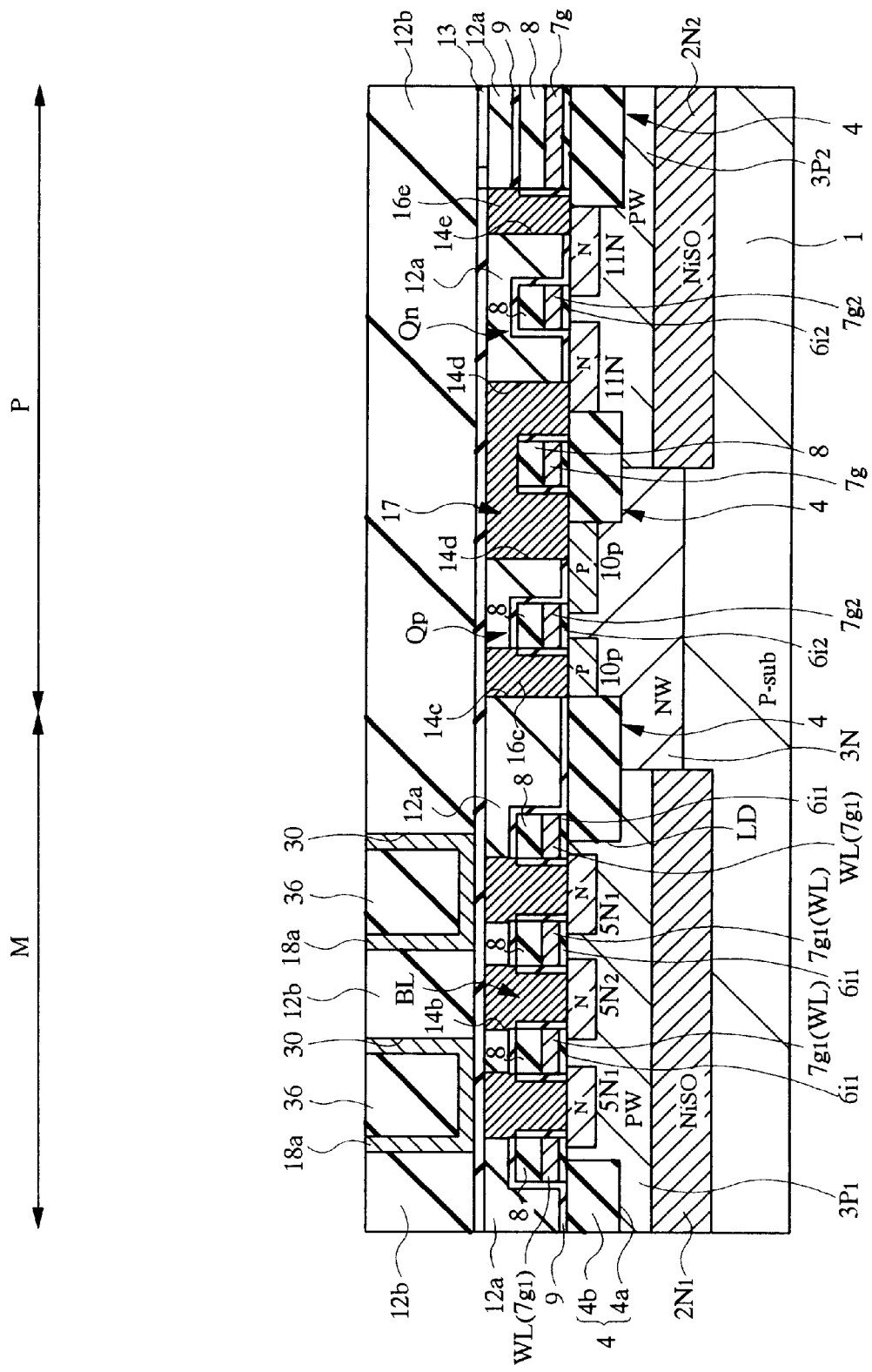
FIG. 63 is a cross-sectional view showing a main portion of the semiconductor integrated circuit device in a manufacturing step subsequent to the step of FIG. 62.
Figure 64:
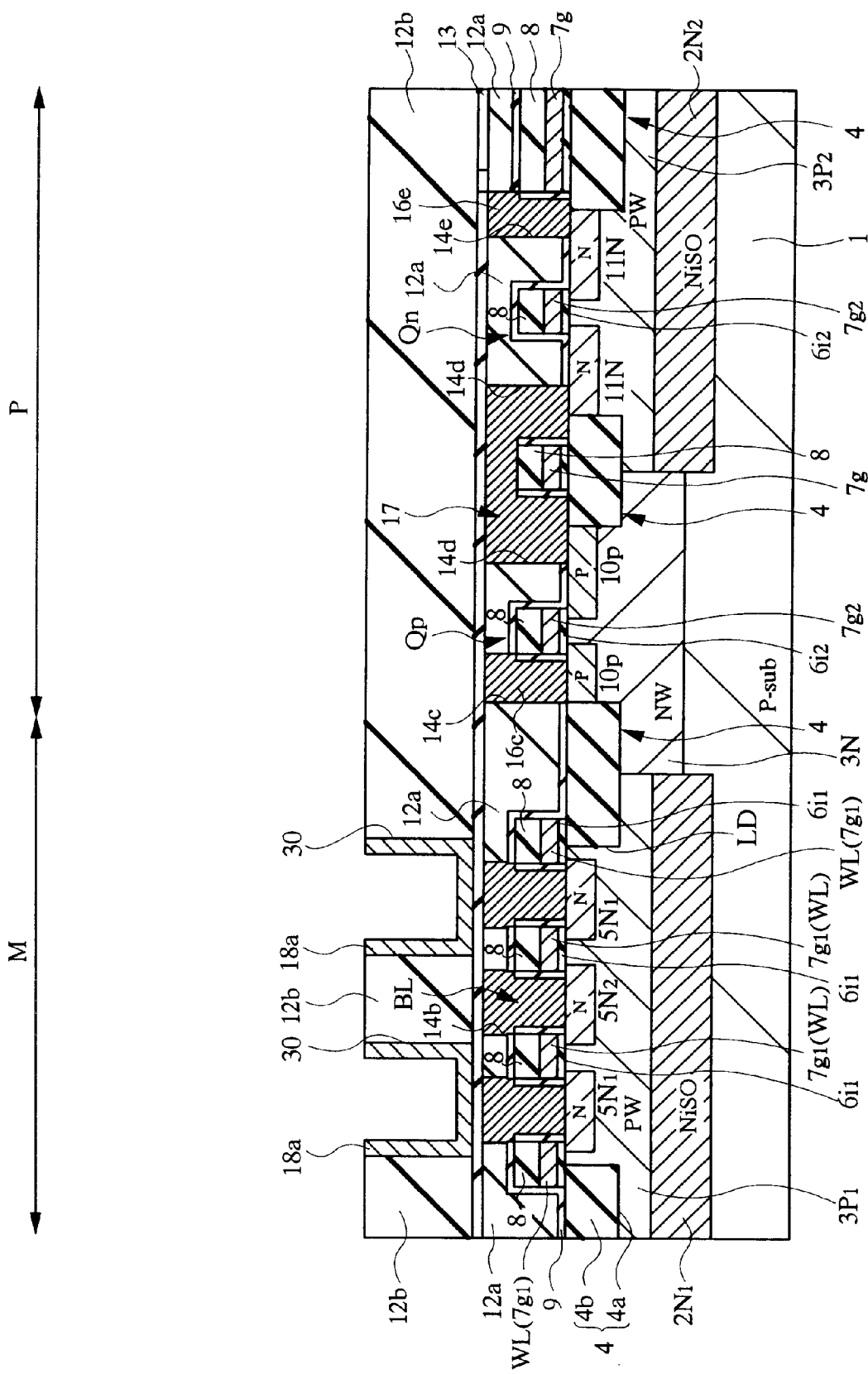
FIG. 64 is a cross-sectional view showing a main portion of the semiconductor integrated circuit device in a manufacturing step subsequent to the step of FIG. 63.

FIG. 62 is a cross-sectional view showing a main portion of a semiconductor integrated circuit device as another embodiment of the present invention. FIGS. 63 and 64 are cross-sectional views showing a main portion of the semiconductor integrated circuit device of FIG. 2, in manufacturing steps thereof.

The embodiment 6 is substantially the same as the embodiment 1 except for the structure of the capacitor for information storage and the forming method thereof. That is, in the present embodiment 6, as shown in FIG. 62, the capacity of the capacitor C is formed on the outer side surfaces of the lower electrode 18*a* thereof but is formed on the inner side surfaces thereof. The lower electrode 18*a* of the capacitor C is electrically connected to the semiconductor region 5N1 of the memory cell selection MISFET Qs through the plug 16*a*.

Next, the method of manufacturing the DRAM according to the present embodiment 6 will be explained. At first, after the manufacturing steps explained with reference to FIGS. 8 to 25 in the embodiment 1 have been executed, an interlayer insulating film 12*b* made of, for example, a silicon oxide film is formed on the insulating film 13 like in the embodiment 5. Note that a polysilicon film need not be formed on the interlayer insulating film 12b in the present embodiment 6 although a polysilicon film is deposited on the interlayer insulating film 12b in the embodiment 5. Subsequently, a capacitor hole 30 is formed in the interlayer insulating film 12b, like in the embodiment 5, and thereafter, a conductive film made of, for example, n-type low resistance polysilicon is coated on the upper surface of the interlayer insulating film 12b and the inside of the capacitor hole 30. Further, a SOG film is coated thereon. Thereafter, in order to make the SOG film dense, a heat treatment is carried out, for example, at 500° C. or less. Subsequently, anisotropic etching processing is carried out to etched back the SOG film thereby to remove the SOG film except for the SOG film provided inside of the capacitor hole, whereby the SOG film remains only in the capacitor hole 30. Thereafter, by using the remaining SOG film 36 as an etching mask, anisotropic etching is effected to remove the conductive film on the interlayer insulating film 12b which is exposed through the mask, thereby to form the lower electrode 18a in the capacitor hole 30.

Next, the SOG film remaining in the capacitor hole 30 is removed, for example, by wet etching processing with use of a hydrofluoric acid, as shown in FIG. 64. At this time, the surface of the interlayer insulating film 12b is more or less etched. However, since the etching rate of the SOG film 36 made dense at 500° C. or less is much higher than that of the interlayer insulating film 12b formed of a silicon oxide film or the like by a CVD method, the film thickness of the surface portion of the interlayer insulating film 12b which is etched and removed while etching and removing the SOG film 36 is small. In addition, after the interlayer insulating film 12b is deposited, an insulating film made of a silicon nitride film or the like is formed thereon (at 700° C. or less), and this insulating film is made to serve as an etching stopper during the wet etching processing. The same steps as those in the embodiments 1 to 5 are performed subsequently, and the capacitor C, wire, and surface protection film 25 are formed as shown in FIG. 62. The DRAM is thus completed.

According to the embodiment 6 as described above, the advantages obtained in the embodiment 5 can be obtained in addition to the advantages obtained in the embodiment 1.
(Embodiment 7)

Figure 65:
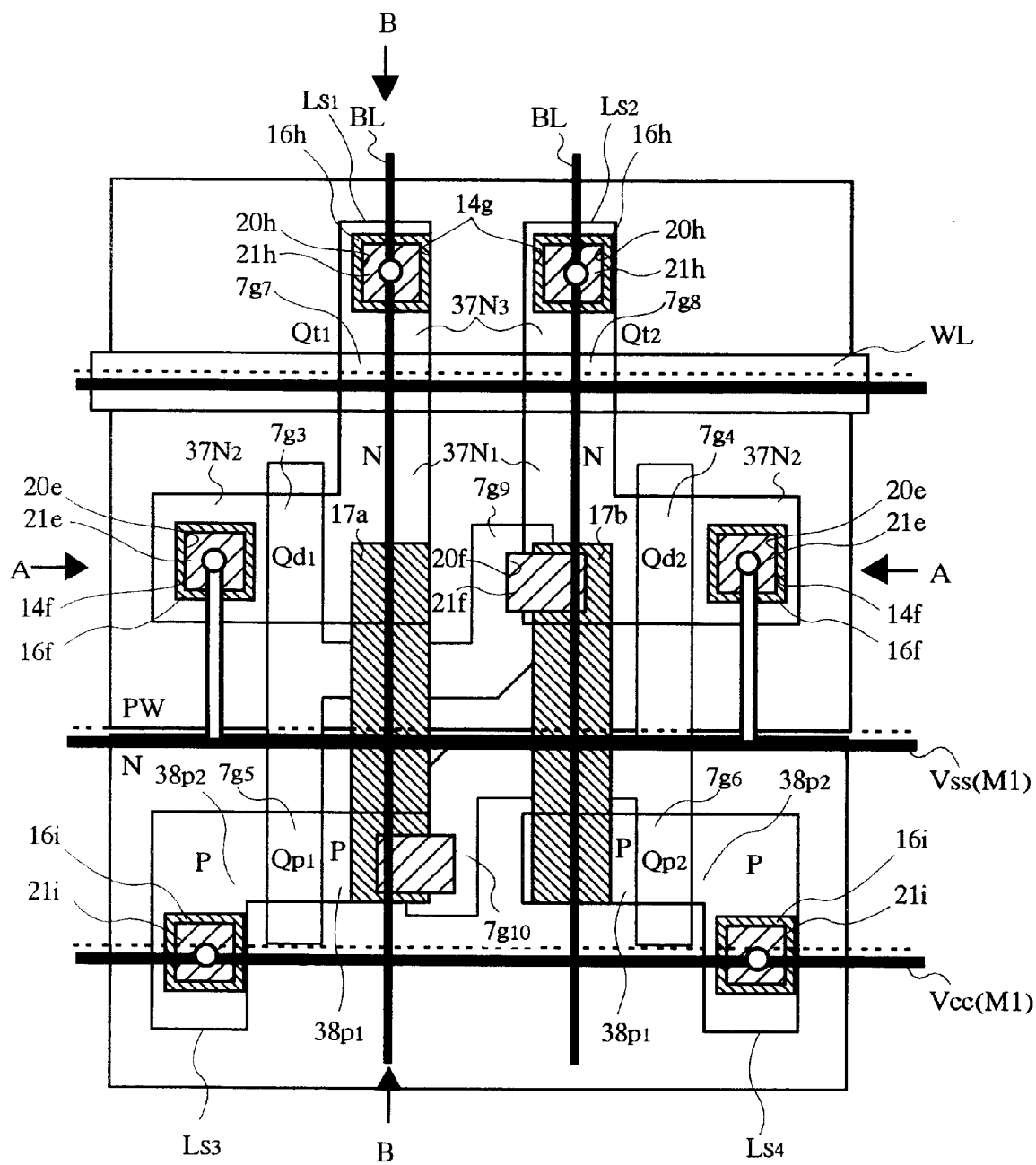
FIG. 65 is a cross-sectional view showing a main portion of a semiconductor integrated circuit device as another embodiment of the present invention, in a manufacturing step thereof.
Figure 66:
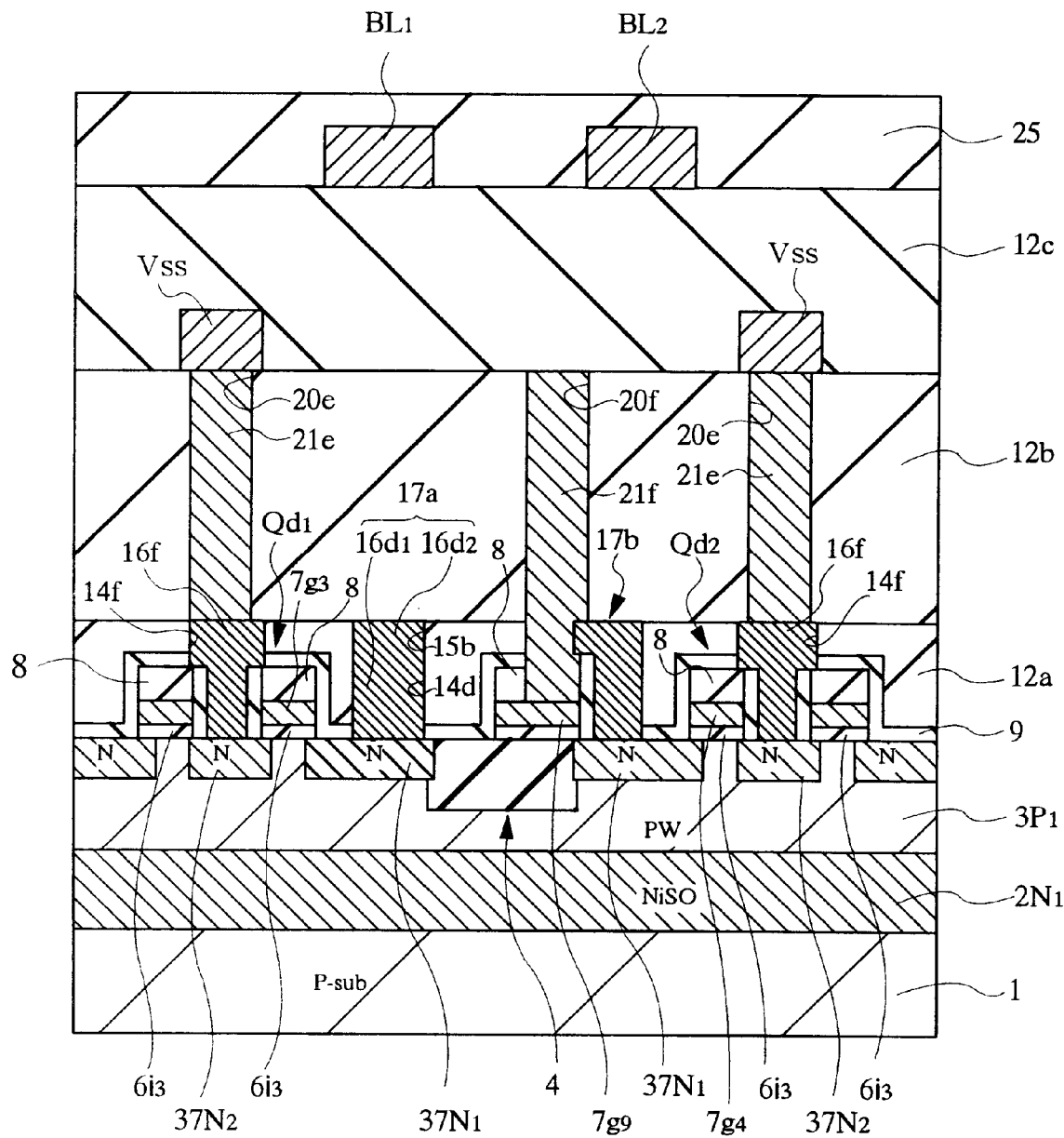
FIG. 66 is a cross-sectional view taken along the line A—A in FIG. 65.
Figure 67:
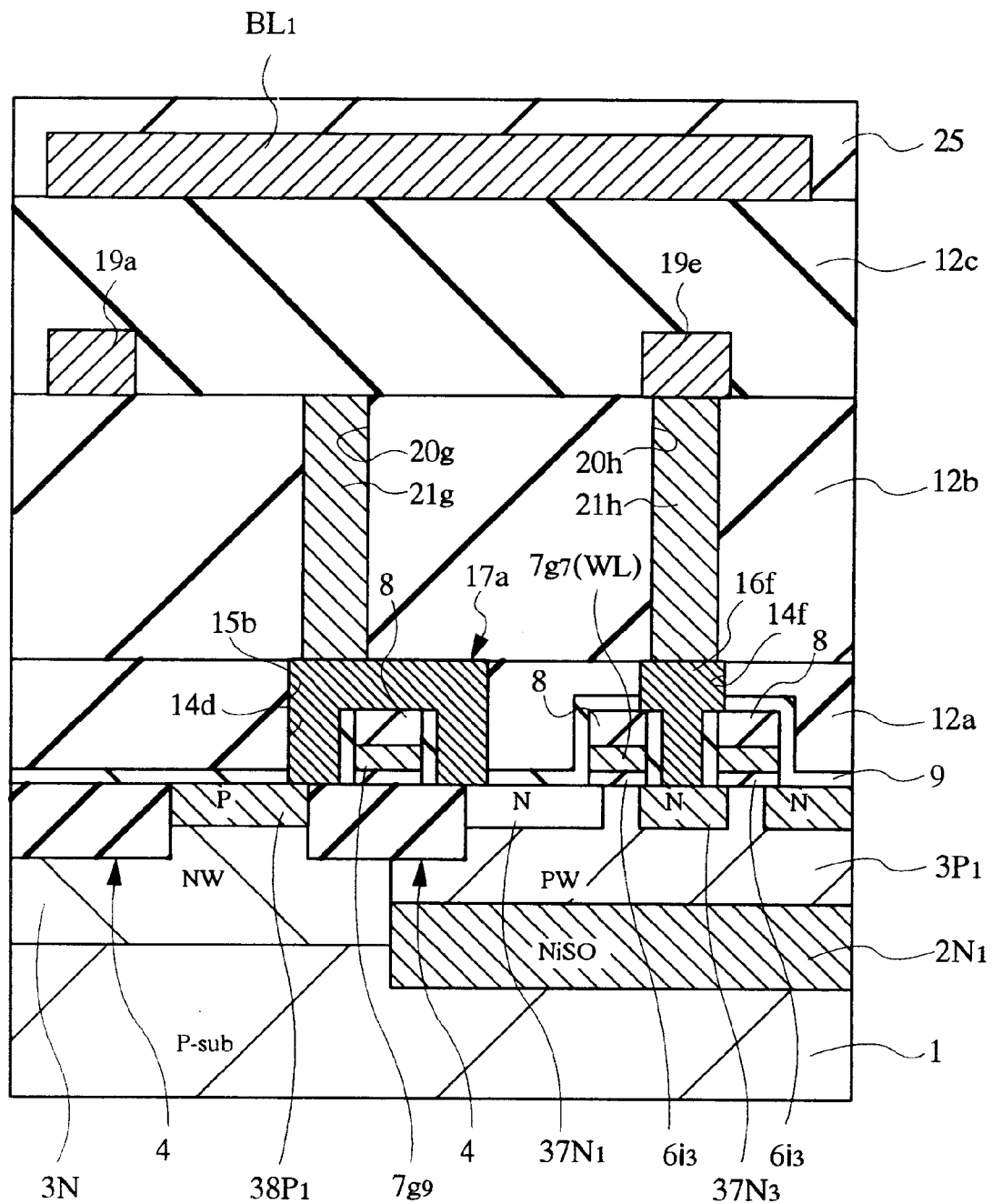
FIG. 67 is a cross-sectional view taken along the line B—B in FIG. 65.

FIG. 65 is a plan view showing a main portion of a semiconductor integrated circuit device as another embodiment of the present invention. FIGS. 66 and 67 are respectively cross-sectional views taken along lines A—A and B—B of FIG. 65.

In the present embodiment 7, explanation will be made on a case in which the present invention is applied to a SRAM (Static Random Access Memory) as a kind of memory LSI, for example.

As shown in FIGS. 65 to 67, the memory cell of the SRAM is comprised of a pair of complementary bit lines BL1 and BL2, and a pair of drive MISFETs Qd1 and Qd2 provided at the crossing portion where the bit lines cross the word line WL, and a pair of load MISFETs QP1 and Qp2, and a pair of transfer MISFETs Qt1 and Qt2. Signals inverted relative to each other are transferred to the paired bit lines BL1 and BL2.

The drive MISFETs Qd1 and Qd2 and transfer MISFETs Qt1 and Qt2 are formed into an n-channel type, and the load MISFETs Qp1 and Qp2 are formed into a p-channel type. That is, this memory cell is constructed as a perfect CMIS (Complementary MIS), for example, using four n-channel type MISFETs and two p-channel type MISFETs.

Among six MISFETs constituting the memory cell, the pair of drive MISFETs QD1 and Qd2 and the pair of load MISFETs Qp1 and Qp2 constitute a flip-flop circuit as an information storage portion for storing information of 1 bit. In addition, the transfer MISFETs Qt1 and Qt2 are switching elements which electrically connect or disconnect the flip-flop circuit with the bit lines BL1 and BL2.

The drive MISFET Qd1 and the transfer MISFET Qt1 are provided in an active region Ls1 provided on the semiconductor substrate 1. The drive MISFETs Qd2 and the transfer MISFET Qt2 are provided on an active region Ls2 on the semiconductor substrate 1. In addition, the load MISFET Qp1 and Qp2 are provided in active regions Ls3 and Ls4 on the semiconductor substrate 1.

The drive MISFETs Qd1 and Qd2, the load MISFETs Qp1 and Qp2, and the transfer MISFET Qt1 and Qt2 have the same structure and material as those of the MISFET explained in the embodiment 1. That is, the drive MISFET Qd1 and Qd2 have a pair of semiconductor regions 37N1 and 37N2 for a source and drain, a gate electrode 6i3, and gate electrodes 7g3 and 7g4. Also, the load MISFETs Qp1 and Qp2 have a pair of semiconductor regions 38P1 and 38P2 for a source and drain, a gate insulating film 6i3, and gate electrodes 7g5 and 7g6. The transfer MISFETs Qt1 and Qt2 have a pair of semiconductor regions 37N1 and 37N3, a gate insulating film 6i3, and gate electrodes 7g7 and 7g8. The semiconductor region 37N1 is a region common to the drive MISFETs Qd1 and Qd2 and the transfer MISFETs Qt1 and Qt2. Also, the gate electrode 7g3 of the drive MISFET Qd1 and the gate electrode 7g5 of the load MISFETs Qp1 and Qp2 are formed integrally and are patterned such that a part thereof two-dimensionally overlaps the semiconductor region 37N1. Note that the part does not directly contact the semiconductor region 37N1. In addition, the gate electrode 7g4 of the drive MISFET Qd2 and the gate electrode 7g6 of the load MISFETs Qp1 and Qp2 are formed integrally and are patterned such that a part thereof (the gate electrode 7g9) two-dimensionally overlaps the semiconductor region 38P1 of the load MISFET Qp1. Note that the part (the gate electrode 7g10) does not directly contact the semiconductor region 38P1. In addition, the gate electrodes 7g7 and 7g8 are parts of the word line WL and correspond to the portions of the word line WL that overlap the active regions Ls1 and Ls2. Note that the gate insulating film 6i3 and the gate electrodes 7g3 to 7g10 have the structure same as the gate insulating film 6i1 and the gate electrode 7g1 explained in the embodiment 1 and therefore they will not be described.

The semiconductor regions 37N1 for the drains of the drive MISFETs Qd1 and Qd2 are respectively connected to the semiconductor regions 38P1 and 38P through the local wires 17a and 17b. The local wires 17a and 17b are each formed to have a plan rectangular shape, for example, and are respectively arranged so as to bridge the gate electrodes 7g9 and 7g10, respectively. The local wires 17a and 17b are the same as the local wires 17 explained in the embodiment 1, and therefore, detailed explanation thereof will be omitted herefrom. Also, the semiconductor regions 37N2 of the drive MISFETs Qd1 and Qd2 are connected to a reference voltage wire Vss through plugs 16f and 21e in contact holes 14f and 20e. The reference voltage wire Vss is set to, for example, 0 V (GND).

A contact hole 20f having a rectangular plan shape which overlaps the gate electrode 7g9 and the local wire 17b is formed in the interlayer insulating films 12b and 12a, the cap insulating film 8, and the insulating film 9. The upper surface of the gate electrode 7g9 is exposed from the bottom surface of the contact hole 20f, and a part of the upper and side surfaces of the local wire 17b is exposed from the side surface of the bottom portion of the contact hole 20f. Further, a plug 21f is provided in the contact hole 20f, and the gate electrode 7g9 and the local electrode 17b are electrically connected with each other through the plug 21f (ref. FIG. 66).

Also, the contact hole 20g and the plug 21g therein have the same structure and function as those of the contact hole 20f and the plug 21f therein. That is, the upper surface of the gate electrode 7g is exposed from the bottom surface of the contact hole 20g, and a part of the upper and side surfaces of the local wire 17a is exposed from the side surface of the bottom portion of the contact hole 20g. The gate electrode 7g10 and the local wire 17a are electrically connected to each other through the plug 21g in the contact hole 20g.

That is, in the present embodiment 7, the plugs 21f and 21g are members which does not electrically connect the wiring layers above and below these plugs but electrically connect the wires below the plugs 21f and 21g (e.g., connect the gate electrodes 7g9 and 7g10 with the local wires 17b and 17a). With the structure constructed as described above, the plan shape of each of the local wires 17a and 17b can be set in a relatively simple rectangular shape, and therefore, the pattern can be designated with ease and the pattern can be transferred with precision and the scale down can be effected on the pattern.

The semiconductor regions 37c for drains of the transfer MISFET Qt1 and Qt2 are electrically connected to the first layer wire 19e through the plugs 16h and 21h in the contact holes 14g and 20h, and are further electrically connected to the bit lines BL1 and BL2 of the second wiring layer. Also, the semiconductor regions 38P2 for sources of the load MISFETs Qp1 and Qp2 are electrically connected to the wire Vcc for the power supply voltage in the first wiring layer through the plugs 16i and 20i. This wire Vcc for the power source voltage is set to, for example, about 3 V.

Note that the structure and material of the plugs 16f, 16h, 16i, and 21e to 21i are the same as those of the plugs 16a and 21a in the embodiment 1, and the explanation thereof will be omitted herefrom. In addition, the contact holes 14f, 14g, and the like formed in the interlayer insulating film 12a are formed by the SAC technique explained in the embodiment 1. Also, the structure and material of the first layer wire 19e, the reference voltage wire Vss, and the wire Vcc for the power source voltage are the same as those of the first layer wire 19a in the embodiment 1, and the explanation thereof will therefore be omitted herefrom. In the present embodiment 7, the bit lines BL1 and BL2 adopt a normal wiring structure, and the structure and material thereof are the same as those of the second layer wire 22 in the embodiment 1. The explanation of the bit lines will therefore be omitted herefrom.

According to the present embodiment 7 as described above, the following advantages can be obtained.

(1) Since the local wires 17a and 17b forming the memory cell of the SRAM are arranged in an embedded wiring structure, scale down of the memory cell can be achieved.

(2) Since the local wires 17a and 17b forming the memory cell of the SRAM are arranged in a buried wiring structure, wiring resistance can be reduced and the operation speed of the SRAM can be improved.

(3) Since the plugs 21f and 21g are used as members for electrically connecting the wires below (the gate electrodes 7g9 and 7g10 and the local wires 17b and 17a), the plan shape of each of the local wire 17a and 17b can be arranged into a relatively simple rectangular shape, so that the facility of the pattern design and transfer precision can be improved and the scale down can be effected on the pattern.

The invention made by the present inventor has been specifically explained above on the basis of the embodiments. However, the present invention is not limited to the embodiments described above but may be variously modified without deviating from the subject matter of the invention.

For example, in the embodiment 1, explanation has been made of a case in which the contact hole for the bit line and the wiring groove are formed in one same step. The present invention is not limited hitherto but the hole and groove may be formed by using different photoresist patterns as masks, respectively.

That is, a first photoresist pattern for forming the wiring groove for the bit line is formed on the interlayer insulating film. Thereafter, with this pattern used as an etching mask, the portion of the interlayer insulating film exposed therefrom is removed thereby to form the wiring groove for the bit line. This wiring groove may be deep to an intermediate position of the interlayer insulating film or the insulating film made of a silicon nitride film below may be exposed from the bottom surface of the groove. Subsequently, a second photoresist pattern for forming the contact holes for the capacitor and for the bit line is formed on the interlayer insulating film. Thereafter, with this pattern used as an etching mask, holes are formed in the portion of the interlayer insulating film exposed therefrom by etching processing. At this time, by carrying out the etching processing under a condition that the etching rate of the silicon oxide film is higher than that of the silicon nitride film, the lower insulating film made of the silicon nitride film functions as an etching stopper so that the major surface of the semiconductor substrate is not exposed. At last, under an etching condition that an equal selectivity is applied to the silicon nitride film and the silicon oxide film, the insulating film made of the silicon nitride film exposed from the second photoresist pattern is removed. In addition, the wiring groove and the contact hole for the bit line may be formed by using different photoresist pattern as masks, respectively. That is, the wiring groove for the bit line having the same depth as described above is formed by using the first photoresist pattern like in the manner described above. Subsequently, with use of the second photoresist pattern for forming the contact hole for the bit line, the insulating film made of the silicon nitride film exposed from the second photoresist pattern is removed, under an etching condition that the selectivity for the silicon oxide film and that for the silicon nitride film are equal to each other.

Also, in the step of forming the bit line according to the embodiment 1 to 6, the wiring portion and the contact portion of the bit line may be separately subjected to patterning. That is, transfer may be performed with use of different photo-masks such that the wiring portion of the bit line is arranged to be a straight pattern having a linear plan shape and the contact portion of the bit line is arranged to be a pattern having a rectangular plan shape which overlaps the wiring portion. In this manner, the transfer pattern formed on one photo-mask is only the linear plan shape or the rectangular plan shape. It is therefore possible to transfer the pattern onto the photoresist film with excellent controllability. Accordingly, the transfer precision of the pattern can be improved and scale down of the pattern can be promoted.

Also, in the embodiments 1 to 6, explanation has been made of a case in which the capacity insulating film of the capacitor for information storage of the DRAM is arranged to be a normal insulating film. However, the invention is not limited hitherto but a ferroelectric memory may be constructed by using ferroelectric material such as PZT or the like, as the material.

Also, in the embodiments 1 to 6, explanation has been made of a case in which the capacitor for information storage of the DRAM is set in a crown type. However, the invention is not limited hitherto but may be a fin type, for example.

Also, in the embodiments 1 to 7, explanation has been made of a case using a semiconductor substrate having a single structure. The present invention is not limited hitherto, but a so-called epitaxiall substrate may be used which is formed by providing an epitaxial layer on the surface of a semiconductor substrate obtained by normal crystalline growth. In this case, the thickness of the epitaxial layer is preferably 1 μm or less although not particularly limited.

Also, in the embodiments 1 to 7, explanation has been made of the case where the separation region is of a thin type. However, the present invention is not limited hitherto but may be variously modified. For example, it is possible to adopt a separation structure based on a field insulating film formed by a selective oxidation method or the like.

Although the above embodiment 7 has been explained to the case where the load to the memory cell is constructed by the MISFET, the present invention is not limited hitherto but the load may be constructed by a polysilicon film.

The above explanation has been made on the case where the invention made by the present inventor is applied to DRAM techniques or SRAM techniques which are application field of the invention. The present invention, however, is not limited hitherto but is applicable to semiconductor integrated apparatuses in which DRAMs and logic circuits are provided on one same semiconductor substrate.

For example, in a semiconductor integrated circuit device in which DRAMs and logic circuits are provided on one same semiconductor substrate, the MISFET is formed in the following manner in case where the gate electrode of the logic circuit is of a dual gate structure. At first, a field insulating film is formed on the major surface of the semiconductor substrate. Thereafter, a gate insulating film is formed and a silicon film for forming a gate electrode is deposited through the gate insulating film. Subsequently, impurities (such as arsenic, antimony, phosphorus, or a combination thereof) are implanted into the nMIS formation region with low energy (which is injected only into the silicon film) by an ion-implantation method. With use of the same mask, impurities are implanted into the layer where p-type wells and N-type wells are embedded, with high energy. Likewise, impurities (such as boron) are implanted into the PMIS formation region by an ion-implantation method with low energy (which is injected only into the silicon film), with use of another mask. Using the same mask, implantation to channels is carried out with intermediate energy. Meanwhile, in case where the gate electrode of the logic circuit is a polycide gate, it is arranged such that a tungsten nitride film is inserted between the silicide film and the silicon film in order to prevent mutual diffusion through a silicide film made of tungsten silicide or the like or a silicide film including impurities of a different conductive type in silicon. In addition, in case of a metal gate, the formation is performed like in the embodiments 1 to 6. Subsequent steps which are the same as those in the embodiment 1 to 6 are carried out to fabricate the device.

Also, in case where the gate electrode is a silicon germanium (SiGe) film, the following manner is adopted. At first, a field insulating film and a gate insulating film are formed as described above, and thereafter, a silicon germanium (SiGe) film for the gate electrode is deposited on the gate insulating film. This silicon germanium film has an intermediate work function which is optimum for simultaneous formation of a nMIS and pMIS, and therefore, it is unnecessary to implant impurities into the polysilicon film unlike in the dual gate electrode. Subsequently, like in the case of the dual gate electrode described above, impurities are implanted into the nMIS formation region and the pMIS formation region. At this time, in case where the gate electrode is of polycide, the structure is arranged such that a tungsten nitride film is inserted between the silicide film and the polysilicon film in order to avoid diffusion of germanium into the silicide film or the silicide film. In case of a metal gate, the same steps as in the embodiments 1 to 6 are adopted. Thereafter, the formation is carried out through the same steps in the embodiments 1 to 6. In the case like this, implantation of impurities for forming wells and controlling threshold values may be carried out in the same manner as in the embodiments 1 to 6. In these cases (where the gate electrode is of a dual gate or a silicon germanium film), the number of photo-masks can be reduced.

The advantages obtained by representative ones of the inventions disclosed in the present application will be explained in brief as follows.

(1) According to the present invention, the wiring portion and contact portion of the bit line are formed by buried conductive members formed in one same step, and therefore, the contact resistance between the wiring portion and the contact portion can be eliminated, so that the parasitic resistance of the bit line can be reduced. As a result, the semiconductor integrated circuit device having the bit line enables low voltage operation or high-speed operation.

(2) According to the present invention, the structure is arranged such that the bit line is buried in the wiring groove formed in the insulating film, and therefore, a step is not created by the bit line BL. Accordingly, no step is reflected on the upper surface of the insulating film covering the bit line, so that the upper surface of the insulating film can be flattened with ease. As a result, it is possible to prevent etching residues of the conductive film caused by steps of underlaying layers and occurrence of short-circuiting errors caused therefrom.

(3) Since the bit line is formed to be embedded in the wiring groove cut in the insulating film, it is possible to remote the microfabrication on the bit line. In particular, the line width of the wiring groove can be smallsized, by forming a wide wiring groove and by thereafter forming a side wall insulating film on the side surface of the groove. As a result, the distance between the bit line and the storage node of the information storage capacity element can be enlarged.

(4) According to the present invention, the wiring grooves of the wires forming the peripheral circuits of the memory is formed simultaneously with the wiring groove of the bit line, and same conductive members are respectively embedded in the wiring grooves. Therefore, the number of manufacturing steps of the semiconductor integrated circuit device can be reduced.

(5) According to the present invention, the pattern of the gate electrodes in the memory cell regions and the pattern of the other gate electrodes of the transistors are transferred respectively by separate exposure processes, and therefore, exposure can be achieved by exposure processes which are respectively suitable for the patterns of the gate electrodes. Accordingly, the processing precision of each of the gate electrodes can be improved and it is possible to promote the microfabrication on each of the gate electrodes.

(6) According to the present invention, the second conductive member is buried in the contact hole provided in the interlayer insulating film and a plurality of first conductive members, which are exposed from the contact hole and distant from each other, are electrically connected to each other. Therefore, each of the first conductive members can be formed to have a relatively simple plan shape, so that it is possible to make pattern designing easy, the improve the transfer precision and promote scale down on the pattern.

What is claimed is:

1. A method of manufacturing a semiconductor integrated circuit device having a semiconductor substrate on which there are provided a plurality of memory cells each comprising a memory cell selection transistor and an information storage capacity element connected thereto in series, comprising the steps of:

(a) forming a first region having an isolated rectangular plan shape on the semiconductor substrate;

(b) forming a word line extending in a direction crossing the first region, on the semiconductor substrate;

(c) forming a pair of semiconductor regions for a source and drain of the memory cell selection transistor, in the first region, with a channel region directly under the word line inserted;

(d) forming a first interlayer insulating film for covering the memory cell selection transistor formed through the steps of (a) to (c);

(e) forming a wiring groove for a bit line and a contact hole for a bit line being a part of the wiring groove for the bit line, extending in a direction two-dimensionally crossing the extending direction of the wiring groove for the bit line, integrally connected to the wiring groove for the bit line in a region two-dimensionally overlapping one of the semiconductor regions of the memory cell selection transistor and contacting to one of the semiconductor regions of the memory cell selection transistor;

(f) burying a conductive member into the wiring groove for the bit line and the contact hole for the bit line, thereby to form the bit line constructed by integrally forming a wiring portion in the wiring groove for the bit line and a contact portion in the contact hole for the bit line; and (g) forming the information storage capacity element electrically connected to the other semiconductor region of the memory cell selection transistor above the bit line.

2. A method according to claim 1, wherein the first interlayer insulating film is formed by coating a second insulating film made of a material allowing a greater etching selective ratio on the second insulating film relative to the first insulating film on the first insulating film which has been coated to reflect a step of an underlaying layer, and the step of forming the wiring groove for the bit line and the contact hole for the bit line includes an etching processing step under a condition that the etching selective ratio of the first insulating film and the second insulating film are set high.

3. A method according to claim 2, wherein the wiring groove for the bit line and the contact hole for the bit line are formed by the same mask film used as an etching mask.

4. A method according to claim 3, wherein when the wiring groove for the bit line and the contact hole for the bit line are formed, a contact hole for the information storage capacity element is formed by using the same mask film used.

5. A method according to claim 4, wherein a conductive member is buried in the wiring groove for the bit line, the contact hole for the bit line, and the contact hole for the information storage capacity element, thereby to form the bit line and a plug for the information storage capacity element.

6. A method according to claim 5, wherein the step of forming the bit line and the plug for the information storage capacity element includes the following steps of:

forming the wiring groove for the bit line, the contact hole for the bit line, and the contact hole for the information storage capacity element and thereafter coating a conductive member on the first interlayer insulating film so as to fill the wiring groove and the contact holes, and effecting a chemical mechanical polish processing the conductive member to shave the conductive member so that the conductive member remains in the wiring groove for the bit line, the contact hole for the bit line, and the contact hole for the information storage capacity element.

7. A method according to claim 5, further comprising the steps of:

coating a third insulating film on an entire surface of the first interlayer insulating film, after the step of forming the bit line and the plug for the information storage capacity element;

coating the third insulating film with a fourth insulating film made of a material allowing a high etching selective ratio to the third insulating film;

forming a capacity element hole serving as the information storage capacity element in the fourth insulating film while the third insulating film is made to function as an etching stopper so that the capacity element hole exposes an upper surface of the third insulating film;

coating a first lower-electrode conductive member forming a lower electrode of the information storage capacity element, on the fourth insulating film and an inner surface of the capacity element hole;

coating a fifth insulating film on the first lower-electrode conductive member such that the fifth insulating film reflects a step of an underlaying layer, and thereafter etching back the fifth insulating film to form a side wall insulating film made of the fifth insulating film on a side surface of the first lower-electrode conductive member, in the capacity element hole;

etching and removing the first lower-electrode conductive member exposed from the side wall insulating film, with the side wall insulating film used as an etching mask, and thereafter removing the third insulating film exposed from the side wall insulating film and a remaining portion of the first lower-electrode-forming conductive member, with the side wall insulating film and the remaining portion of the conductive member used as etching masks, thereby to form a second contact hole of the information storage capacity element which exposes an upper surface of the plug of the information storage capacity element;

etching and removing the side wall insulating film and the fourth insulating film while the third insulating film is made to function as an etching stopper, and thereafter coating a second lower-electrode conductive member on the third insulating film so as to cover the first lower-electrode conductive member; and effecting etch back on the second lower-electrode conductive member to form a lower electrode which is electrically connected to the plug of the information storage capacity element through a contact portion formed on a side surface of the second contact hole of the information storage capacity element.

8. A method according to claim 2, wherein the wiring groove for the bit line and the contact hole for the bit line are formed by using different mask films as etching masks, respectively.

9. A method according to claim 8, wherein when the contact hole for the bit line is formed, the contact hole for the information storage capacity element is formed by using the same mask film.

10. A method according to claim 2, further comprising the steps of:

burying a conductive member into the wiring groove of the bit line and the contact hole of the bit line, thereby to form the bit line;

coating a third insulating film on an entire surface of the first interlayer insulating film, after executing the step of forming the bit line;

coating the third insulating film with a fourth insulating film made of a material allowing a high etching selective ratio relative to the third insulating film;

coating a fifth insulating film with a stopper film made of a material allowing a high etching selective ratio relative to the fourth insulating film;

forming a capacity element hole serving as forming the information storage capacity element in the fourth insulating film and the stopper film while the third insulating film is made to function as an etching stopper so that the capacity element hole exposes an upper surface of the third insulating film;

coating a first lower-electrode conductive member for forming a lower electrode of the information storage capacity element, on the stopper film and an inner surface of the capacity element hole;

coating a fifth insulating film on the first lower-electrode conductive member such that the fifth insulating film reflects a step of an underlaying layer, and thereafter etching back the fifth insulating film to form a side wall insulating film made of the fifth insulating film on a side surface of the first lower-electrode conductive member in the capacity element hole;

etching and removing the first lower-electrode conductive member exposed from the side wall insulating film, with the side wall insulating film used as an etching mask, and thereafter removing the third insulating film and the first insulating film exposed from the side wall insulating film and a remaining portion of the first lower electrode conductive member, with the side wall insulating film, the remaining portion of the first lower-electrode conductive member and the stopper film used as etching masks, thereby to form a contact hole of the information storage capacity element from which one of the semiconductor regions of the memory cell selection transistor is exposed; and coating a second lower-electrode conductive member on the stopper film and in the capacity element hole Such that the second lower-electrode conductive member covers the first lower-electrode conductive member and fills the contact hole of the information storage capacity element, and further etching back the second lower-electrode conductive member to form a lower electrode which is electrically connected to one of the semiconductor regions of the memory cell selection transistor through the contact hole for the information storage capacity element.

11. A method according to claim 1, wherein the first interlayer insulating film is formed in such a manner that the first insulating film deposited so as to reflect a step of an underlaying layer, is coated by way of a second insulating film made of a material allowing a high etching selective ratio relative to the first insulating film, with a third insulating film made of a material allowing a high etching selective ratio relative to the second insulating film; and the step of forming the wiring groove for the bit line and the contact hole for the bit line includes an etching processing step carried out under a condition that the etching selective ratio of the first insulating film and the second insulating film is made high.

12. A method according to claim 11, wherein the wiring groove for the bit line and the contact hole for the bit line are formed by using the same mask film as an etching mask.

13. A method according to claim 12, wherein when the wiring groove for the bit line and the contact hole for the bit line are formed, the contact hole for the information storage capacity element is formed by using the same mask film.

14. A method according to claim 13, wherein a conductive member is buried in the wiring groove for the bit line, the contact hole for the bit line, and the contact hole for the information storage capacity element, thereby to form the bit line and a plug for the information storage capacity element.

15. A method according to claim 14, wherein the step of forming the bit line and the plug for the information storage capacity element includes the following steps of:

forming the wiring groove for the bit line, the contact hole for the bit line, and the contact hole for the information storage capacity element and thereafter coating a conductive member on the first interlayer insulating film so as to fill the wiring groove and the contact holes; and effecting a chemical mechanical polish processing to shave the conductive member so that the conductive member remains in the wiring groove for the bit line, the contact hole for the bit line, and the contact hole for the information storage capacity element.

16. A method according to claim 14, further comprising the steps of:

coating the third insulating film over its entire surface with a fourth insulating film made of a material allowing a high etching selective ratio relative to the third insulating film, after executing the step of forming the bit line and the plug for the information storage capacity element;

forming a capacity element hole serving as the information storage capacity element in the fourth insulating film while the third insulating film is made to function as an etching stopper so that the capacity element hole exposes upper surfaces of the third insulating film and the plug of the information storage capacity element;

coating a first lower-electrode conductive member for forming a lower electrode of the information storage capacity element, on the fourth insulating film and an inner surface of the capacity element hole; and coating a sixth insulating film on the first lower-electrode conductive member, thereafter removing the sixth insulating film such that the sixth insulating film remains only in the capacity element hole, and thereafter removing the first lower-electrode conductive member on the fourth insulating film by using the remaining sixth insulating film as an etching mask, thereby to form a lower electrode.

17. A method according to claim 16, further comprising the step of removing the fourth insulating film with the third insulating film used as an etching stopper after the lower electrode is formed, thereafter forming a capacity insulating film on a surface of the lower electrode, and further forming an upper electrode on a surface of the capacity insulating film, thereby to form the information storage capacity element.

18. A method according to claim 16, further comprising the step of forming a capacity element hole serving as the information storage capacity element, thereafter etching and removing the third insulating film at a portion exposed from the capacity element hole thereby to expose an upper portion of the plug for the information storage element, and thereafter coating a first lower-electrode conductive member for forming a lower electrode of the information storage capacity element on the fourth insulating film and the inner wall of the capacity element hole.

19. A method according to claim 11, further comprising the steps of:

burying a conductive member into the wiring groove for the bit line and the contact hole for the bit line, thereby to form the bit line;

coating the third insulating film over its entire surface with a fourth insulating film made of a material allowing a high etching selective ratio relative to the third insulating film after the step of forming the bit line;

coating a stopper film made of a material allowing a high etching selective ratio relative to the fourth insulating film on the fourth insulating film;

forming a capacity element hole serving as the information storage capacity element in the fourth insulating film and the stopper film while the third insulating film is made to function as an etching stopper so that the capacity element hole exposes an upper surface of the third insulating film;

coating a first lower-electrode conductive member for forming a lower electrode of the information storage capacity element, on the stopper film and an inner surface of the capacity element hole;

coating a fifth insulating film on the first lower-electrode conductive member such that the fifth insulating film reflects a step of an underlaying layer, and thereafter etching back the fifth insulating film, thereby to form a side wall insulating film made of the fifth insulating film on a side surface of the first lower-electrode conductive member in the capacity element hole;

etching and removing the first lower-electrode conductive member exposed from the side wall insulating film by using the side wall insulating film as an etching mask, and thereafter removing the third insulating film and the first insulating film exposed from the side wall insulating film, a remaining portion of the first lower-electrode conductive member and the stopper film, with the side wall insulating film, the remaining portion of the first lower-electrode conductive member and the stopper film used as etching masks, thereby to form a contact hole of the information storage capacity element from which one of the semiconductor regions of the memory cell selection transistor is exposed;

coating a second lower-electrode conductive member on the stopper film and in the capacity element hole such that the second lower-electrode conductive member covers the first lower-electrode conductive member and fills the contact hole of the information storage capacity element; and etching back the second lower-electrode conductive member and the stopper film underlaying layer thereunder, thereby to form a lower electrode which is electrically connected to one of the semiconductor regions of the memory cell transistor through the second lower-electrode conductive member remaining in the contact hole for the information storage capacity element.

20. A method according to claim 1, further comprising the steps of:

forming a wiring groove and a contact hole for a wire which is connected to the wiring groove and is electrically connected to a peripheral circuit element, at a peripheral circuit region of a memory of the first interlayer insulating film, when the step (e) is executed; and burying a conductive member in the wiring groove and the contact hole for the wire, thereby to form a wire such that a wiring portion in the wiring groove and a contact portion in the contact hole for the wire are integrally formed, when the step (f) is executed.

21. A method according to claim 1, further comprising the step of transferring a pattern of a gate electrode of the memory cell selection transistor and a pattern of a gate electrode of any other transistor through separate exposure processes, respectively.

22. A method according to claim 1, further comprising the steps of:

forming a contact hole exposing a plurality of first conductive members distant from each other and provided, in the same lower layer or different lower layer of the interlayer insulating films formed on the semiconductor substrate; and burying a second conductive member in the contact hole, thereby to electrically connect, the plurality of first conductive members one another which are distant from each other.

23. A method according to claim 1, wherein the first interlayer insulating film is formed by orderly coating from underside a first insulating film coated so as to reflect a step of an underlaying layer, a second insulating film made of a material allowing a high etching selective ratio relative to the first insulating, a seventh insulating film made of a material allowing a high etching selective ratio relative to the second insulating film, and an eighth insulating film made of a material allowing a high etching selective ratio relative to the seventh insulating film, the step of forming the wiring groove of the bit line includes the step of performing etching processing by using the mask film for forming the wiring groove as an etching mask, under a condition that the etching selective ratio of the seventh insulating film and the eighth insulating film are set high, and the step of forming the contact hole for the bit line includes a step of performing etching processing by using the mask film for forming the contact hole as an etching mask, under a condition that the etching selective ratio of the first insulating film and the second insulating film is set high.

24. A method of manufacturing a semiconductor integrated circuit device having a semiconductor substrate on which there are provided a plurality of memory cells each comprising a memory cell selection transistor and an information storage capacity element connected thereto in series, comprising the steps of:

(a) forming the memory cell selection transistor on the semiconductor substrate;

(b) forming a first interlayer insulating film covering the memory cell selection transistor and any other transistor;

(c) coating a stopper film on the first interlayer insulating film;

(d) forming a contact hole for the information storage capacity element from which one semiconductor region of the memory cell selection transistor is exposed in the stopper film and the first interlayer insulating film, and thereafter burying a conductive member inside the contact hole for the information storage capacity, thereby to form a plug for the information storage capacity element;

(e) coating the stopper film with an insulating film for forming a capacity element made of a material allowing a high etching selective ratio relative to the stopper film;

(f) forming a capacity element hole for forming the information storage capacity element from which upper surfaces of the stopper film and the plug of the information storage capacity element are exposed, on the insulating film for forming the capacity element, with the stopper film used as an etching stopper;

(g) coating a first lower-electrode conductive member for forming a lower electrode of the information storage capacity element, on the insulating film for forming the capacity element and an inner surface of the capacity element hole; and (h) coating the insulating film for forming the lower electrode on the first lower-electrode conductive member, thereafter removing the insulating film for forming the lower electrode such that the insulating film remains only in the capacity element hole, and thereafter removing the first lower-electrode conductive member on the insulating film for forming the capacity element by using the remaining insulating film for forming the lower electrode as an etching mask, thereby to form the lower electrode.

25. A method according to claim 24, further comprising the step of removing the insulating film for forming the capacity element with the stopper film used as an etching stopper after forming the lower electrode, forming a capacity insulating film on a surface of the lower electrode, and further forming an upper electrode on a surface thereof, thereby to form the information storage capacity element.

26. A method of manufacturing a semiconductor integrated circuit device having a semiconductor substrate on which there are provided a plurality of memory cells each comprising a memory cell selection transistor and an information storage capacity element connected thereto in series are provided, comprising the steps of:

(a) forming the memory cell selection transistor on the semiconductor substrate;

(b) forming a first interlayer insulating film covering the memory cell selection transistor and any other transistor;

(c) coating a stopper film on the first interlayer insulating film;

(d) forming a contact hole for the information storage capacity element, from which one semiconductor region of the memory cell selection transistor is exposed, in the stopper film and the first interlayer insulating film, and thereafter embedding a conductive member inside the contact hole, thereby to form a plug for the information storage capacity element;

(e) coating the stopper film with an insulating film for a capacity element made of a material allowing a high etching selective ratio relative to the stopper film;

(f) forming a capacity element hole for forming the information storage capacity element, from which upper surfaces of the stopper film and the plug of the information storage capacity element are exposed, on the insulating film for forming the capacity element, with the stopper film used as an etching stopper;

(g) etching and removing the stopper film exposed from the capacity element hole, thereby to expose an upper portion of the plug for the information storage capacity element;

(h) coating a first lower-electrode conductive member for forming a lower electrode of the information storage capacity element, on the insulating film for forming the capacity element and an inner surface of the capacity element hole, after the step (g) is executed and (i) coating the insulating film for forming the lower electrode on the first lower-electrode conductive member, thereafter removing the insulating film for forming the lower electrode such that the insulating film remains only in the capacity element hole, and thereafter removing the first lower-electrode conductive member on the insulating film for forming the capacity element by using the remaining insulating film for forming the lower electrode as an etching mask, thereby to form the lower electrode.

27. A method of manufacturing a semiconductor integrated circuit device having a semiconductor substrate on which there are provided a plurality of memory cells each comprising a memory cell selection transistor and a cylindrical information storage capacity element connected thereto in series, comprising the steps of forming a conductive member for forming a lower electrode of the information storage capacity element, thereafter forming a side wall film on a side surface thereof, and forming a contact hole extending from a center of a bottom portion of the conductive member for forming the lower electrode toward the underlaying layer, by using the side wall film as an etching mask.

28. A method of manufacturing a semiconductor integrated circuit device having a semiconductor substrate on which there are provided plurality of memory cells each comprising a memory cell selection transistor and an information storage capacity element connected thereto in series, comprising steps of:

(a) forming the memory cell selection transistor on the semiconductor substrate;

(b) forming a first interlayer insulating film covering the memory cell selection transistor and any other transistor;

(c) coating a first stopper film on the first interlayer insulating film;

(d) coating the first stopper film with an insulating film for forming a capacity element made of a material allowing a high etching selective ratio relative to the first stopper film, on the first stopper film;

(e) coating a second stopper film on the insulating film for forming the capacity element;

(f) forming a capacity element hole for forming the information storage capacity element, from which an upper surface of the first stopper film is exposed, in the insulating film for forming the capacity element and the second stopper film by using the first stopper film as an etching stopper;

(g) coating a first lower-electrode conductive member for forming a lower electrode of the information storage capacity element, on the second stopper and an inner surface of the capacity element hole;

(h) coating an insulating film on the first lower-electrode conductive member such that the insulating film reflects a step of an underlaying layer, and thereafter etching back the insulating film, thereby to form a side wall insulating film made of the insulating film on a side surface of the first lower-electrode conductive member in the capacity element hole;

(i) etching and removing the first lower-electrode conductive member exposed from the side wall insulating film by using the side wall insulating film as an etching mask, and thereafter removing the first insulating film exposed from the side wall insulating film, a remaining portion of the first lower-electrode conductive member and the second stopper film, by using the side wall insulating film, the remaining portion of the first lower-electrode conductive member and the second stopper film used as etching masks, thereby to form a contact hole of the information storage capacity element from which one semiconductor region of the memory cell selection transistor is exposed;

(j) coating a second lower-electrode conductive member on the second stopper film and in the capacity element hole such that the second lower-electrode conductive member covers the first lower-electrode conductive member and fills the contact hole of the information storage capacity element; and (k) etching back the second lower-electrode conductive member and the second stopper film thereunder, thereby to form a lower electrode which is electrically connected to the one semiconductor region of the memory cell selection transistor through the second lower-electrode conductive member remaining in the contact hole of the information storage capacity element.

29. A method of manufacturing a semiconductor integrated circuit device having a semiconductor substrate on which there are provided a plurality of memory cells each comprising a memory cell selection transistor and an information storage capacity element connected thereto in series, comprising the steps of:

(a) forming the memory cell selection transistor and any other transistor on the semiconductor substrate;

(b) forming a first interlayer insulating film covering the memory cell selection transistor and the other transistor;

(c) forming a first contact hole for the information storage capacity element, from which one semiconductor region of the memory cell selection transistor is exposed, in the first interlayer insulating film, and thereafter burying a conductive member inside the first contact hole, thereby to form a plug for the information storage capacity element;

(d) coating a stopper film for covering the plug for the information storage capacity element, on the first interlayer insulating film;

(e) coating the stopper film with an insulating film for forming a capacity element made of a material allowing a high etching selective ratio relative to the stopper film;

(f) forming a capacity element hole for forming the information storage capacity element, from which an upper surface of the stopper film is exposed, in the insulating film for forming the capacity element by using the stopper film as an etching stopper;

(g) coating a first lower-electrode conductive member for forming a lower electrode of the information storage capacity element, on the insulating film for forming the capacity element and an inner surface of the capacity element hole;

(h) coating an insulating film on the first lower-electrode conductive member such that insulating film reflects a step of an underlaying layer, and thereafter etching back the insulating film, thereby to form a side wall insulating film made of the insulating film on a side surface of the first lower-electrode conductive member in the capacity element hole;

(i) etching and removing the first lower-electrode conductive member exposed from the side wall insulating film by using the side wall insulating film as an etching mask, and thereafter removing the stopper film exposed from the side wall insulating film and a remaining portion of the first lower-electrode conductive member by using the side wall insulating film and the remaining portion of the first lower-electrode conductive member as etching masks, thereby to form a second contact hole of the information storage capacity element from which an upper surface of the plug of the information storage capacity element is exposed;

(j) etching and removing the side wall insulating film and the insulating film for forming the capacity element by using the stopper film as an etching stopper, and thereafter coating a second lower-electrode conductive member on the stopper film such that the second lower-electrode conductive member covers the first lower-electrode conductive member; and (k) etching back the second lower-electrode conductive member thereunder, thereby to form a lower electrode which is electrically connected to the plug for the information storage capacity element through a contact portion formed on a side surface of the second contact hole of the information storage capacity element.

30. A method of manufacturing a semiconductor integrated circuit device having a semiconductor substrate on which there are provided a plurality of memory cells each comprising a memory cell selection transistor and an information storage capacity element connected thereto in series, comprising the step of:

transferring a pattern of a gate electrode of the memory cell selection transistor and a pattern of a gate electrode of any other transistor through separate exposure processes, respectively.

31. A method of manufacturing a semiconductor integrated circuit device, comprising steps of:

forming a contact hole exposing from which a plurality of first conductive members distant from each other and provided, in the same lower layer or different lower layers of an interlayer insulating film formed on a semiconductor substrate; and burying a second conductive member in the contact hole, thereby to electrically connect, the plurality of first conductive members one another which are distant from each other.

* * * * *